US012796283B2

(12) United States Patent
Yamazaki et al.

(10) Patent No.: US 12,796,283 B2
(45) Date of Patent: Nov. 10, 2026

(54) ORGANIC SEMICONDUCTOR DEVICE, ORGANIC EL DEVICE, LIGHT-EMITTING APPARATUS, ELECTRONIC APPLIANCE, AND LIGHTING DEVICE

(71) Applicant: Semiconductor Energy Laboratory Co., Ltd., Atsugi (JP)

(72) Inventors: Shunpei Yamazaki, Setagaya (JP); Sachiko Kawakami, Atsugi (JP); Nobuharu Ohsawa, Zama (JP); Yasumasa Yamane, Atsugi (JP); Tsunenori Suzuki, Yokohama (JP); Tomoya Aoyama, Atsugi (JP); Naoaki Hashimoto, Sagamihara (JP); Kyoko Takeda, Atsugi (JP); Yui Yoshiyasu, Atsugi (JP); Masatoshi Takabatake, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 1007 days.

(21) Appl. No.: 18/077,447

(22) Filed: Dec. 8, 2022

(65) Prior Publication Data

US 2023/0200105 A1 Jun. 22, 2023

(30) Foreign Application Priority Data

Dec. 20, 2021 (JP) ................................ 2021-206122

(51) Int. Cl.
*H10K 59/80* (2023.01)
*H10K 59/12* (2023.01)

(52) U.S. Cl.
CPC ..... *H10K 59/8051* (2023.02); *H10K 59/8052* (2023.02); *H10K 59/12* (2023.02)

(58) Field of Classification Search
CPC ........... H10K 59/8051; H10K 59/8052; H10K 59/12; H10K 85/621; H10K 50/166;
(Continued)

(56) References Cited

U.S. PATENT DOCUMENTS

| | | | |
|---|---|---|---|
| 5,953,985 | A | 9/1999 | Kobayashi |
| 6,120,338 | A | 9/2000 | Hirano et al. |

(Continued)

FOREIGN PATENT DOCUMENTS

| | | | |
|---|---|---|---|
| CN | 104218156 | A | 12/2014 |
| JP | 2000-012237 | A | 1/2000 |

(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

(Continued)

*Primary Examiner* — Michael B Nelson
(74) *Attorney, Agent, or Firm* — Eric J. Robinson; Robinson Intellectual Property Law Office, P.C.

(57) ABSTRACT

To inhibit an increase in voltage of an organic semiconductor device manufactured by a method including a step of forming an aluminum oxide film over and in contact with an organic semiconductor layer. An organic semiconductor device including a first electrode, a second electrode, an organic semiconductor layer, and a buffer layer is provided. The organic semiconductor layer is positioned between the first electrode and the second electrode. The buffer layer is positioned between the organic semiconductor layer and the second electrode. A side surface of the organic semiconductor layer and a side surface of the buffer layer are substantially aligned.

19 Claims, 22 Drawing Sheets

(58) Field of Classification Search
CPC .... H10K 50/19; H10K 50/852; H10K 71/233; H10K 50/84; H10K 50/844; H10K 59/35; H10K 50/115; H10K 50/81; H10K 50/82; H10K 59/00
See application file for complete search history.

(56) References Cited

U.S. PATENT DOCUMENTS

| | | | | |
|---|---|---|---|---|
| 2002/0072139 | A1 | 6/2002 | Kashiwabara | |
| 2006/0113907 | A1 | 6/2006 | Im et al. | |
| 2011/0127498 | A1 | 6/2011 | Jung et al. | |
| 2011/0148290 | A1 | 6/2011 | Oota | |
| 2011/0309739 | A1 | 12/2011 | Song et al. | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2014/0106503 | A1* | 4/2014 | Hirakata | H10D 99/00 438/104 |
| 2015/0060826 | A1 | 3/2015 | Matsumoto. et al. | |
| 2015/0069360 | A1 | 3/2015 | Sato | |
| 2015/0076476 | A1 | 3/2015 | Odaka et al. | |
| 2016/0172595 | A1 | 6/2016 | Malinowski et al. | |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2018/0190908 | A1* | 7/2018 | Ke | H10K 71/00 |
| 2019/0043929 | A1 | 2/2019 | Choi et al. | |
| 2020/0203662 | A1 | 6/2020 | Mollard et al. | |
| 2022/0209162 | A1 | 6/2022 | Seo et al. | |
| 2022/0223671 | A1 | 7/2022 | Yamazaki et al. | |

FOREIGN PATENT DOCUMENTS

| | | | |
|---|---|---|---|
| JP | 2000-036385 | A | 2/2000 |
| JP | 2003-059663 | A | 2/2003 |
| JP | 2008-098106 | A | 4/2008 |
| JP | 2008-147072 | A | 6/2008 |
| JP | 2008-251270 | A | 10/2008 |
| JP | 2012-160473 | A | 8/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2018-521459 | | 8/2018 |
| JP | 2019-179696 | A | 10/2019 |
| JP | 2020-160305 | A | 10/2020 |
| WO | WO-2022/106949 | | 5/2022 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

ORGANIC SEMICONDUCTOR DEVICE, ORGANIC EL DEVICE, LIGHT-EMITTING APPARATUS, ELECTRONIC APPLIANCE, AND LIGHTING DEVICE

BACKGROUND OF THE INVENTION

1. Field of the Invention

One embodiment of the present invention relates to an organic semiconductor device, an organic EL device, a light-emitting apparatus, an electronic appliance, and a lighting device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid-crystal display device, a light-emitting apparatus, a lighting device, a power storage device, a memory device, an imaging device, a driving method thereof, and a manufacturing method thereof.

2. Description of the Related Art

Organic electroluminescence (EL) devices (organic EL elements) containing organic compounds and utilizing EL have been put into practical use. In the basic structure of such organic EL devices, an organic compound layer containing a light-emitting material (an EL layer) is interposed between a pair of electrodes. Carriers are injected by application of voltage to the device, and recombination energy of the carriers is used, whereby light emission can be obtained from the light-emitting material.

Such organic EL devices are of self-luminous type and thus have advantages over liquid crystal displays, such as high visibility and no need for backlight when used as pixels of a display, and are particularly suitable for flat panel displays. Displays including such organic EL devices are also highly advantageous in that they can be thin and lightweight. Moreover, such light-emitting devices also have a feature that response speed is extremely fast.

Since light-emitting layers of such organic EL devices can be successively formed two-dimensionally, planar light emission can be achieved. This feature is difficult to achieve with point light sources typified by incandescent lamps and LEDs or linear light sources typified by fluorescent lamps; thus, the light-emitting devices also have great potential as planar light sources, which can be used for lighting devices and the like.

Light-emitting apparatuses including organic EL devices can be used suitably for a variety of electronic appliances as described above, and research and development of organic EL devices have progressed for more favorable characteristics.

In order to obtain a higher-resolution light-emitting apparatus using an organic EL device, patterning an organic layer by a photolithography method using a photoresist or the like, instead of an evaporation method using a metal mask, has been studied. By using the photolithography method, a high-resolution light-emitting apparatus in which a distance between EL layers is several micrometers can be obtained (see Patent Document 1, for example).

REFERENCE

Patent Document

[Patent Document 1] Japanese Translation of PCT International Application No. 2018-521459

SUMMARY OF THE INVENTION

In patterning of an organic layer by a photolithography method, an aluminum oxide film is sometimes used for a mask layer of the organic layer. An aluminum oxide film is less likely to give serious damage to an organic layer at the time of being formed and removed and thus is suitable for a mask layer of an organic layer. However, although an organic layer is less likely to be seriously damaged, exposing a surface of the organic layer to a processing condition for removing the aluminum oxide film for a long time can lead to deterioration of the organic layer. Meanwhile, the aluminum oxide film might remain on the surface of the organic layer, leading to an increase in voltage of a device to be manufactured.

In view of the above, an object of one embodiment of the present invention is to inhibit an increase in voltage of an organic semiconductor device manufactured by a method which includes a step of forming an aluminum oxide film over and in contact with an organic semiconductor layer. Another object of one embodiment of the present invention is to provide an organic semiconductor device having favorable characteristics which is manufactured by a method which including a step of forming an aluminum oxide film over and in contact with an organic semiconductor layer.

One embodiment of the present invention is an organic semiconductor device including a first electrode, a second electrode, a first organic semiconductor layer, and a buffer layer. The first organic semiconductor layer is positioned between the first electrode and the second electrode. The buffer layer is positioned between the first organic semiconductor layer and the second electrode. A side surface of the first organic semiconductor layer and a side surface of the buffer layer are substantially aligned.

Another embodiment of the present invention is the organic semiconductor device with the above structure, in which the buffer layer contains a metal.

Another embodiment of the present invention is the organic semiconductor device with the above structure, in which the buffer layer contains an organometallic compound.

Another embodiment of the present invention is the organic semiconductor device with the above structure, in which the buffer layer contains an organic compound.

Another embodiment of the present invention is the organic semiconductor device with the above structure, in which the buffer layer includes a stack of a first buffer layer and a second buffer layer.

Another embodiment of the present invention is the organic semiconductor device with any of the above structures, which further includes a second organic semiconductor layer. The second organic semiconductor layer is positioned between the buffer layer and the second electrode. A side surface of the second organic semiconductor layer is not aligned with the side surface of the first organic semiconductor layer or the side surface of the buffer layer.

Another embodiment of the present invention is an organic EL device including a first electrode, a second electrode, a first organic semiconductor layer, and a buffer layer. The first organic semiconductor layer includes a light-emitting layer. The first organic semiconductor layer is positioned between the first electrode and the second electrode. The buffer layer is positioned between the first organic semiconductor layer and the second electrode. A side surface of the first organic semiconductor layer and a side surface of the buffer layer are substantially aligned.

Another embodiment of the present invention is the organic EL device with the above structure, in which the buffer layer contains a metal.

Another embodiment of the present invention is the organic EL device with the above structure, in which the buffer layer contains an organometallic compound.

Another embodiment of the present invention is the organic EL device with the above structure, in which the buffer layer contains an organic compound.

Another embodiment of the present invention is the organic EL device with the above structure, in which the buffer layer includes a stack of the first buffer layer and the second buffer layer.

Another embodiment of the present invention is the organic EL device with any of the above structures, which further includes a second organic semiconductor layer. The second organic semiconductor layer is positioned between the buffer layer and the second electrode. A side surface of the second organic semiconductor layer is not aligned with the side surface of the first organic semiconductor layer or the side surface of the buffer layer.

Another embodiment of the present invention is a light-emitting apparatus including the above organic EL devices with any of the above structures and a transistor or a substrate.

Another embodiment of the present invention is an electronic appliance including the above light-emitting apparatus; and a sensor unit, an input unit, or a communication unit.

Another embodiment of the present invention is a lighting device including the above light-emitting apparatus and a housing.

Note that the light-emitting apparatus in this specification includes, in its category, an image display device that uses an organic EL device. The light-emitting apparatus may also include a module in which an organic EL device is provided with a connector such as an anisotropic conductive film or a tape carrier package (TCP), a module in which a printed wiring board is provided at the end of a TCP, and a module in which an integrated circuit (IC) is directly mounted on an organic EL device by a chip on glass (COG) method. Furthermore, a lighting device or the like may include the light-emitting apparatus.

According to one embodiment of the present invention, in an organic semiconductor device manufactured by a method including a step of performing processing by a photolithography method over an organic semiconductor layer, damage to the organic semiconductor layer in the processing by the photolithography method is reduced, which can inhibit an increase in voltage of the organic semiconductor device. According to another embodiment of the present invention, in an organic semiconductor device manufactured by a method including a step of performing processing by the photolithography method over an organic semiconductor layer, reduces damage to the organic semiconductor layer in the processing by the photolithography method, which can provide an organic semiconductor device having favorable characteristics.

Note that the description of these effects does not preclude the existence of other effects. One embodiment of the present invention does not necessarily have all the effects. Other effects will be apparent from and can be derived from the descriptions of the specification, the drawings, the claims, and the like.

DETAILED DESCRIPTION OF THE INVENTION

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

In this specification and the like, a device formed using a metal mask or a fine metal mask (FMM) may be referred to as a device having a metal mask (MM) structure. In this specification and the like, a device formed without using a metal mask or an FMM is sometimes referred to as a device having a metal maskless (MML) structure.

In this specification and the like, a film that is not processed into any shape after being formed is referred to as a "film", and a film that is processed into a shape after being formed is referred to as a "layer" in many cases. However, they are distinguished mainly for easy understanding of the progress of the process, and there is no big difference between them, whereby a "film" can be read as a "layer", and a "layer" can be read as a "film". In particular, both of them have the same meaning in a description that does not refer to a processing step.

Embodiment 1

In this embodiment, an organic semiconductor device of one embodiment of the present invention is described.

Figure 1A:
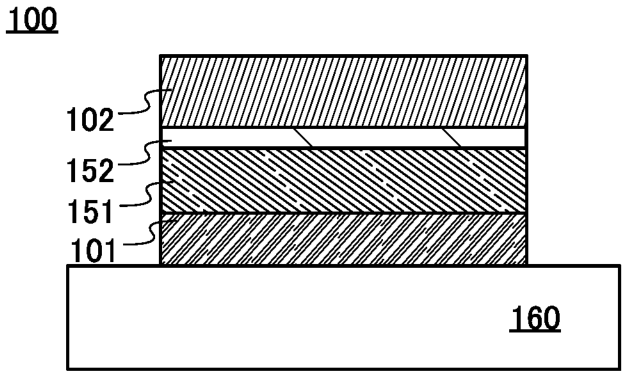
FIGS. 1A to 1C each illustrate an organic semiconductor device of one embodiment of the present invention.
Figure 1B:
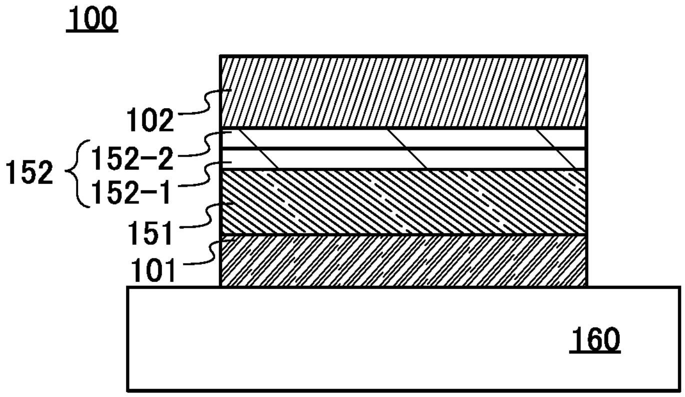
Figure 1C:
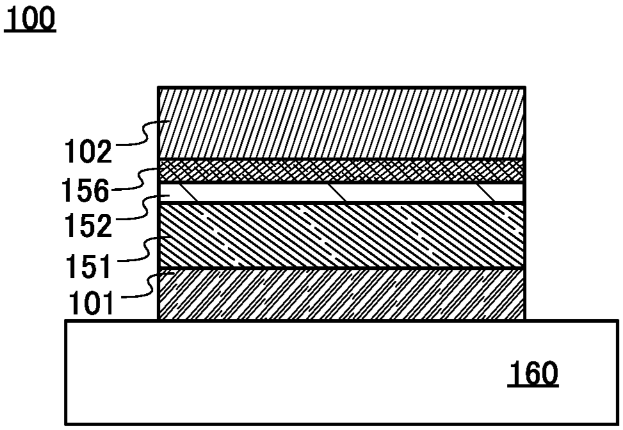

FIGS. 1A to 1C each illustrate a structure of an organic semiconductor device 100 as an example of the organic semiconductor device of one embodiment of the present invention.

As illustrated in FIG. 1A, the organic semiconductor device 100 includes, over an insulating layer 160, a first electrode 101, a second electrode 102, an organic semiconductor layer 151 positioned between the first electrode 101 and the second electrode 102, and a buffer layer 152 positioned between the organic semiconductor layer 151 and the second electrode 102.

The organic semiconductor layer 151 and the buffer layer 152 are layers processed by a photolithography method in a manufacturing process of the organic semiconductor device 100. Thus, side surfaces (end portions) of the organic semiconductor layer 151 and the buffer layer 152 are substantially aligned. In other words, it can be said that the side surfaces (end portions) of the organic semiconductor layer 151 and the buffer layer 152 are positioned on substantially the same plane.

The buffer layer 152 is a layer for protecting the organic semiconductor layer 151 in the manufacturing process of the organic semiconductor device 100. The buffer layer 152 can reduce damage to the organic semiconductor layer 151 and inhibit an increase in voltage of the organic semiconductor device 100. As a result, an ultra-high definition organic semiconductor device having favorable characteristics processed by a photolithography method can be provided. Processing by the photolithography method is described in detail in Embodiment 2.

For the buffer layer 152, a material having heat resistance or stability can be used. It is preferable to use a material that is less likely to deteriorate the device characteristics significantly (e.g., increase voltage) when the buffer layer 152 is provided between the organic semiconductor layer 151 and the second electrode 102 side. In the case where light generated in the organic semiconductor layer 151 is emitted from the second electrode 102, a material having a desired transmittance (e.g., preferably a transmittance higher than or equal to 40%, further preferably a transmittance higher than or equal to 50%) and satisfying the above conditions is preferably used for the buffer layer 152. As an example of such a material having heat resistance or stability, being less likely to deteriorate the device characteristics significantly, and having a desired transmittance, a metal, an organometallic compound, or an organic compound having an electron-transport property can be given.

As the metal, it is possible to use a metal such as aluminum (Al), titanium (Ti), vanadium (V), chromium (Cr), manganese (Mn), iron (Fe), cobalt (Co), nickel (Ni), copper (Cu), gallium (Ga), germanium (Ge), zinc (Zn), indium (In), tin (Sn), molybdenum (Mo), tantalum (Ta), tungsten (W), palladium (Pd), gold (Au), platinum (Pt), silver (Ag), yttrium (Y), neodymium (Nd), zirconium (Zr), europium (Eu), or ytterbium (Yb) or an alloy containing an appropriate combination of any of these metals. It is also possible to use an element belonging to Group 1 or Group 2 of the periodic table that is not described above (e.g., lithium (Li), cesium (Cs), calcium (Ca), or strontium (Sr)), a rare earth metal such as rubidium (Rb) or magnesium (Mg), an alloy containing an appropriate combination of any of these elements, graphene, or the like.

As the organometallic compound, it is possible to use, for example, a phthalocyanine-based complex compound such as copper phthalocyanine (abbreviation: CuPc) or zinc phthalocyanine (abbreviation: ZnPc).

As the organometallic compound, it is possible to use, for example, a metal complex including a quinoline ring or a benzoquinoline ring, such as tris(8-quinolinolato)aluminum (III) (abbreviation: $Alq_3$), tris(4-methyl quinolinolato)aluminum(III) (abbreviation: Almq 3), 8-quinolinolatolithium (I) (abbreviation: Liq), bis(10-hydroxybenzo[h]quinolinato) beryllium(II) (abbreviation: $BeBq_2$), bis(2-methyl-8-quinolinolato)(4-phenylphenolato)aluminum(III) (abbreviation: BAlq), or bis(8-quinolinolato)zinc(II) (abbreviation: Znq), or a metal complex including an oxazole ring or a thiazole ring, such as bis[2-(2-benzoxazolyl)phenolato] zinc(II) (abbreviation: ZnPBO) or bis[2-(2-benzothiazolyl) phenolato]zinc(II) (abbreviation: ZnBTZ).

As the organic compound having an electron-transport property, for example, a perylene derivative or a nitrogen-containing condensed aromatic compound can be given.

As specific examples of the perylene derivative, 3,4,9,10-perylenetetracarboxylic dianhydride (abbreviation: PTCDA), 3,4,9,10-perylenetetracarboxyl-bis-benzimidazole (abbreviation: PTCBI), N,N-dioctyl-3,4,9,10-perylenetetracarboxylic diimide (abbreviation: PTCDI-C8H), N,N-dihexyl-3,4,9,10-perylenetetracarboxylic diimide (abbreviation: Hex-PTCDI), and N,N-dimethyl-3,4,9,10-perylenetetracarboxylic diimide (abbreviation: Me-PTCDI) can be given.

As specific examples of the nitrogen-containing condensed aromatic compound, a benzimidazole derivative, a quinoxaline derivative, a dibenzoquinoxaline derivative, a quinazoline derivative, and a phenanthroline derivative can be given. More specifically, an organic compound including a heteroaromatic ring including a polyazole ring such as 2,2',2"-(1,3,5-benzenetriyl)tris(1-phenyl-1H-benzimidazole) (abbreviation: TPBI) or 2-[3-(dibenzothiophen-4-yl) phenyl]-1-phenyl-1H-benzimidazole (abbreviation: mDBT-BIm-II); an organic compound including a heteroaromatic ring including a pyridine ring such as bathophenanthroline (abbreviation: BPhen), bathocuproine (abbreviation: BCP), 2,9-di(naphthalen-2-yl)-4,7-diphenyl-1,10-phenanthroline (abbreviation: NBPhen), or 2,2-(1,3-phenylene)bis(9-phenyl-1,10-phenanthroline) (abbreviation: mPPhen2P); 2-{3-[3-(N-phenyl-9H-carbazol-3-yl)-9H-carbazol-9-yl] phenyl}dibenzo[f,h]quinoxaline (abbreviation: 2mPCCzPDBq); 2-[3-(dibenzothiophen-4-yl)phenyl] dibenzo[f,h]quinoxaline (abbreviation: 2mDBTPDBq-II); 2-[3'-(dibenzothiophen-4-yl)biphenyl-3-yl]dibenzo[f,h]quinoxaline (abbreviation: 2mDBTBPDBq-II); 2-[3'-(9H-carbazol-9-yl)biphenyl-3-yl]dibenzo[f,h]quinoxaline (abbreviation: 2mCzBPDBq); 2-[4-(3,6-diphenyl-9H-carbazol-9-yl)phenyl]dibenzo[f,h]quinoxaline (abbreviation: 2CzPDBq-III); 7-[3-(dibenzothiophen-4-yl)phenyl]dibenzo [f,h]quinoxaline (abbreviation: 7mDBTPDBq-II); 6-[3-

(dibenzothiophen-4-yl)phenyl]dibenzo[f,h]quinoxaline (abbreviation: 6mDBTPDBq-II); 2-{4-[9,10-di(2-naphthyl)-2-anthryl]phenyl}-1-phenyl-1H-benzimidazole (abbreviation: ZADN); 2-[4'-(9-phenyl-9H-carbazol-3-yl)-3,1'-biphenyl-1-yl]dibenzo[f,h]quinoxaline (abbreviation: 2mpPCBPDBq), and the like can be given Note that the thickness of the buffer layer 152 is preferably greater than or equal to 0.1 nm and less than or equal to 5 nm, further preferably greater than or equal to 0.5 nm and less than or equal to 3 nm. The buffer layer 152 with such thickness can protect the organic semiconductor layer 151 adequately in the manufacturing process of the organic semiconductor device 100 and can prevent an increase in voltage of the organic semiconductor device 100.

A plurality of buffer layers may be provided in the organic semiconductor device 100. The organic semiconductor device 100 illustrated in FIG. 1B includes the buffer layer 152 in which a buffer layer 152-1 and a buffer layer 152-2 are stacked. For example, an organometallic compound can be used for both the buffer layer 152-1 and the buffer layer 152-2. In addition, $Alq_3$ or Liq can be used for the buffer layer 152-1, and a phthalocyanine-based complex compound can be used for the buffer layer 152-2, for example.

The buffer layer 152 may be a mixed layer of two or more kinds of materials selected from the above materials. In the case where a plurality of buffer layers are stacked, some or all of them may be mixed layers.

In the organic semiconductor device 100, the organic semiconductor layer 151 is preferably formed using a material having high heat resistance. Further preferably, the uppermost surface of the organic semiconductor layer 151 is formed using a material having high heat resistance. A combination of the provision of the buffer layer 152 and the organic semiconductor layer 151 having such a structure can further reduce the damage to the organic semiconductor layer 151, so that an increase in voltage of the organic semiconductor device 100 can be more effectively prevented.

As the material having high heat resistance that can be used for the organic semiconductor layer 151, for example, it is possible to use the above-described nitrogen-containing condensed aromatic compound. An organic compound including a heteroaromatic ring including a pyridine ring is preferably used, and mPPhen2P is further preferably used. Compared with NBphen that is an organic compound also including a heteroaromatic ring including a pyridine ring, mPPhen2P has higher heat resistance and a higher effect of inhibiting an increase in voltage of the organic semiconductor device 100. Thus, mPPhen2P can be suitably used for the organic semiconductor layer 151.

As illustrated in FIG. 1C, the organic semiconductor device 100 may include a layer 156 between the buffer layer 152 and the second electrode 102. For the layer 156, a material having a high carrier-injection property can be used. With such a structure, an increase in voltage of the organic semiconductor device 100 can be further inhibited. The layer 156 is provided after the formation of the organic semiconductor layer 151 and the buffer layer 152 by a photolithography method in the manufacturing process of the organic semiconductor device 100. Thus, a side surface (end portion) of the layer 156 is not necessarily substantially aligned with the side surfaces (end portions) of the organic semiconductor layer 151 and the buffer layer 152.

Figure 2A:
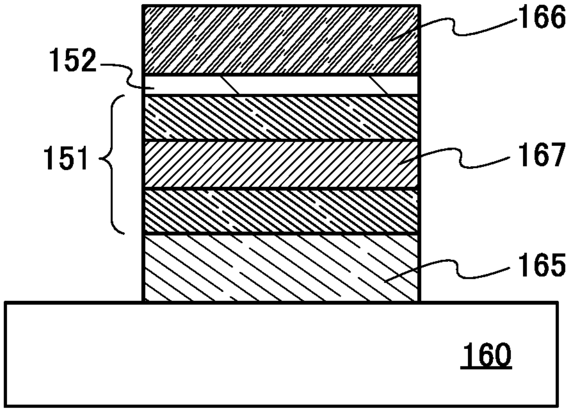
FIGS. 2A and 2B each illustrate an organic semiconductor device.
Figure 2B:
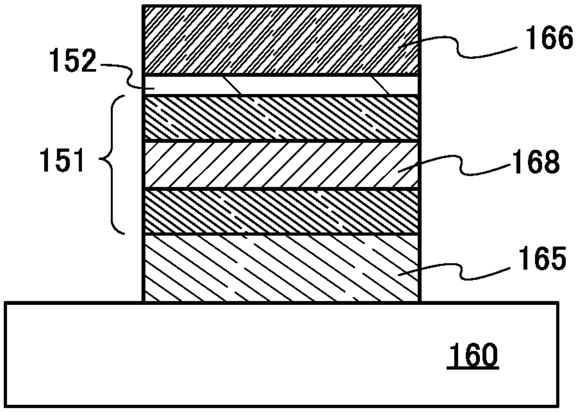

Note that the organic semiconductor device of one embodiment of the present invention can have a structure of a solar battery or a photoelectric conversion device, such as a photosensor, in which a first electrode 165, a second electrode 166, the organic semiconductor layer 151 including a photoelectric conversion layer 167, and the buffer layer 152 are provided over the insulating layer 160 as illustrated in FIG. 2A. Alternatively, as illustrated in FIG. 2B, the organic semiconductor device of one embodiment of the present invention can have a structure of an organic EL device or the like in which the first electrode 165, the second electrode 166, the organic semiconductor layer 151 including a light-emitting layer 168, and the buffer layer 152 are provided over the insulating layer 160.

Note that the structure described in this embodiment can be used in combination with any of the structures described in other embodiments as appropriate.

Embodiment 2

In this embodiment, a method for processing the buffer layer and the organic semiconductor layer included in the organic semiconductor device of one embodiment of the present invention is described with reference to FIGS. 4A to 4E and FIGS. 5A to 5D.

A vacuum evaporation method using a metal mask (mask deposition) is widely used as one of methods for forming an organic semiconductor film to have a predetermined shape. However, density and definition have been recently increasing; thus, increasing density in the mask deposition is reaching its limit due to problems typified by a problem of the degree of positioning precision and a problem of the arrangement interval of the substrate. Meanwhile, when the shape of an organic semiconductor film is processed by a photolithography method, a denser pattern can be formed. In addition, since the area can be easily increased, processing of an organic semiconductor film by a photolithography method has also been studied.

However, it is necessary to go over many problems to process the shape of the organic semiconductor film by the photolithography method. Examples of these problems include an effect of exposure to the air of the organic semiconductor film, an effect of light irradiation when a photosensitive resin is exposed to light, an effect of developer when the exposed photosensitive resin is developed, and an effect of formation of a metal film that is sometimes formed to reduce the effect of the developer.

These effects are regarded as problems because an organic semiconductor film itself is removed or damage to a surface of the organic semiconductor film significantly deteriorates the characteristics of a device manufactured later, for example.

Figure 3A:
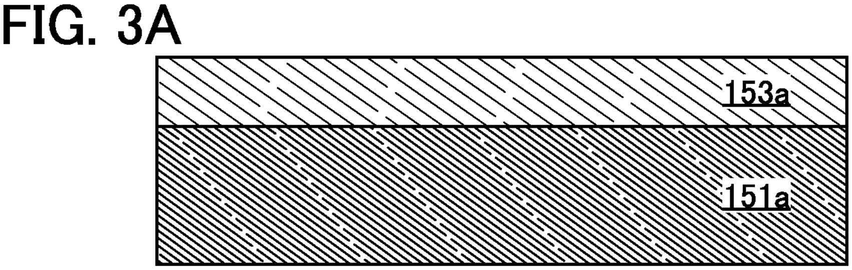
FIGS. 3A to 3C illustrate a conventional film.

Here, as one means to solve the above problems, an aluminum oxide film 153*a* is provided over and in contact with an organic semiconductor film 151*a* as a protective film as illustrated in FIG. 3A, and then a step that would cause the above-described problems is performed. Since an aluminum oxide film can be formed dense and is highly capable of blocking liquid and gas, the adverse effects caused by the step can be inhibited. Furthermore, the aluminum oxide film can be formed and removed by a method that is less likely to damage the organic semiconductor film, and thus is extremely suitable as a protective film of the organic semiconductor film 151*a*.

Note that an atomic layer deposition (ALD) method that is capable of forming a denser film and is less likely to damage the organic semiconductor film is preferably employed as a formation method of the aluminum oxide film.

Figure 3B:
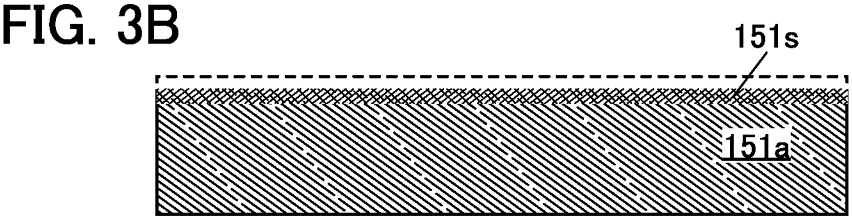

In this manner, an aluminum oxide film causes less damage to the organic semiconductor film when being formed and removed, and thus is suitably used as a protective film in processing the organic semiconductor film by a photolithography method. However, when the surface of the organic semiconductor film is excessively exposed in a removing step of the aluminum oxide film, it is natural that a surface 151*s* of the organic semiconductor film 151*a* is damaged as illustrated in FIG. 3B, whereby the characteristics of the organic semiconductor might deteriorate. Thus, time for removing the aluminum oxide is preferably as short as possible.

Figure 3C:
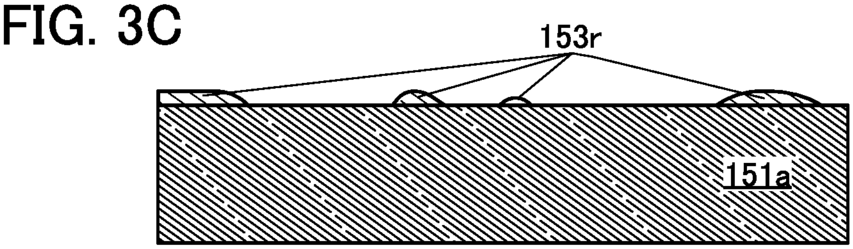

In order to perform the removing step in the minimum, process ends at the point when the aluminum oxide is removed from an upper surface of the organic semiconductor film. However, it is extremely difficult to determine whether the aluminum oxide is removed from the upper surface of the organic semiconductor film, and in the case where there is in-plane variation in the film quality of the aluminum oxide film, in-plane variation is also generated in etching rate in etching that is the removing step of the aluminum oxide, and even when the aluminum oxide films can be removed in some portions as illustrated in FIG. 3C, aluminum oxide films 153*r* sometimes remain in other portions. In particular, in the case where the aluminum oxide film is provided over an organic film by an ALD method, the above-described in-plane variation is generated easily since the aluminum oxide film cannot be formed with a high temperature; thus the aluminum oxide films 153*r*, which remain due to the in-plane variation, may be generated in some portions. When the aluminum oxide remains over the organic semiconductor film, the driving voltage of a device manufactured later might increase. Note that when all of the remaining aluminum oxide films 153*r* are removed by etching excessively, it is possible that an aluminum oxide (an aluminum oxide not to be removed) provided in an adjacent pixel direction, which should remain in terms of steps, is side-etched from the lateral direction, which is extremely undesirable.

In view of this, in one embodiment of the present invention, a buffer film 152*a* is provided between the organic semiconductor film 151*a* and the aluminum oxide film 153*a* to facilitate removal of the aluminum oxide film.

Figure 4A:
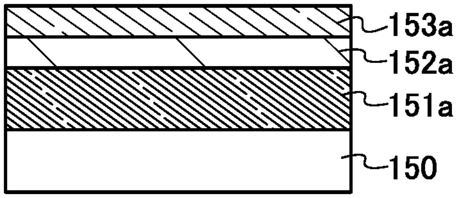
FIGS. 4A to 4E illustrate a method for processing a film.

First, the organic semiconductor film 151*a* is formed over a base film 150 (FIG. 4A). The base film 150 may be either an insulating film or a conductive film depending on a device manufactured later. The organic semiconductor film 151*a* may be formed by a dry method such as an evaporation method or a wet method such as a spin coating method.

Next, the buffer film 152*a* is formed over the organic semiconductor film 151*a* (FIG. 4A). For the buffer film 152*a*, the material that can be used for the buffer layer 152 as described in Embodiment 1 can be used. The buffer film 152*a* is preferably formed by a vacuum evaporation method.

Next, the aluminum oxide film 153*a* is formed over the buffer film 152*a* (FIG. 4A). The aluminum oxide film 153*a* is preferably formed by a method that causes small damage to the organic semiconductor film 151*a*, and is preferably formed by an ALD method.

Figure 4B:
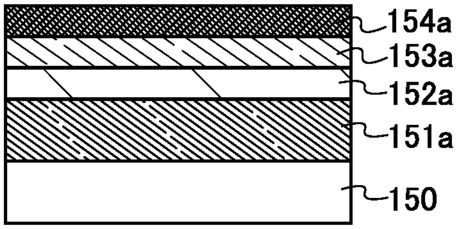

A metal film or metal compound film 154*a* is preferably formed over the aluminum oxide film 153*a* (FIG. 4B). Since the buffer film 152*a* and the aluminum oxide film 153*a* can reduce the damage to the organic semiconductor film 151*a*, a film formation method which causes relatively large damage to a surface over which a film is formed, such as a sputtering method, can be selected to form the metal film or metal compound film 154*a*. Examples of a material for the metal film or metal compound film 154*a* include a metal or an metal compound such as silicon, silicon nitride, silicon oxide, tungsten, titanium, molybdenum, tantalum, tantalum nitride, an alloy containing molybdenum and niobium, or an alloy containing molybdenum and tungsten, and a metal oxide such as an indium gallium zinc oxide (also denoted as In—Ga—Zn oxide or IGZO). It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon can also be used, for example.

Figure 4C:
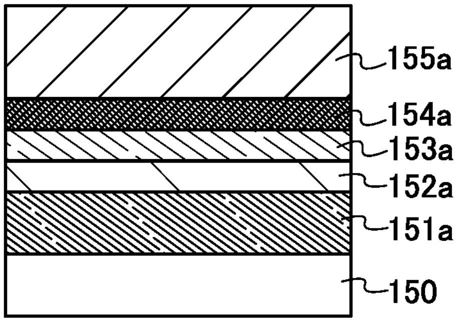
Figure 4D:
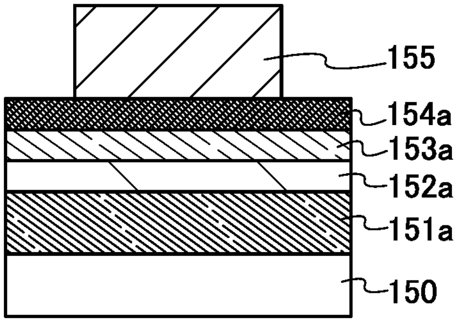

Then, a photosensitive resin is applied over the metal film or metal compound film 154*a* to form a resin film 155*a* (FIG. 4C). The photosensitive resin may be either a positive type resist or a negative type resist.

Figure 4E:
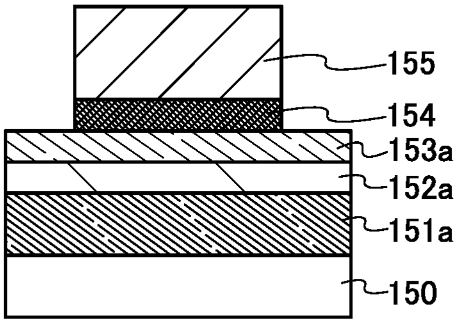

Next, a photomask layer 155 is formed by performing light exposure in accordance with the photosensitivity of the resin and performing development (FIG. 4D), and a metal layer or metal compound layer 154 is formed by etching the metal film or the metal compound film 154*a* using the photomask layer 155 (FIG. 4E). The metal film or the metal compound film 154*a* may be etched by either wet etching or dry etching. For the etching, a condition where the metal film or metal compound film 154*a* has a higher selectivity with respect to the aluminum oxide film 153*a* is preferably selected.

Figure 5A:
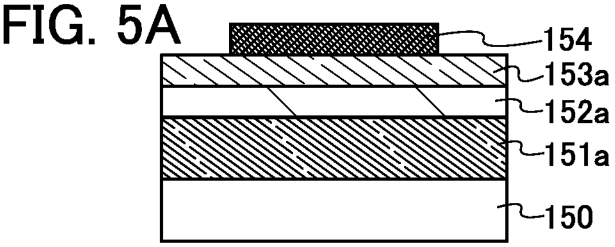
FIGS. 5A to 5D illustrate the method for processing the film.

After the metal layer or metal compound layer 154 is formed, the photomask layer 155 is removed (FIG. 5A). When the metal film or metal compound film 154*a*, the aluminum oxide film 153*a*, and the buffer film 152*a* are formed over the organic semiconductor film 151*a*, it is possible to prevent an adverse effect such as removal of the organic semiconductor film 151*a* or damage to the organic semiconductor film 151*a* in the steps of forming and removing the photomask layer 155, so that an organic semiconductor device can have favorable characteristics.

Figure 5B:
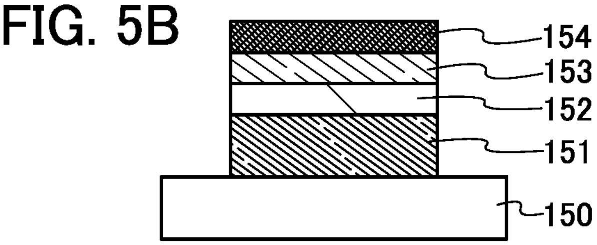

After that, the organic semiconductor layer 151, the buffer layer 152, and the aluminum oxide layer 153 are formed by etching using the metal layer or metal compound layer 154 as a mask (FIG. 5B). The etching may be either wet etching or dry etching, but dry etching is preferable.

Figure 5C:
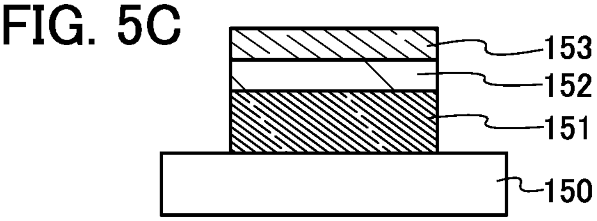

After the processing of the organic semiconductor layer 151, the metal layer or metal compound layer 154 is removed (FIG. 5C). The metal layer or metal compound layer 154 can be removed by either wet etching or dry etching, but dry etching is preferable. For the etching, a condition where the metal film or metal compound film 154 has a higher selectivity with respect to the aluminum oxide film 153.

Figure 5D:
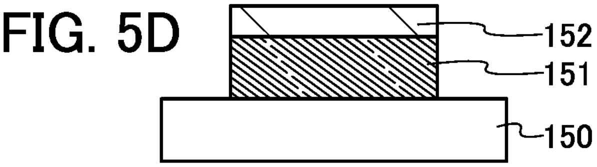

Lastly, the aluminum oxide layer 153 is removed (FIG. 5D). The aluminum oxide layer 153 may be removed by either wet etching or dry etching, but wet etching using an alkaline solution or an acid solution is preferable. A surface of the organic semiconductor layer 151 is, owing to the buffer layer 152 thereover, prevented from being exposed to the alkaline solution or the acid solution, whereby the deterioration of characteristics can be prevented.

Note that in the case where a material having high solubility in water is used for the buffer layer 152, after removing the aluminum oxide layer 153 to some extent, the remaining aluminum oxide layer 153 may be removed by processing with water or liquid using water as a solvent. As the removing method, the remaining aluminum oxide layer 153 is immersed in water or the liquid using water as a solvent for a predetermined time, and then showered with pure water. The liquid for removing is preferably water to reduce the damage to the organic semiconductor layer 151.

Note that part of the buffer layer 152 may be removed at the same time as removing the aluminum oxide layer 153.

The organic semiconductor layer 151 processed through the above steps has less processing damage, so that an organic semiconductor device can have favorable characteristics. Furthermore, the aluminum oxide films 153*r* are inhibited from remaining on the surface of the organic semiconductor layer 151, whereby an increase in voltage of an organic semiconductor device manufactured later can be prevented.

Note that the structure described in this embodiment can be used in combination with any of the structures described in other embodiments as appropriate.

Embodiment 3

[Manufacturing Method Example]

In this embodiment, an example of a method for manufacturing the organic semiconductor device of one embodiment of the present invention is described with reference to drawings. Here, description is made with use of a light-emitting apparatus 450 illustrated in FIGS. 6A to 6D as an example. In the light-emitting apparatus 450, an organic EL device includes the organic semiconductor layer in Embodiment 1 or 2 that is an EL layer. That is, a layer denoted as an EL layer below corresponds to the organic semiconductor layer. Note that the organic EL device can be used as a photosensor with the use of an organic semiconductor layer including a photoelectric conversion layer instead of an EL layer. A light-emitting apparatus may include both a photosensor and an organic EL device.

Figure 6A:
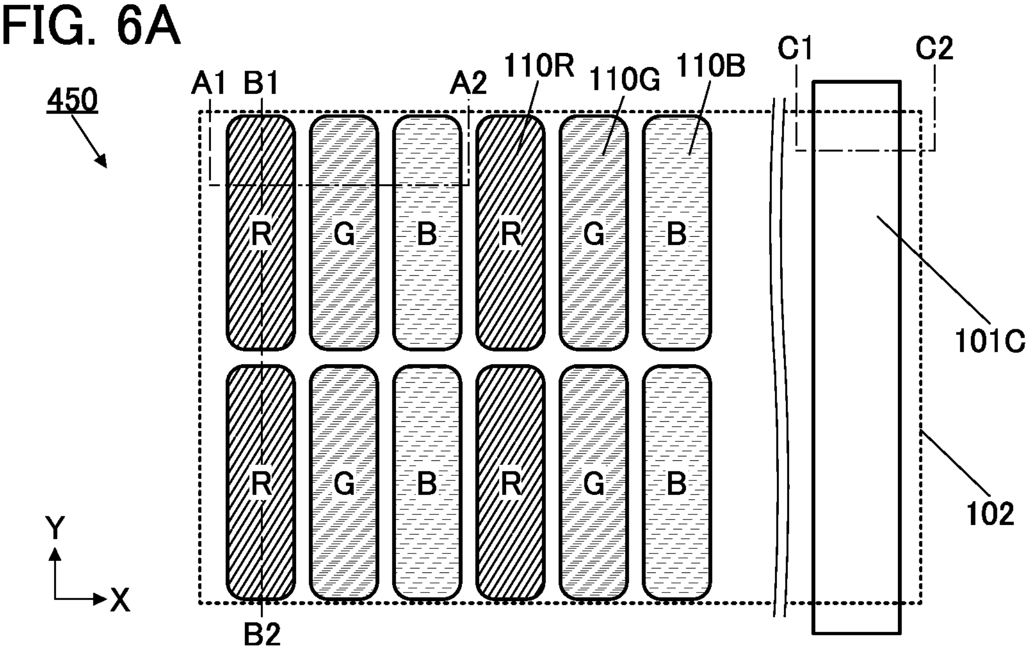
FIGS. 6A to 6D illustrate a light-emitting apparatus.

FIG. 6A is a schematic top view of the light-emitting apparatus 450. The light-emitting apparatus 450 includes a plurality of organic EL devices 110B emitting blue light, a plurality of organic EL devices 110G emitting green light, and a plurality of organic EL devices 110R emitting red light. In FIG. 6A, light-emitting regions of the organic EL devices are denoted by R, G, and B to easily differentiate the organic EL devices.

The organic EL devices 110B, the organic EL devices 110G, and the organic EL devices 110R are arranged in a matrix. FIG. 6A illustrates what is called a stripe arrangement, in which the organic EL devices of the same color are arranged in one direction. Note that the arrangement of the organic EL devices is not limited thereto; another arrangement such as a delta, zigzag, or PenTile pattern may also be used.

The organic EL devices 110B, 110G, and 110R are arranged in the X direction. The organic EL devices of the same color are arranged in the Y direction intersecting with the X direction.

The organic EL devices 110B, 110G, and 110R each have the structure described in Embodiments 1 and 2.

Figure 6B:
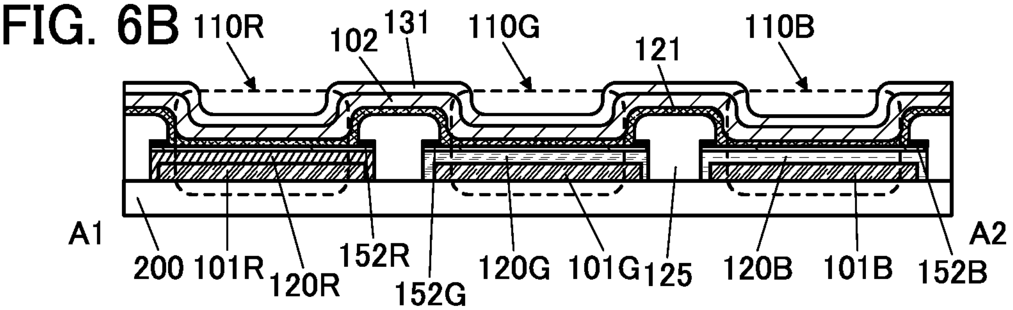
Figure 6C:
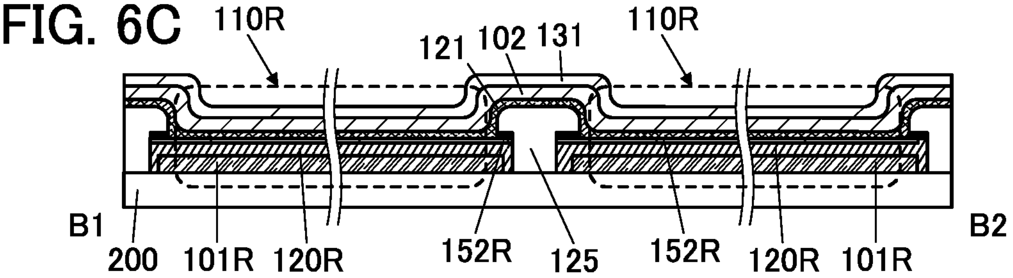

FIG. 6B is a cross-sectional schematic view taken along the dashed-dotted line A1-A2 in FIG. 6A, and FIG. 6C is a cross-sectional schematic view taken along the dashed-dotted line B1-B2 in FIG. 6A.

FIG. 6B illustrates cross sections of the organic EL devices 110B, 110G, and 110R. The organic EL device 110B includes a first electrode 101B (pixel electrode), a first EL layer 120B, a buffer layer 152B, a second EL layer 121 (electron-injection layer), and the second electrode 102 (common electrode). The organic EL device 110G includes a first electrode 101G (pixel electrode), a first EL layer 120G, a buffer layer 152G, the second EL layer 121, and the second electrode 102. The organic EL device 110R includes a first electrode 101R (pixel electrode), a first EL layer 120R, a buffer layer 152R, the second EL layer 121, and the second electrode 102. The second EL layer 121 and the second electrode 102 are provided in common to the organic EL devices 110B, 110G, and 110R. The second EL layer 121 and the second electrode 102 can each also be referred to as a common layer. Note that a case where the first electrode 101 is an anode and the second electrode 102 is a cathode is described as an example in this embodiment.

The first EL layer 120B included in the organic EL device 110B contains a light-emitting organic compound that emits light with intensity at least in a blue wavelength range. The first EL layer 120G included in the organic EL device 110G contains a light-emitting organic compound that emits light with intensity at least in a green wavelength range. The first EL layer 120R included in the organic EL device 110R contains a light-emitting organic compound that emits light with intensity at least in a red wavelength range.

Each of the first EL layers 120B, 120G, and 120R includes at least a light-emitting layer, and may further include one or more of a hole-blocking layer, an electron-injection layer, an electron-transport layer, a hole-transport layer, a hole-injection layer, an electron-blocking layer, an exciton-blocking layer, and the like. The second EL layer 121 does not include the light-emitting layer. The second EL layer 121 is preferably the electron-injection layer. Note that each of the first EL layers 120B, 120G, and 120R corresponds to the organic semiconductor layer 151 in the organic semiconductor device 100 described in Embodiment 1. The second EL layer 121 corresponds to the layer 156 described in Embodiment 1. In the case where the second-electrode-side surfaces of the first EL layers 120B, 120G, and 120R also function as the electron-injection layers, the second EL layer 121 is not necessarily provided.

The first electrodes 101B, 101G, and 101R are provided for the respective organic EL devices. The second electrode 102 and the second EL layer 121 are each preferably provided as a layer common to the organic EL devices.

A conductive film that transmits visible light is used for either the first electrode 101 or the second electrode 102, and a reflective conductive film is used for the other. When the first electrode 101 is a light-transmitting electrode and the second electrode 102 is a reflective electrode, a bottom-emission display apparatus is obtained. When the respective first electrodes 101 are reflective electrodes and the second electrode 102 is a light-transmitting electrode, a top-emission display apparatus is obtained. Note that when both the respective first electrodes and the second electrode 102 transmit light, a dual-emission display device can be obtained. The organic EL device of one embodiment of the present invention is suitable for a top-emission organic EL device.

The first EL layers 120B, 120G, and 120R are provided to cover end portions of the first electrodes 101B, 101G, and 101R, respectively. The buffer layers 152B, 152G, and 152R are provided over the first EL layers 120B, 120G, and 120R, respectively. The insulating layer 125 is provided to cover the end portions of the first EL layers 120B, 120G, and 120R and the end portions of the buffer layers 152B, 152G, and 152R. In other words, the insulating layer 125 includes opening portions overlapping with the buffer layers 152B, 152G, and 152R and the first EL layers 120B, 120G, and 120R that are over the first electrodes 101B, 101G, and 101R, respectively. The end portions of the insulating layer 125 in the opening portions are preferably tapered. Note that the end portions of the first electrodes 101B, 101G, and

101R are not necessarily covered with the first EL layers 120B, 120G, and 120R, respectively.

The first EL layers 120B, 120G, and 120R include a region in contact with top surfaces of the first electrodes 101B, 101G, and 101R, respectively. The end portions of the buffer layers 152B, 152G, and 152R and the end portions of the first EL layers 120B, 120G, and 120R are positioned below the insulating layer 125. Top surfaces of the buffer layers 152B, 152G, and 152R over the first EL layers 120B, 120G, and 120R, respectively, include a region in contact with the second EL layer 121 (the second electrode 102 in the case where the second EL layer is not provided).

Figure 7:
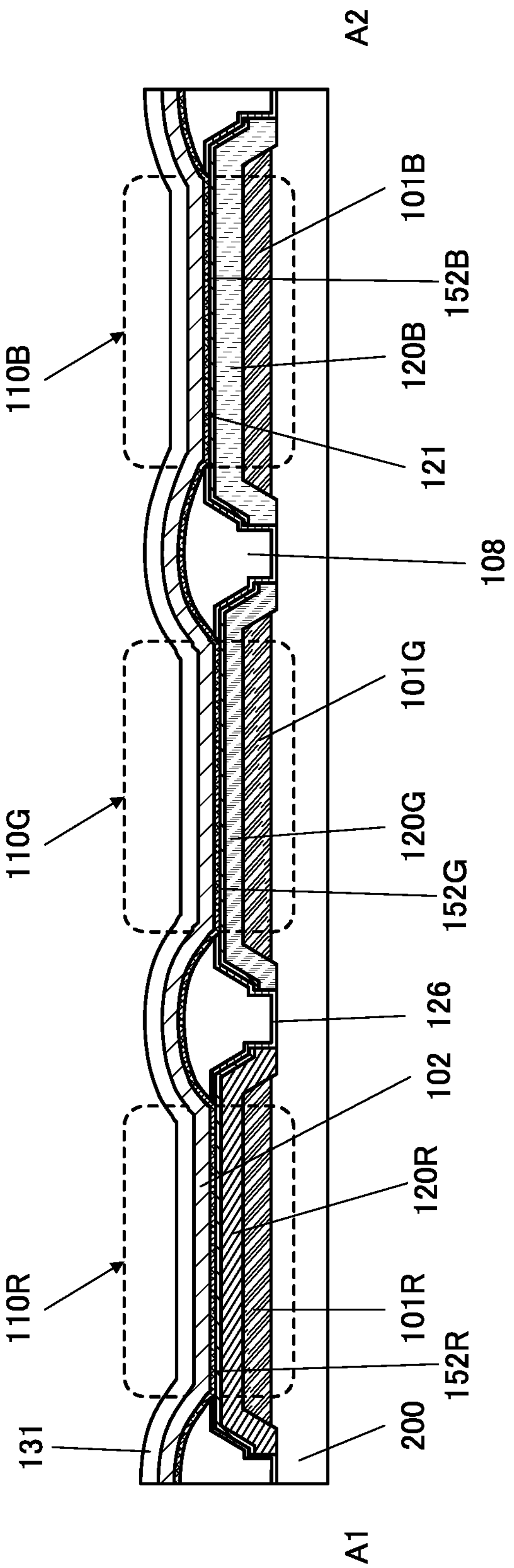
FIG. 7 illustrates a light-emitting apparatus.

FIG. 7 is a variation example of FIG. 6B. In FIG. 7, the end portions of the first electrodes 101B, 101G, and 101R each have a tapered shape that gradually becomes wider toward the substrate, which improves the coverage with a film formed thereover. The end portions of the first electrodes 101B, 101G, and 101R are covered with the first EL layers 120B, 120G, and 120R, respectively. The buffer layers 152B, 152G, and 152R are formed to cover the first EL layers 120B, 120G, and 120R, respectively. This inhibits the EL layers from being damaged at the time of etching by a photolithography method. End portions of the first EL layers 120B, 120G, and, 120R are covered with insulating layers 126. Insulating layers 108 are provided in regions that are positioned between the organic EL devices 110B, 110G, and 110R and over the insulating layers 126. End portions of the insulating layers 108 have a gentle tapered shape, thereby inhibiting disconnection of the second EL layer 121 and the second electrode 102, which are formed later.

As illustrated in FIGS. 6B and 7, there is a gap between two EL layers of the organic EL devices with different colors. The first EL layers 120B, 120G, and 120R are thus preferably provided so as not to be in contact with each other. This effectively prevents unintentional light emission from being caused by current flowing through two adjacent EL layers. As a result, the contrast can be increased to achieve a display apparatus with high display quality. A distance between facing end portions of EL layers of adjacent organic EL devices (e.g., the organic EL devices 110B and 110G) can be set greater than or equal to 2 μm and less than or equal to 5 μm by manufacturing the organic EL devices by a photolithography method. Note that the distance can also be referred to as a distance between the light-emitting layers included in the EL layers. It is difficult to set the distance less than 10 μm by a manufacturing method using a metal mask.

As described above, manufacturing the light-emitting apparatus by a photolithography method can greatly reduce a non-light-emitting area between two adjacent organic EL devices, thereby significantly increasing the aperture ratio. For example, the display apparatus of one embodiment of the present invention can achieve an aperture ratio higher than or equal to 40%, higher than or equal to 50%, higher than or equal to 60%, higher than or equal to 70%, higher than or equal to 80%, or higher than or equal to 90%; that is, an aperture ratio lower than 100%.

Increasing the aperture ratio of the display apparatus can improve the reliability of the display apparatus. Specifically, with reference to the lifetime of a display apparatus including an organic EL device and having an aperture ratio of 10%, a display apparatus having an aperture ratio of 20% (that is, having an aperture ratio two times higher than the reference) has a lifetime 3.25 times longer than the reference, and a display apparatus having an aperture ratio of 40% (that is, having an aperture ratio four times higher than the reference) has a lifetime 10.6 times longer than the reference. Thus, the density of current flowing to the organic EL device can be reduced with increasing aperture ratio, and accordingly the lifetime of the display apparatus can be increased. The display apparatus described in this embodiment can have a higher aperture ratio and thus can have higher display quality. Furthermore, the display apparatus of one embodiment of the present invention has excellent effect that the reliability (especially the lifetime) can be significantly improved with increasing aperture ratio.

FIG. 6C illustrates an example in which the first EL layer 120R is provided individually for each organic EL device in the Y direction. FIG. 6C illustrates the cross section of the organic EL device 110R as an example; the organic EL devices 110G and 110B can have a similar shape. Note that the EL layer is continuous in the Y direction and the first EL layer 120R may be formed in a band shape. When the first EL layer 120R and the like are formed in a band shape, no space for dividing the layer is needed and thus a non-light-emitting area between the organic EL devices is reduced, resulting in a higher aperture ratio.

A barrier layer 131 is provided over the second electrode 102 so as to cover the organic EL devices 110B, 110G, and 110R. The barrier layer 131 has a function of preventing diffusion of impurities that adversely affect the organic EL devices from the above.

The barrier layer 131 can have, for example, a single-layer structure or a stacked-layer structure at least including an inorganic insulating film Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as indium gallium oxide or indium gallium zinc oxide may be used for the barrier layer 131.

As the barrier layer 131, a stacked film of an inorganic insulating film and an organic insulating film can be used. For example, a structure in which an organic insulating film is interposed between a pair of inorganic insulating films is preferable. Furthermore, it is preferable that the organic insulating film function as a planarization film With this structure, a top surface of the organic insulating film can be flat, and accordingly, coverage with the inorganic insulating film over the organic insulating film is improved, leading to an improvement in barrier properties. Moreover, since a top surface of the barrier layer 131 is flat, a preferable effect can be obtained; when a component (e.g., a color filter, an electrode of a touch sensor, a lens array, or the like) is provided above the barrier layer 131, the component is less affected by an uneven shape caused by the lower structure.

In FIG. 6A, a connection electrode 101C electrically connected to the second electrode 102 is illustrated. The connection electrode 101C is supplied with a potential (e.g., an anode potential or a cathode potential) that is to be supplied to the second electrode 102. The connection electrode 101C is provided outside a display region where the organic EL devices 110B and the like are arranged. In FIG. 6A, the second electrode 102 is denoted by a dashed line.

The connection electrode 101C can be provided along the outer periphery of the display region. For example, the connection electrode 101C may be provided along one side of the outer periphery of the display region or two or more sides of the outer periphery of the display region. That is, in the case where the display region has a rectangular top surface, a top surface of the connection electrode 101C can have a band shape, an L shape, a square bracket shape, a quadrangular shape, or the like.

Figure 6D:
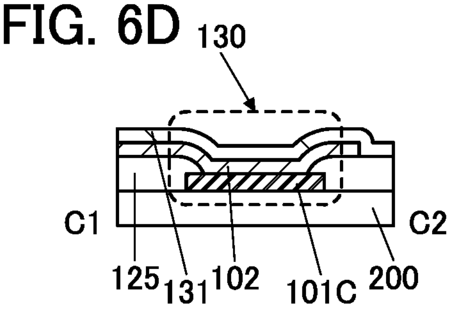

FIG. 6D is a cross-sectional schematic view taken along the dashed-dotted line C1-C2 in FIG. 6A. FIG. 6D illustrates a connection portion 130 at which the connection electrode 101C is electrically connected to the second electrode 102. In the connection portion 130, the second electrode 102 is provided on and in contact with the connection electrode 101C and the barrier layer 131 is provided to cover the second electrode 102. In addition, the insulating layer 125 is provided to cover end portions of the connection electrode 101C.

FIGS. 8A to 8F and FIGS. 9A to 9F are cross-sectional schematic views of steps in the method for manufacturing the light-emitting apparatus 450 described above. In these drawings, the cross-sectional schematic views of the connection portion 130 and the periphery thereof are also illustrated on the right side.

Note that thin films included in the display apparatus (e.g., insulating films, semiconductor films, or conductive films) can be formed by any of a sputtering method, a chemical vapor deposition (CVD) method, a vacuum evaporation method, a pulsed laser deposition (PLD) method, an ALD method, and the like. Examples of the CVD method include a plasma-enhanced chemical vapor deposition (PECVD) method and a thermal CVD method. An example of a thermal CVD method is a metal organic CVD (MOCVD) method.

Alternatively, thin films included in the display apparatus (e.g., insulating films, semiconductor films, and conductive films) can be formed by a method such as spin coating, dipping, spray coating, ink-jetting, dispensing, screen printing, or offset printing or with a doctor knife, a slit coater, a roll coater, a curtain coater, or a knife coater.

Thin films included in the display apparatus can be processed by a photolithography method or the like.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Furthermore, instead of the light used for the exposure, an electron beam can also be used. It is preferable to use EUV, X-rays, or an electron beam because extremely minute processing can be performed. Note that a photomask is not needed when light exposure is performed by scanning with a beam such as an electron beam.

For etching of thin films, a dry etching method, a wet etching method, a sandblast method, or the like can be used.

[Preparation for Substrate 200]

A substrate that has heat resistance high enough to withstand at least heat treatment performed later can be used as a substrate 200. When an insulating substrate is used as the substrate 200, a glass substrate, a quartz substrate, a sapphire substrate, a ceramic substrate, an organic resin substrate, or the like can be used. Alternatively, a semiconductor substrate can be used. For example, a single crystal semiconductor substrate or a polycrystalline semiconductor substrate of silicon, silicon carbide, or the like; a compound semiconductor substrate of silicon germanium or the like; an SOI substrate; or the like can be used.

As the substrate 200, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

[Formation of First Electrodes 101B, 101G, and 101R and Connection Electrode 101C]

Figure 8A:
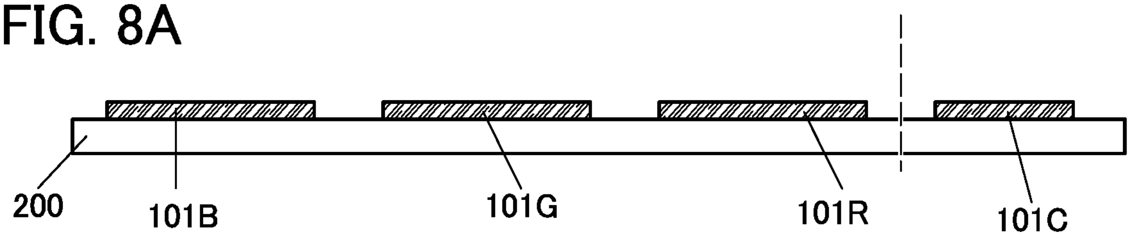
FIGS. 8A to 8F illustrate a method for manufacturing an organic EL device and a light-emitting apparatus.

Next, the first electrodes 101B, 101G, and 101R and the connection electrode 101C are formed over the substrate 200. First, a conductive film to be a pixel electrode (first electrode) is formed, a resist mask is formed by a photolithography method, and an unnecessary portion of the conductive film is removed by etching. After that, the resist mask is removed to form the first electrodes 101B, 101G, and 101R and the connection electrode 101C (FIG. 8A).

In the case where a conductive film that reflects visible light is used as each pixel electrode, it is preferable to use a material (e.g., silver or aluminum) having reflectance as high as possible in the whole wavelength range of visible light. This can increase both light extraction efficiency of the organic EL devices and color reproducibility. In the case where a conductive film that reflects visible light is used as each pixel electrode, what is called a top-emission light-emitting apparatus in which light is extracted in the direction opposite to the substrate can be obtained. In the case where a conductive film that transmits light is used as each pixel electrode, what is called a bottom-emission light-emitting apparatus in which light is extracted in the direction of the substrate can be obtained.

[Formation of EL Film 120Bb]

Figure 8B:
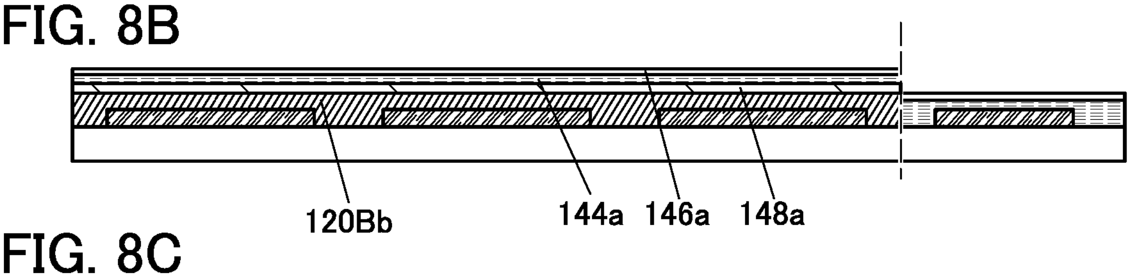

Next, an EL film 120Bb that is to be the first EL layer 120B is formed over the first electrodes 101B, 101G, and 101R (FIG. 8B).

The EL film 120Bb includes at least a light-emitting layer containing a light-emitting material. In addition to this, one or more films functioning as an electron-injection layer, an electron-transport layer, a charge-generation layer, a hole-transport layer, and a hole-injection layer may be stacked. The EL film 120Bb can be formed by, for example, an evaporation method, a sputtering method, an inkjet method, or the like. Without limitation to this, a known film formation method can be used as appropriate.

For example, the EL film 120Bb is preferably a stacked film in which a hole-injection layer, a hole-transport layer, a light-emitting layer, and an electron-transport layer are stacked in this order. In that case, a film including the electron-injection layer can be used as the second EL layer 121 formed later.

The EL film 120Bb is preferably formed so as not to overlap with the connection electrode 101C. For example, in the case where the EL film 120Bb is formed by an evaporation method (or a sputtering method), it is preferable that the EL film 120Bb be formed using a shielding mask so as not to be formed over the connection electrode 101C, or the EL film 120Rb be removed in a later etching step.

[Formation of Buffer Film 148*a*]

Next, a buffer film 148*a* is formed to cover the EL film 120Bb. It is preferable that the buffer film 148*a* be formed using a shielding mask so as not to be formed over the connection electrode 101C, or the buffer film 148*a* be removed in a later etching step.

The buffer film 148*a* is formed using the metal, the organometallic compound, the organic compound having an electron-transport property, or the like described in Embodiment 1. In particular, the organometallic compound is extremely suitable as a material of the buffer film 148*a* that is formed to protect the EL film 120Bb and facilitate the removal of an aluminum oxide film formed later. The buffer film 148*a* can prevent an increase in voltage of the organic EL device. It is possible to inhibit the deterioration of organic EL device characteristics.

[Formation of Aluminum Oxide Film 144*a*]

Next, an aluminum oxide film 144*a* is formed to cover the buffer film 148*a* and the connection electrode 101C. It is preferable that the aluminum oxide film 144*a* be formed using a shielding mask so as not to be formed over the connection electrode 101C, or the aluminum oxide film 144*a* be removed in a later etching step.

As the aluminum oxide film 144*a*, it is possible to use a film highly resistant to etching treatment performed on various EL films such as the EL film 120Bb, i.e., a film having a high etching selectivity with respect to the EL film. Furthermore, as the aluminum oxide film 144*a*, it is possible to use a film having a high etching selectivity with respect to a protective film such as a metal film or metal compound film 146*a* described later. Moreover, as the aluminum oxide film 144*a*, it is possible to use a film that can be removed by a wet etching method, which is less likely to cause damage to the EL films.

The aluminum oxide film 144*a* can be formed by a variety of film formation methods such as a sputtering method, an evaporation method, a CVD method, and an ALD method, and the ALD method is preferable to obtain a dense film having a high barrier property against an atmospheric component such as oxygen or water, or liquid such as water.

[Formation of Metal Film or Metal Compound Film 146*a*]

Next, the metal film or metal compound film 146*a* is formed over the aluminum oxide film 144*a* (FIG. 8B).

The metal film or metal compound film 146*a* is used as a hard mask when the aluminum oxide film 144*a* is etched later. In a later step of processing the metal film or metal compound film 146*a*, the aluminum oxide film 144*a* is exposed. Thus, the combination of films having a high etching selectivity therebetween is selected for the aluminum oxide film 144*a* and the metal film or metal compound film 146*a*. It is thus possible to select a film that can be used as the metal film or metal compound film 146*a* depending on an etching condition of the aluminum oxide film 144*a* and an etching condition of the metal film or metal compound film 146*a*.

For example, in the case where dry etching using a gas containing fluorine (also referred to as a fluorine-based gas) is performed for the etching of the metal film or metal compound film 146*a*, the metal film or metal compound film 146*a* can be formed using silicon, silicon nitride, silicon oxide, tungsten, titanium, molybdenum, tantalum, tantalum nitride, an alloy containing molybdenum and niobium, an alloy containing molybdenum and tungsten, or the like. Here, a metal oxide film can be given as a film having a high etching selectivity (that is, enabling low etching rate) in dry etching using the fluorine-based gas.

Alternatively, the aluminum oxide film 144*a* can be formed using a metal oxide such as an indium-gallium-zinc oxide (In—Ga—Zn oxide, also referred to as IGZO). It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon can also be used, for example.

A metal oxide using not gallium but an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) can be used. In particular, M is preferably one or more of gallium, aluminum, and yttrium.

Without being limited to the above, a material of the metal film or metal compound film 146*a* can be selected from a variety of materials depending on etching conditions of the aluminum oxide film 144*a* and the metal film or metal compound film 146*a*. For example, any of the films that can be used as the aluminum oxide film 144*a* can be used.

As the metal film or metal compound film 146*a*, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

As the metal film or metal compound film 146*a*, an oxide film can also be used. Typically, it is possible to use a film of an oxide or an oxynitride such as silicon oxide, silicon oxynitride, aluminum oxynitride, hafnium oxide, or hafnium oxynitride.

Alternatively, as the metal film or metal compound film 146*a*, an organic film that can be used as the EL film 120Bb or the like can be used. Use of such an organic film is preferable because the same film formation apparatus can be used for formation of the EL film 120Bb or the like.

[Formation of Resist Mask 143*a*]

Figure 8C:
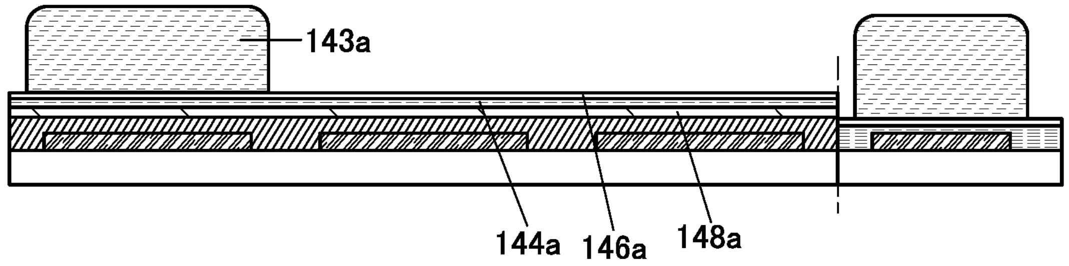

Then, resist masks 143*a* are formed at positions over the metal film or metal compound film 146*a*, which overlap the first electrode 101B and the connection electrode 101C (FIG. 8C).

For the resist mask 143*a*, a resist material containing a photosensitive resin such as a positive type resist material or a negative type resist material can be used.

On the assumption that the resist mask 143*a* is formed over the aluminum oxide film 144*a* without the metal film or metal compound film 146*a* therebetween, there is a risk of dissolving the EL film 120Bb due to a solvent of the resist material if a defect such as a pinhole exists in the aluminum oxide film 144*a*. Such a problem can be prevented by using the metal film or metal compound film 146*a*.

In the case where a film that is less likely to cause a defect such as a pinhole is used as the aluminum oxide film 144*a*, the resist mask 143*a* may be formed directly on the aluminum oxide film 144*a* without the metal film or metal compound film 146*a* therebetween.

[Etching of metal film or metal compound film 146*a*]

Next, part of the metal film or metal compound film 146*a* that is not covered with the resist masks 143*a* is removed by etching, so that a band-shaped or island-shaped metal layer or metal compound layer 147*a* is formed. At this time, the metal layer or metal compound layer 147*a* is formed also over the connection electrode 101C.

In the etching of the metal film or metal compound film 146*a*, an etching condition with high selectively is preferably employed so that the aluminum oxide film 144*a* is not removed by the etching. Either wet etching or dry etching can be performed for the etching of the metal film or metal compound film 146*a*. With use of dry etching, a reduction in a processing pattern of the metal film or metal compound film 146*a* can be inhibited.

[Removal of the Resist Mask 143*a*]

Figure 8D:
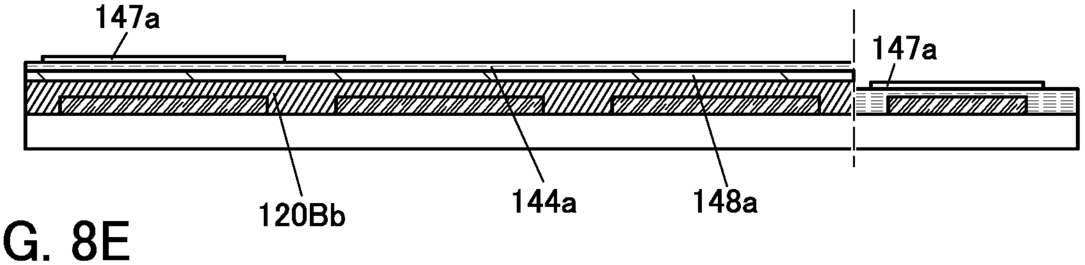

Then, the resist masks 143*a* are removed (FIG. 8D).

The removal of the resist masks 143*a* can be performed by wet etching or dry etching. It is particularly preferable to perform dry etching (also referred to as plasma ashing) using an oxygen gas as an etching gas to remove the resist masks 143*a*.

At this time, the removal of the resist masks 143*a* is performed in a state where the EL film 120Bb is covered with the aluminum oxide film 144*a*; thus, the EL film 120Bb is less likely to be affected by the removal. In particular, when the EL film 120Bb is exposed to oxygen, the electrical characteristics of the light-emitting device are adversely affected in some cases. Therefore, it is preferable that the EL film 120Bb be covered by the aluminum oxide film 144*a* when etching using an oxygen gas, such as plasma ashing, is performed.

[Etching of Aluminum Oxide Film 144*a*]

Figure 8E:
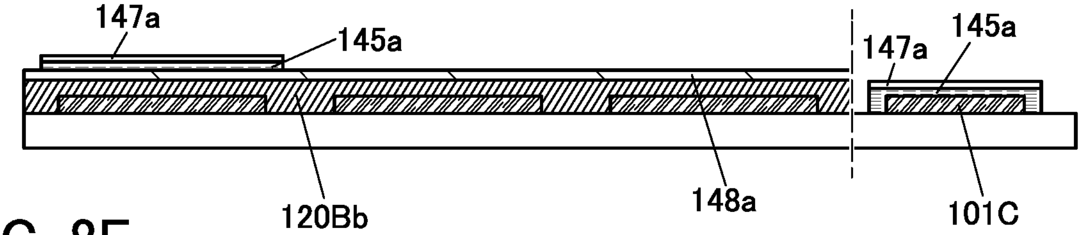

Next, part of the aluminum oxide film 144*a* that is not covered with the metal layer or metal compound layer 147*a* is removed by etching with use of the metal layer or metal compound layer 147*a* as a mask, so that a band-shaped aluminum oxide layer 145*a* is formed (FIG. 8E). At this time, the aluminum oxide layer 145*a* is formed also over the connection electrode 101C.

Either wet etching or dry etching can be performed for the etching of the aluminum oxide film 144*a*. With use of dry etching, a reduction in a processing pattern of the aluminum oxide film 144*a* can be inhibited.

[Etching of EL Film 120Bb and Metal Layer or Metal Compound Layer 147*a*]

Figure 8F:
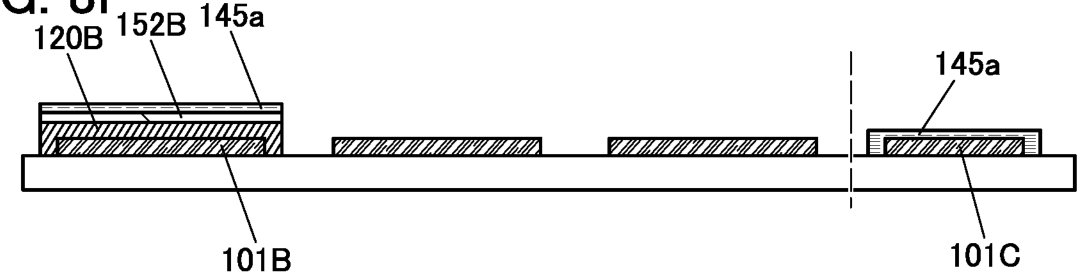

Next, at the same time as the metal layer or metal compound layer 147*a*, part of the buffer film 148*a* and part of the EL film 120Bb that are not covered with the aluminum oxide layer 145*a* are removed by etching, so that the buffer layer 152B and the first EL layer 120B each having a band shape are formed (FIG. 8F). At this time, the metal layer or metal compound layer 147*a* over the connection electrode 101C is also removed.

The buffer film 148*a*, the EL film 120Bb, and the metal layer or metal compound layer 147*a* are preferably etched by the same treatment so that the process can be simplified to reduce the manufacturing cost of the display apparatus.

For the etching of the EL film 120Bb, it is particularly preferable to perform dry etching using an etching gas that does not contain oxygen as its main component. This is because the alteration of the EL film 120Bb is inhibited, and a highly reliable display apparatus can be achieved. Examples of the etching gas that does not contain oxygen as its main component include $CF_4$, $C_4F_8$, $SF_6$, $CHF_3$, $Cl_2$, $H_2O$, $BCl_3$, or a rare gas such as $H_2$ or He. Alternatively, a mixed gas of the above gas and a dilute gas that does not contain oxygen can be used as the etching gas.

Note that the etching of the EL film 120Bb and the etching of the metal layer or metal compound layer 147*a* may be performed separately. In that case, either the etching of the EL film 120Bb or the etching of the metal layer or metal compound layer 147*a* may be performed first.

At this step, the first EL layer 120B and the connection electrode 101C are covered with the aluminum oxide layer 145*a*.

[Formation of First EL Layers 120G and 120R]

Figure 9A:
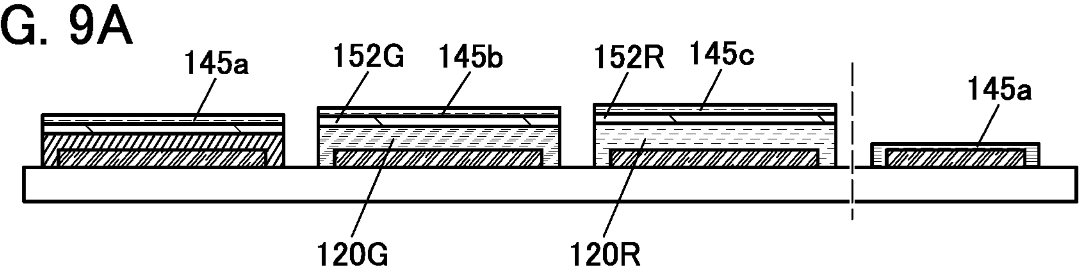
FIGS. 9A to 9F illustrate the method for manufacturing the organic EL device and the light-emitting apparatus.

By repeating the similar steps, the first EL layer 120G, the buffer layer 152G, the first EL layer 120R, the buffer layer 152R, and aluminum oxide layers 145*b* and 145*c* each having an island shape can be formed (FIG. 9A).

[Formation of Insulating Layer 126*b*]

Figure 9B:
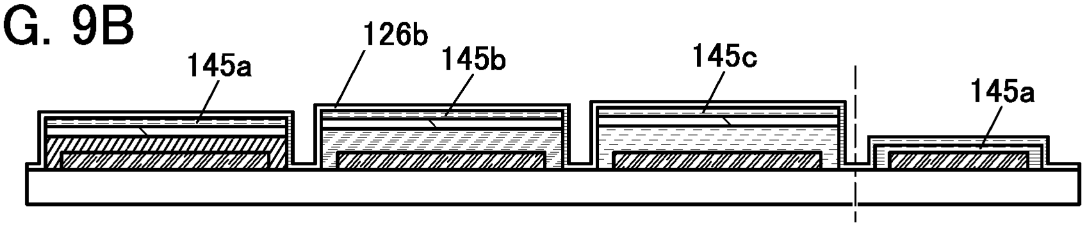

Next, an insulating layer 126*b* is formed over the aluminum oxide layers 145*a*, 145*b*, and 145*c* (FIG. 9B). The insulating layer 126*b* can be formed in a manner similar to that of the aluminum oxide layers 145*a*, 145*b*, and 145*c*.

[Formation of Insulating Layer 125*b*]

Figure 9C:
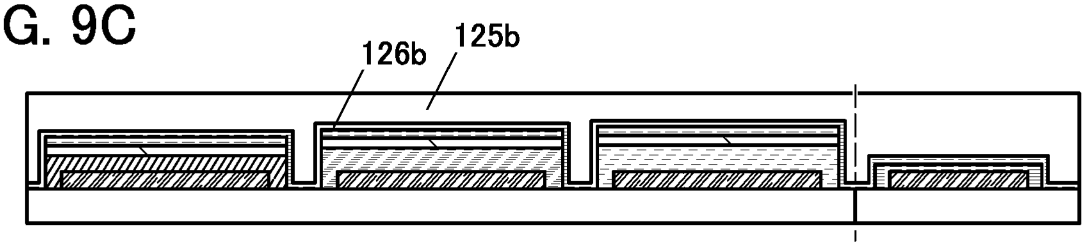

Then, an insulating layer 125*b* is formed to cover the insulating layer 126*b* (FIG. 9C). The insulating layer 125*b* may be formed using a photosensitive organic resin. Examples of the organic material include an acrylic resin, a polyimide resin, an epoxy resin, an imide resin, a polyamide resin, a polyimide-amide resin, a silicone resin, a siloxane resin, a benzocyclobutene-based resin, a phenol resin, and precursors of these resins. As an organic material used for the insulating layer 125*b*, polyvinyl alcohol (PVA), polyvinylbutyral, polyvinylpyrrolidone, polyethylene glycol, polyglycerin, pullulan, water-soluble cellulose, an alcohol-soluble polyamide resin, or the like can be used in some cases. As the photosensitive resin, a photoresist can be used in some cases. As the photosensitive resin, a positive photosensitive material or a negative photosensitive material can be used in some cases.

The insulating layer 125*b* is preferably subjected to heat treatment after application. The heat treatment is performed at a temperature lower than the upper temperature limit of the EL layer. The substrate temperature in the heat treatment is higher than or equal to 50° C. and lower than or equal to 200° C., preferably higher than or equal to 60° C. and lower than or equal to 150° C., and further preferably higher than or equal to 70° C. and lower than or equal to 120° C. Accordingly, a solvent contained in the insulating layer 125*b* can be removed.

Figure 9D:
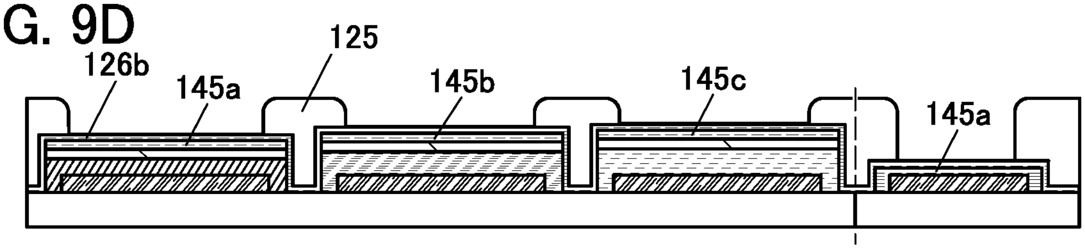

Next, opening portions are formed in regions of the insulating layer 125*b* overlapping with the first EL layers 120B, 120G, and 120R that are over the first electrodes 101B, 101G, and 101R, respectively, by performing light exposure and development, and the insulating layers 125 are formed (FIG. 9D). In the case where a positive acrylic resin is used for the insulating layer 125*b*, a region where the insulating layer 125*b* is removed is irradiated with visible light or ultraviolet rays using a mask.

In the case where visible light is used for exposure, the visible light preferably includes the i-line (wavelength: 365 nm). Furthermore, visible light including the g-line (wavelength: 436 nm), the h-line (wavelength: 405 nm), or the like may be used.

In the case where an acrylic resin is used for the insulating layer 125*b* in the development, an alkaline solution is preferably used as a developer, and for example, a tetramethyl ammonium hydroxide (TMAH) solution is used.

Then, light exposure is preferably performed on the entire substrate so that the insulating layer 125 is irradiated with visible light or ultraviolet rays. The energy density for the light exposure is greater than 0 $mJ/cm^2$ and less than or equal to 800 $mJ/cm^2$, preferably greater than 0 $mJ/cm^2$ and less than or equal to 500 $mJ/cm^2$. Performing such light exposure after the development can sometimes increase the degree of transparency of the insulating layer 125. In addition, it is sometimes possible to lower the substrate temperature required for subsequent heat treatment for changing the shape of end portions of the insulating layer 125 to a tapered shape.

Next, the heat treatment is performed to change the insulating layer 125*b* into the insulating layer 125 with a tapered side surface. The heat treatment is performed at a temperature lower than the upper temperature limit of the EL layer. The substrate temperature in the heat treatment is higher than or equal to 50° C. and lower than or equal to 200° C., preferably higher than or equal to 60° C. and lower than or equal to 150° C., further preferably higher than or equal to 70° C. and lower than or equal to 130° C. The substrate temperature in the heat treatment of this step is preferably higher than that in the heat treatment after the application of the insulating layer 125. Accordingly, corrosion resistance of the insulating layer 125 can be improved.

Figure 9E:
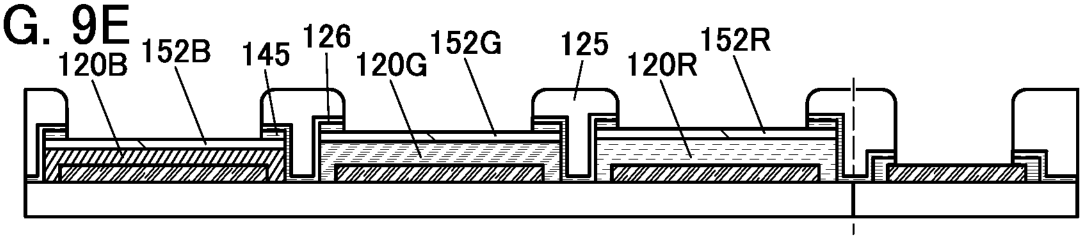

Next, parts of the insulating layer 126*b* exposed by forming opening portions in the insulating layer 125*b* and parts of the aluminum oxide layers 145*a*, 145*b*, and 145*c* that are not covered with the insulating layer 125*b* are removed at the same time by wet etching (FIG. 9E).

For example, wet etching using a tetramethyl ammonium hydroxide (TMAH) solution, diluted hydrofluoric acid, oxalic acid, phosphoric acid, acetic acid, nitric acid, or a mixed solution thereof is preferably performed.

Note that in the case where a material having high solubility in water for the buffer layers 152B, 152G, and 152R, after the insulating layer 126*b* and the aluminum oxide layers 145*a*, 145*b*, and 145*c* are oxidized and removed to some extent by the wet etching, parts of the remaining insulating layer 126*b* and the remaining aluminum oxide layers 145*a*, 145*b*, and 145*c* may be removed by processing with water or liquid using water as a solvent. Since there is no need to remove the aluminum oxide layers 145*a*, 145*b*, and 145*c* completely by the wet etching, the EL layer is hardly damaged in the step of removing the aluminum oxide layers 145*a*, 145*b*, and 145*c*.

Alternatively, the parts of the insulating layer 126*b* and the aluminum oxide layers 145*a*, 145*b*, and 145*c* are preferably removed by being dissolved in a solvent such as water or alcohol. Examples of the alcohol in which the aluminum oxide layers 145*a*, 145*b*, and 145*c* can be dissolved include ethyl alcohol, methyl alcohol, isopropyl alcohol (IPA), and glycerin.

Note that parts of the buffer layers 152B, 152G, and 152R may be removed at the same time as the parts of the insulating layer 126*b* and the aluminum oxide layers 145*a*, 145*b*, and 145*c* are removed.

The parts of the insulating layer 126*b* and the aluminum oxide layers 145*a*, 145*b*, and 145*c* which are covered with the insulating layer 125 may remain as the insulating layer 126 and the aluminum oxide layer 145 without being removed by etching.

After the parts of the insulating layer 126*b* and the aluminum oxide layers 145*a*, 145*b*, and 145*c* are removed, drying treatment is preferably performed in order to remove water contained in the buffer layers 152B, 152G, and 152R and the first EL layers 120B, 120G, and 120R and water adsorbed on the surfaces of the buffer layers 152B, 152G, and 152R and the EL layers 120R, 120G, and 120B. For example, heat treatment is preferably performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere because drying at a lower temperature is possible.

In the above manner, the first EL layers 120B, 120G, and 120R can be separately formed.

[Formation of Second EL Layer 121]

Then, the second EL layer 121 is formed to cover the buffer layers 152B, 152G, and 152R and the insulating layer 125.

The second EL layer 121 can be formed in a manner similar to that of the EL film 120Bb or the like. In the case where the second EL layer 121 is formed by an evaporation method, the second EL layer 121 is preferably formed using a shielding mask so as not to be formed over the connection electrode 101C.

[Formation of Second Electrode 102]

Figure 9F:
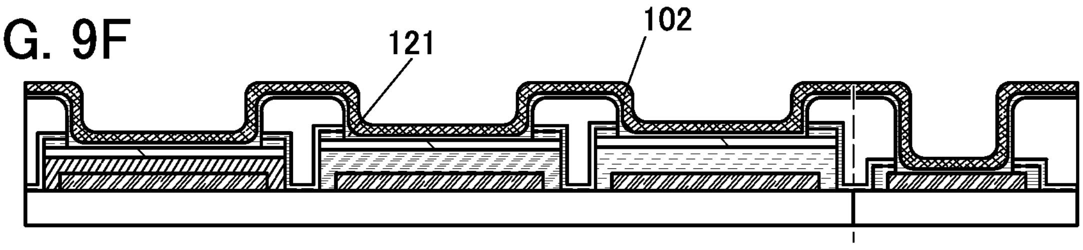

Next, the second electrode 102 is formed to cover the second EL layer 121 and the connection electrode 101C (FIG. 9F).

The second electrode 102 can be formed by a film formation method such as an evaporation method or a sputtering method. Alternatively, a film formed by an evaporation method and a film formed by a sputtering method may be stacked. In that case, the second electrode 102 is preferably formed so as to cover a region where an electron-injection layer 115 is formed. That is, a structure in which end portions of the electron-injection layer 115 overlap with the second electrode 102 can be obtained. The second electrode 102 is preferably formed using a shielding mask.

The second electrode 102 is electrically connected to the connection electrode 101C outside the display region.

[Formation of Barrier Layer]

Then, a barrier layer is formed over the second electrode 102. An inorganic insulating film used for the protective layer is preferably formed by a sputtering method, a PECVD method, or an ALD method. In particular, an ALD method is preferable because a film deposited by ALD has good step coverage and is less likely to cause a defect such as pinhole. An organic insulating film is preferably formed by an inkjet method because a uniform film can be formed in a desired area.

In the above manner, the light-emitting apparatus can be manufactured.

Although the second electrode 102 and the second EL layer 121 are formed so as to have different top surface shapes, they may be formed in the same region.

Note that the structure described in this embodiment can be used in combination with any of the structures described in other embodiments as appropriate.

Embodiment 4

In this embodiment, a structure of an organic EL device, which is an organic oxide semiconductor device including an EL layer as an organic semiconductor layer, is described with reference to FIG. 10. The organic EL device is an organic oxide semiconductor device that includes an EL layer including a light-emitting layer between the first electrode 101 and the second electrode 102.

Figure 10:
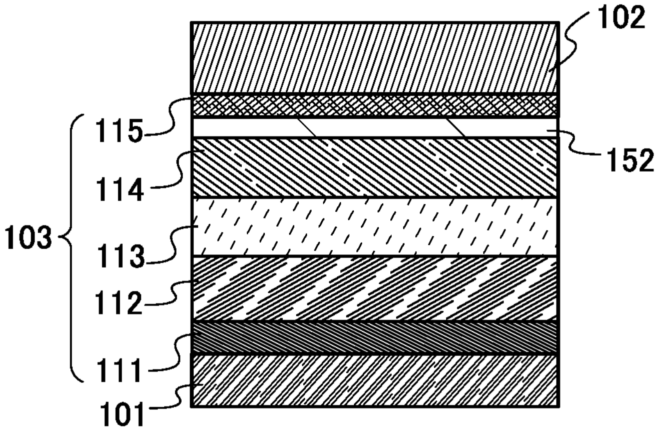
FIG. 10 illustrates an organic EL device.

Note that although the buffer layer 152 is positioned between an electron-transport layer 114 and the electron-injection layer 115 in FIG. 10, the present invention is not limited thereto and the buffer layer 152 may be positioned between the electron-injection layer 115 and the second electrode 102, for example. The buffer layer 152 can have the structure described in Embodiment 1.

One of the first electrode 101 and the second electrode 102 functions as an anode and the other functions as a cathode. A case where the first electrode 101 is an anode is illustrated as an example in FIG. 10.

The anode is preferably formed using any of metals, alloys, and conductive compounds with a high work function (specifically, higher than or equal to 4.0 eV), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, a film of indium oxide-zinc oxide is formed by a sputtering method using a target obtained by adding 1 wt % to 20 wt % of zinc oxide to indium oxide. Furthermore, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used for the anode. Graphene can also be used for the anode. Note that when a composite material described later is used for a layer that is in contact with the anode in the EL layer 103, an electrode material can be selected regardless of its work function.

Although the EL layer 103 preferably has a stacked-layer structure, there is no particular limitation on the stacked-layer structure, and various layers such as a hole-injection layer, a hole-transport layer, a light-emitting layer, an electron-transport layer, an electron-injection layer, a carrier-blocking layer (a hole-blocking layer and an electron-blocking layer), an exciton-blocking layer, and a charge-generation layer can be employed. Note that one or more of the above layers are not necessarily provided. This embodiment specifically describes below a structure including a hole-injection layer 111, a hole-transport layer 112, a light-emitting layer 113, the electron-transport layer 114, and the electron-injection layer 115, as illustrated in FIG. 10.

The hole-injection layer 111 contains a substance having an acceptor property. Either an organic compound or an inorganic compound can be used as the substance having an acceptor property.

As the substance having an acceptor property, it is possible to use a compound having an electron-withdrawing group (a halogen group or a cyano group); for example, 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylene-1,3,4,5,6,8,9,10-octafluoro-7H-pyren-2-ylidene)malononitrile can be used. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a halogen group or a cyano group such as a fluoro group) has a very high electron-accepting property and thus is preferable. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl) benzeneacetonitrile], and α,α',α"-1,2,3-cyclopropanetriylidenetris[2,3,4,5,6-pentafluorobenzeneacetonitrile]. As the substance having an acceptor property, molybdenum oxide, vanadium oxide, ruthenium oxide, tungsten oxide, manganese oxide, or the like can be used, other than the above-described organic compounds. Alternatively, the hole-injection layer 111 can be formed using a phthalocyanine-based complex compound such as phthalocyanine (abbreviation: $H_2Pc$) and copper phthalocyanine (abbreviation: CuPc), an aromatic amine compound such as 4,4'-bis[N-(4-diphenylaminophenyl)-N-phenylamino]biphenyl (abbreviation: DPAB) and NN-bis[4-bis(3-methylphenyl)aminophenyl]-NN-diphenyl-4,4'-diaminobiphenyl (abbreviation: DNTPD), or a high molecular compound such as poly(3,4-ethylenedioxythiophene)/poly(styrenesulfonic acid) (abbreviation: PEDOT/PSS). The substance having an acceptor property can extract electrons from an adjacent hole-transport layer (or hole-transport material) by application of an electric field.

Among substances having an acceptor property, the organic compound having an acceptor property is easy to use because it is easily deposited by vapor deposition.

Alternatively, a composite material in which a material having a hole-transport property contains any of the aforementioned substances having an acceptor property can be used for the hole-injection layer 111. By using a composite material in which a material having a hole-transport property contains an acceptor substance, a material used to form an electrode can be selected regardless of its work function. In other words, besides a material having a high work function, a material having a low work function can be used for the anode.

As the material having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the material having a hole-transport property used for the composite material preferably has a hole mobility of $1\times10^{-6}$ $cm^2/Vs$ or higher. Organic compounds that can be used as the material having a hole-transport property in the composite material are specifically given below.

Examples of the aromatic amine compounds that can be used for the composite material include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-bis(3-methylpheny)aminophenyl]-N,N'-diphenyl-4,4'-diaminophenyl (abbreviation: DNTPD), and 1,3,5-tris[N-(4-diphenylaminophenyl)-N-phenylamino]benzene (abbreviation: DPA3B). Specific examples of the carbazole derivative include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), and 1,4-bis[4-(N-carbazolyl)phenyl]-2,3,5,6-tetraphenylbenzene. Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylpheny)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthy)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'- bianthryl, anthracene, tetracene, rubrene, perylene, and 2,5,8,11-tetra(tert-butyl)perylene. Other examples include pentacene and coronene. The aromatic hydrocarbon may have a vinyl skeleton. Examples of the aromatic hydrocarbon including a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA). Note that the organic compound of one embodiment of the present invention can also be used.

Other examples include high molecular compounds such as poly(N-vinylcarbazole) (abbreviation: PVK), poly(4-vinyltriphenylamine) (abbreviation: PVTPA), poly[N-(4-{4-N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: poly-TPD).

The material having a hole-transport property used for the composite material further preferably has any of a carbazole skeleton, a dibenzofuran skeleton, a dibenzothiophene skeleton, and an anthracene skeleton. In particular, an aromatic amine including a substituent that includes a dibenzofuran ring or a dibenzothiophene ring, an aromatic monoamine that includes a naphthalene ring, or an aromatic monoamine in which a 9-fluorenyl group is bonded to nitrogen of amine through an arylene group may be used. Note that the organic compound including an N,N-bis(4-biphenyl)amino group is preferable because an organic EL device having a long lifetime can be manufactured. Specific examples of the organic compound include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNaNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis(biphenyl-4-yl)-9,9'-spirobi[9H-fluoren]-2-amine (abbreviation: BBASF), N,N-bis(biphenyl-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(1, P-biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

Note that it is further preferable that the material having a hole-transport property used for the composite material have a relatively deep highest occupied molecular orbital (HOMO) level higher than or equal to −5.7 eV and lower than or equal to −5.4 eV. Using the material with a hole-transport property which has a relatively deep HOMO level for the composite material makes it easy to inject holes into the hole-transport layer 112 and to obtain an organic EL device having a long lifetime. In addition, when the material having a hole-transport property that is used in the composite material has a relatively deep HOMO level, induction of holes can be inhibited properly so that the organic EL device can have a longer lifetime.

Note that mixing the above composite material with a fluoride of an alkali metal or an alkaline earth metal (the proportion of fluorine atoms in a layer using the mixed material is preferably higher than or equal to 20%) can lower the refractive index of the layer. This also enables a layer with a low refractive index to be formed in the EL layer 103, leading to higher external quantum efficiency of the organic EL device.

The formation of the hole-injection layer 111 can improve the hole-injection property, which allows the organic EL device to be driven at a low voltage.

The hole-transport layer 112 is formed using a material having a hole-transport property. The material having a hole-transport property preferably has a hole mobility higher than or equal to $1\times10^{-6}$ $cm^2/Vs$.

Examples of the material having a hole-transport property include compounds having an aromatic amine skeleton, such as 4,4'-bis[N-(1-naphthyl)-N-phenylamino]biphenyl (abbreviation: NPB), N,N-diphenyl-N,N-bis(3-methylphenyl)-4,4'-diaminobiphenyl (abbreviation: TPD), N,N-bis(9,9'-spirobi[9H-fluoren]-2-yl)-N,N-diphenyl-4,4'-diaminobiphenyl (abbreviation: BSPB), 4-phenyl-4'-(9-phenylfluoren-9-yl) triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl) triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), 9,9'-bis(biphenyl-4-yl)-3,3'-bi-9H-carbazole (abbreviation: BisBPCz), 9,9'-bis(1,1'-biphenyl-3-yl)-3,3'-bi-9H-carbazole (abbreviation: BismBPCz), and 9-(1,1'-biphenyl-3-yl)-9'-(1,1'-biphenyl-4-yl)-9H,9'H-3,3'-bicarbazole (abbreviation: mBPCCBP), 9-(2-naphthyl)-9'-phenyl-9H,9'H-3,3'-bicarbazole (abbreviation: βNCCP), 9-(3-biphenyl)-9'-(2-naphthyl)-3,3'-bi-9H-carbazole (abbreviation: βNCCmBP), 9-(4-biphenyl)-9'-(2-naphthyl)-3,3'-bi-9H-carbazole (abbreviation: βNCCBP), 9,9'-di-2-naphthyl-3,3'-9H,9'H-bicarbazole (abbreviation: BisβNCz), 9-(2-naphthyl)-9'-[1,1':4,1"-terphenyl]-3-yl-3,3'-9H,9'H-bicarbazole, 9-(2-naphthyl)-9'-[1,1':3',1"-terphenyl]-3-yl-3,3'-9H,9'H-bicarbazole, 9-(2-naphthyl)-9'-[1,1':3',1"-terphenyl]-5'-yl-3,3'-9H,9'H-bicarbazole, 9-(2-naphthyl)-9'-[1,1':4',1"-terphenyl]-4-yl-3,3'-9H,9'H-bicarbazole, 9-(2-naphthyl)-9'-[1,1':3',1"-terphenyl]-4-yl-3,3'-9H,9'H-bicarbazole, 9-(2-naphthyl)-9'-(triphenylen-2-yl)-3,3'-9H,9'H-bicarbazole, 9-phenyl-9'-(triphenylen-2-yl)-3,3'-9H,9'H-bicarbazole (abbreviation: PCCzTp), 9,9'-bis(triphenylen-2-yl)-3,3'-9H,9'H-bicarbazole, 9-(4-biphenyl)-9'-(triphenylen-2-yl)-3,3'-9H,9'H-bicarbazole, and 9-(triphenylen-2-yl)-9'-[1,1':3',1"-terphenyl]-4-yl-3,3'-9H,9'H-bicarbazole; compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. Note that any of the substances given as examples of the material having a hole-transport property used for the composite material for the hole-injection layer 111 can also be suitably used as the material contained in the hole-transport layer 112.

The light-emitting layer 113 preferably contains a light-emitting substance and a first organic compound. The second organic compound may be further contained. The light-emitting layer 113 may additionally contain other materials. Alternatively, the light-emitting layer 113 may be a stack of two layers with different compositions. The first organic compound preferably has an electron-transport property, and the second organic compound preferably has a hole-transport property.

The light-emitting substance may be any of fluorescent substances, phosphorescent substances, and substances exhibiting thermally activated delayed fluorescence (TADF).

Examples of the material that can be used as a fluorescent substance in the light-emitting layer 113 are as follows. Any other fluorescent substance can also be used.

The examples include 5,6-bis[4-(10-phenyl-9-anthryl) phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl) perylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N",N",N"',N"'-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N,'N'-tetrakis(4-methylpheny)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-diphenyl-N,N'-(1,6-pyrene-diyl)bis[(6-phenylbenzo[b]naphtho[1,2-d]furan)-8-amine] (abbreviation:1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b']bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, and high reliability.

Examples of the material that can be used when a phosphorescent substance is used as the light-emitting substance in the light-emitting layer 113 are as follows.

Examples include organometallic iridium complexes having a pyrimidine skeleton, such as (diisobutyrylmethanato)bis[4,6-bis(3-methylpheny)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and bis[4,6-di(naphthalen-1-yl)pyrimidinato](dipivaloylmethanato)iridium(III) (abbreviation: [Ir(d1npm)$_2$(dpm)]); organometallic iridium complexes having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), and (acetylacetonato)bis[2,3-bis(4-fluorophenyl)quinoxalinato]iridium(III) (abbreviation: [Ir(Fdpq)$_2$(acac)]); organometallic iridium complexes having a pyridine skeleton, such as tris(1-phenylisoquinolinato-N,C$^2$)iridium(III) (abbreviation: [Ir(piq)$_3$]), bis(1-phenylisoquinolinato-N,C$^{2'}$)iridium(III) acetylacetonate (abbreviation: [Ir(piq)$_2$(acac)]), (3,7-diethyl-4,6-nonanedionato-εO$^4$,εO$^6$)bis[2,4-dimethyl-6-[7-(1-methylethyl)-1-isoquinolinyl-εN]phenyl-εC]iridium(III), and (3,7-diethyl-4,6-nonanedionato-εO$^4$,εO$^6$)bis[2,4-dimethyl-6-[5-(1-methylethyl)-2-quinolinyl-εN]phenyl-εC]iridium(III); platinum complexes such as 2,3,7,8,12,13,17,18-octaethyl-21H,23H-porphyrinplatinum(II) (abbreviation: PtOEP); and rare earth metal complexes such as tris(1,3-diphenyl-1,3-propanedionato)(monophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]). These compounds have an emission peak in the wavelength range from 600 nm to 700 nm. Furthermore, the organometallic iridium complexes having a pyrazine skeleton can provide red light emission with favorable chromaticity. Note that other known red phosphorescent substances can also be used.

The examples include an organometallic iridium complex having a 4H-triazole skeleton, such as tris{2-[5-(2-methylphenyl)-4-(2,6-dimethylphenyl)-4H-1,2,4-triazol-3-yl-εN$^2$]phenyl-εC}iridium(III) (abbreviation: [Ir(mpptz-dmp)$_3$]) and tris(5-methyl-3,4-diphenyl-4H-1,2,4-triazolato)iridium(III) (abbreviation: [Ir(Mptz)$_3$]); an organometallic iridium complex having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); an organometallic iridium complex having an imidazole skeleton, such as fac-tris[1-(2,6-diisopropylphenyl)-2-phenyl-1H-imidazole]iridium(III) (abbreviation: [Ir(iPrpmi)$_3$]), tris[3-(2,6-dimethylphenyl)-7-methylimidazo[1,2-f]phenanthridinato]iridium(III) (abbreviation: [Ir(dmpimpt-Me)$_3$]), and tris(2-[1-{2,6-bis(1-methylethyl)phenyl}-1H-imidazol-2-yl-εN$^3$]-4-cyanophenyl-εC)iridium(III) (abbreviation: CNImIr); an organometallic complex having a banzimizazolidene skeleton, such as tris[(6-tert-butyl-3-phenyl-2H-imidazo[4,5-b]pyrazin-1-yl-εC$^2$)phenyl-εC] iridium(III) (abbreviation: [Ir(cb)$_3$]); and an organometallic iridium complex in which a phenylpyridine derivative including an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$} iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)). These compounds exhibit blue phosphorescence and have an emission peak in the wavelength range from 440 nm to 520 nm.

Other examples include an organometallic iridium complex having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), or (acetylacetonato)bis(4,6-diphenylpyrimidinato)iridium(III) (abbreviation: [Ir(dppm)$_2$(acac)]); an organometallic iridium complex having a pyrazine skeleton, such as (acetylacetonato)bis(3,5-dimethyl-2-phenylpyrazinato)iridium(III) (abbreviation: [Ir(mppr-Me)$_2$(acac)]) or (acetylacetonato)bis(5-isopropyl-3-methyl-2-phenylpyrazinato)iridium(III) (abbreviation: [Ir(mppr-iPr)$_2$(acac)]); an organometallic iridium complex having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), bis(2-phenylquinolinato-N,C$^{2'}$)iridium(III) acetylacetonate (abbreviation: [Ir(pq)$_2$(acac)]), [2-d3-methyl-8-(2-pyridinyl-εN)benzofuro[2,3-b]pyridine-εC]bis[2-(5-d3-methyl-2-pyridinyl-εN2)phenyl-εC]iridium(III) (abbreviation: [Ir(5mppy-d3)$_2$(mbfpypy-d3)]), [2-(methyl-d3)-8-[4-(1-methylethyl-1-d)-2-pyridinyl-εN]benzofuro[2,3-b]pyridin-7-yl-εC]bis[5-(methyl-d3)-2-[5(methyl-d3)-2-pyridinyl-εN]phenyl-εC]iridium(III) (abbreviation: Ir(5mtpy-d6)$_2$(mbfpypy-iPr-d4)), [2-d3-methyl-(2-pyridinyl-εN)benzofuro[2,3-b]pyridine-εC]bis[2-(2-pyridinyl-εN)phenyl-εC]iridium(III) (abbreviation: [Ir(ppy)$_2$(mbfpypy-d3)]), [2-(4-d3-methyl-5-phenyl-2-pyridinyl-εN$^2$)phenyl-εC]bis[2-(5-d3-methyl-2-pyridinyl-εN$^2$)phenyl-εC]iridium(III) (abbreviation: [Ir(5mppy-d3)$_2$(mdppy-d3)]), [2-methyl-(2-pyridinyl-εN)benzofuro[2,3-b]pyridine-εC]bis[2-(2-pyridinyl-εN)phenyl-εC]iridium(III) (abbreviation: [Ir(ppy)$_2$(mbfpypy)]), and [2-(4-methyl-5-phenyl-2-pyridinyl-εN)phenyl-εC]bis[2-(2-pyridinyl-εN)phenyl-εC]iridium(III) (abbreviation: Ir(ppy)$_2$(mdppy)); and a rare earth metal complex such as tris(acetylacetonato)(monophenanthroline)terbium(III) (abbreviation: [Tb(acac)$_3$(Phen)]). These are mainly compounds that exhibit green phosphorescence and have an emission peak in the wavelength range from 500 nm to 600 nm. Note that organometallic iridium complexes having a pyrimidine skeleton have distinctively high reliability and emission efficiency and thus are particularly preferable.

Examples of the TADF material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2OEP$), which are represented by the following structural formulae.

[Chemical Formula 1]

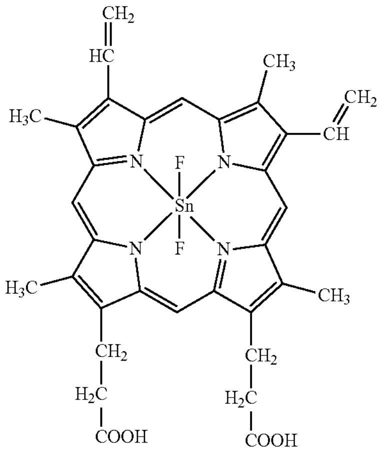

$SnF_2$(Proto IX)

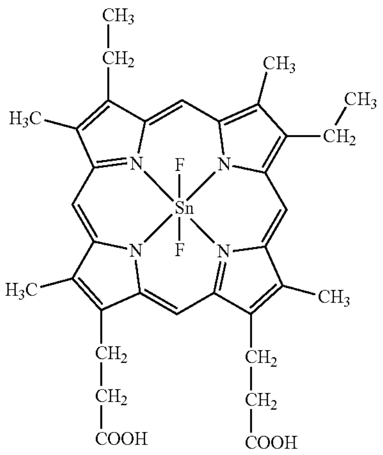

$SnF_2$(Meso IX)

-continued

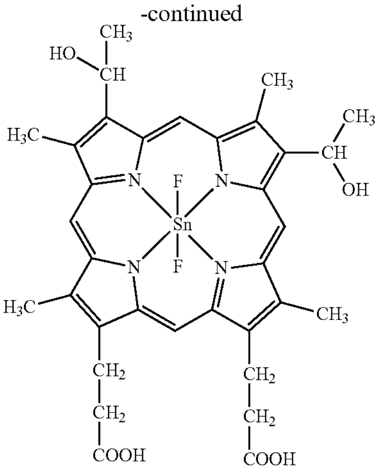

$SnF_2$(Hemato IX)

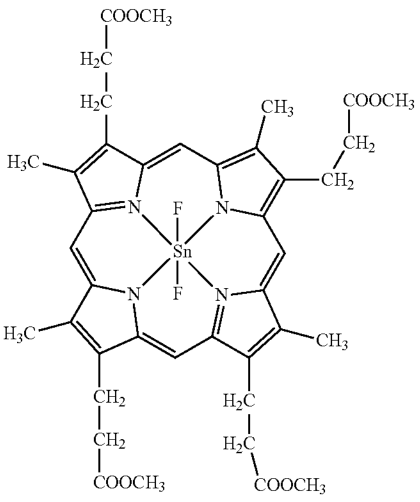

$SnF_2$(Copro III-4Me)

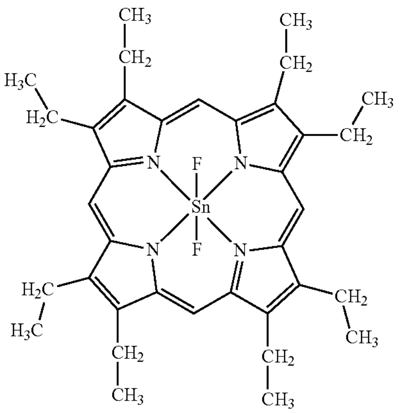

$SnF_2$(OEP)

-continued

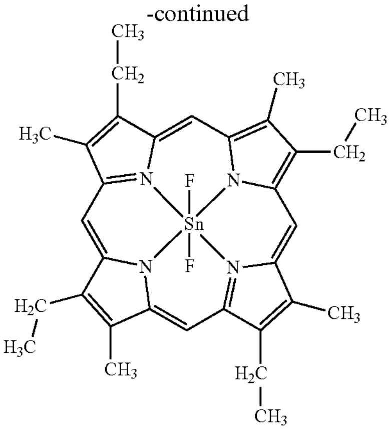

$SnF_2$(Etio I)

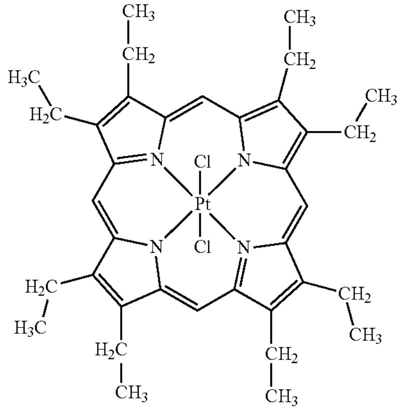

$PtCl_2OEP$

It is also possible to use a heterocyclic compound including one or both of a π-electron rich heteroaromatic ring and a π-electron deficient heteroaromatic ring that is represented by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 9-[4-(4,6-diphenyl-1,3,5-triazin-2-yl)phenyl]-9'-phenyl-3,3'-bi-9H-carbazole (abbreviation: PCCzPTzn), 2-[4-(10H-phenoxazin-10-yl)phenyl]-4,6-diphenyl-1,3,5-triazine (abbreviation: PXZ-TRZ),3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA). Such a heterocyclic compound is preferable because of its excellent electron-transport and hole-transport properties owing to a π-electron rich heteroaromatic ring and a π-electron deficient heteroaromatic ring. Among skeletons including the π-electron deficient heteroaromatic ring, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high acceptor properties and high reliability. Among skeletons including the π-electron rich heteroaromatic ring, an acridine skeleton, a phenoxazine skeleton, a phenothiazine skeleton, a furan skeleton, a thiophene skeleton, and a pyrrole skeleton have high stability and reliability; thus, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring including a cyano group or a nitrile group such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 2]

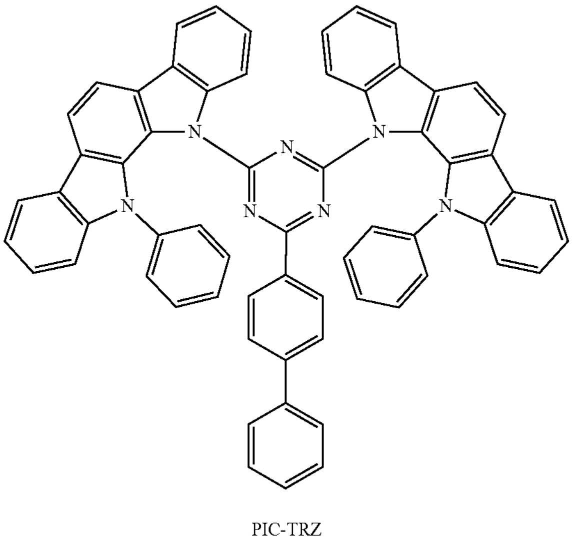

PIC-TRZ

-continued

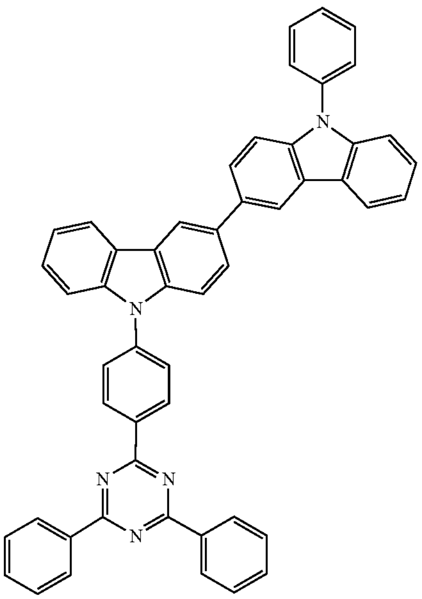

PCCzPTzn

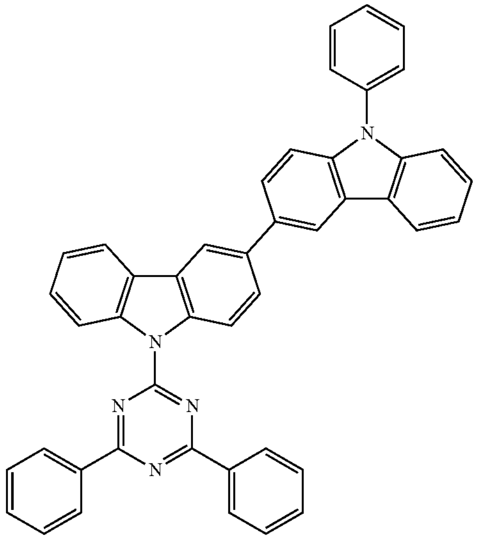

PCCzTzn

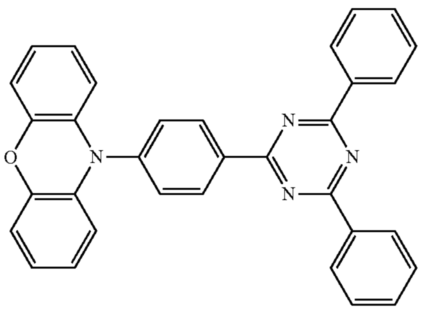

PXZ-TRZ

-continued

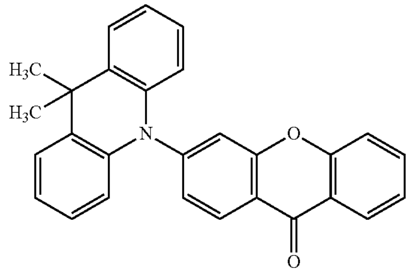

ACRXTN

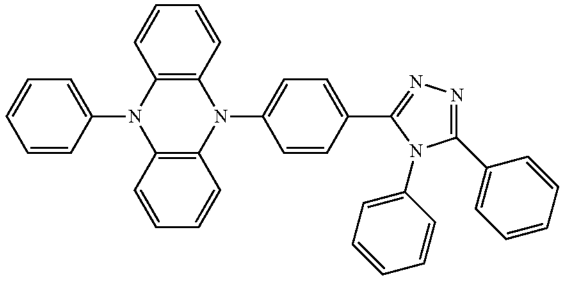

PPZ-3TPT

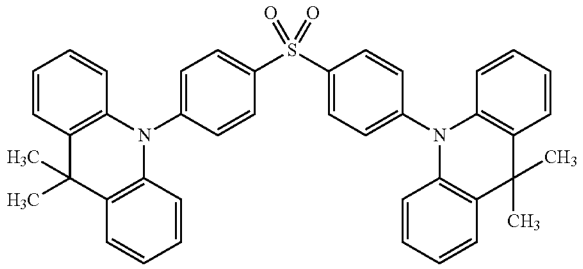

DMAC-DPS

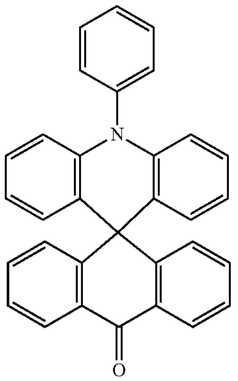

ACRSA

It is also possible to use a TADF material that enables reversible intersystem crossing at extremely high speed and emits light in accordance with a thermal equilibrium model between a singlet-excited state and a triplet-excited state. Since such a TADF material has an extremely short emission lifetime (excitation lifetime), an efficiency decrease of an organic EL device in a high-luminance region can be inhibited.

Specifically, a material having the following molecular structure can be used.

[Chemical Formula 3]

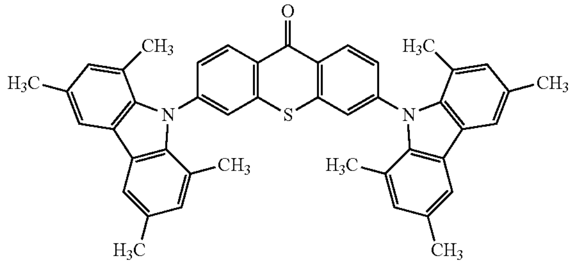

Note that a TADF material is a material having a small difference between the S1 level and the T1 level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet-excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the S1 level of the host material is preferably higher than that of the TADF material. In addition, the T1 level of the host material is preferably higher than that of the TADF material.

As the electron-transport material used as the host material, for example, metal complexes such as bis(10-hydroxybenzo[h]quinolinato)beryllium(II) (abbreviation: $BeBq_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc (II) (abbreviation: ZnPBO), and bis[2-(2-benzothiazolyl) phenolato]zinc(II) (abbreviation: ZnBTZ); or an organic compound including a π-electron deficient heteroaromatic ring can be given. Examples of the organic compound including a π-electron deficient heteroaromatic ring include organic compounds including a heteroaromatic ring having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); organic compounds including a heteroaromatic ring having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl] dibenzo[f,h]quinoxaline (abbreviation: 2mCzBPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 2,4-bis[4-(1-naphthyl)phenyl]-6-[4-(3-pyridyl)phenyl]pyrimidine (abbreviation: 2,4NP-6PyPPm), 6-(1,1'-biphenyl-3-yl)-4-[3,5-bis(9H-carbazol-9-yl)phenyl]-2-phenylpyrimidine (abbreviation: 6mBP-4Cz2PPm), 4-[3,5-bis(9H-carbazol-9-yl) phenyl]-2-phenyl-6-(1,1'-biphenyl-4-yl)pyrimidine (abbreviation: 6BP-4Cz2PPm), and 7-[4-(9-phenyl-9H-carbazol-2-yl)quinazolin-2-yl]-7H-dibenzo[c,g]carbazole (abbreviation: PC-cgDBCzQz), 11-[(3'-dibenzothiophen-4-yl)biphenyl-3-yl] phenanthro[9',10':4,5]furo[2,3-b]pyrazine (abbreviation: 11mDBtBPPnfpr), 11-[(3'-dibenzothiophen-4-yl)biphenyl-4-yl]phenanthro[9',10':4.5]furo[2,3-b]pyrazine, 11-[3'-(9H-carbazol-9-yl)biphenyl-3-yl]phenanthro[9',10':4,5]furo[2,3-b]pyrazine, 12-(9'-phenyl-3,3'-bi-9H-carbazol-9-yl) phenanthro[9',10':4,5]furo[2,3-b]pyrazine (abbreviation: 12PCCzPnfpr), 9-[(3'-9-phenyl-9H-carbazol-3-yl)biphenyl-4-yl]naphtho[1',2':4,5]furo[2,3-b]pyrazine (abbreviation: 9pmPCBPNfpr), 9-(9'-phenyl-3,3'-bi-9H-carbazol-9-yl) naphtho[1',2':4,5]furo[2,3-b]pyrazine (abbreviation: 9PCCzNfpr), 10-(9'-phenyl-3,3'-bi-9H-carbazol-9-yl)naphtho[1',2':4,5]furo[2,3-b]pyrazine (abbreviation: 10PCCzNfpr), 9-[3'-(6-phenylbenzo[b]naphtho[1,2-d] furan-8-yl)biphenyl-3-yl]naphtho[1',2':4,5]furo[2,3-b]pyrazine (abbreviation: 9mBnfBPNfpr), 9-{3-[6-(9,9-dimethylfluoren-2-yl)dibenzothiophen-4-yl]phenyl}naphtho[1',2':4,5]furo[2,3-b]pyrazine (abbreviation: 9mFDBtPNfpr), 9-[3'-(6-phenyldibenzothiophen-4-yl)biphenyl-3-yl]naphtho[1',2':4,5]furo[2,3-b]pyrazine (abbreviation: 9mDBtBPNfpr-02), 9-[3-(9'-phenyl-3,3'-bi-9H-carbazol-9-yl)phenyl] naphtho[1',2':4,5]furo[2,3-b]pyrazine (abbreviation: 9mPCCzPNfpr), 9-[3'-(2,8-diphenyldibenzothiophen-4-yl) biphenyl-3-yl]naphtho[1',2':4,5]furo[2,3-b]pyrazine, 11-[3'-(2,8-diphenyldibenzothiophen-4-yl)biphenyl-3-yl] phenanthro[9',10''4,5]furo[2,3-b]pyrazine; organic compounds including a heteroaromatic ring having a pyridine skeleton, such as 3,5-bis[3-(9H-carbazol-9-yl)phenyl] pyridine (abbreviation: 35DCzPPy) and 1,3,5-tri[3-(3-pyridyl)phenyl]benzene (abbreviation: TmPyPB); and organic compounds including a heteroaromatic ring having a triazine skeleton, such as 2-[3'-(9,9-dimethyl-9H-fluoren-2-yl)-1,1'-biphenyl-3-yl]-4,6-diphenyl-1,3,5-triazine (abbreviation: mFBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl) phenyl]phenyl}-4,6-diphenyl-1,3,5-triazine (abbreviation: mBnfBPTzn), 2-{3-[3-(benzo[b]naphtho[1,2-d]furan-6-yl) phenyl]phenyl}-4,6-diphenyl-1,3,5-triazine (abbreviation: mBnfBPTzn-02), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-[3'-(triphenylen-2-yl)-1, P-biphenyl-3-yl]-4,6-diphenyl-1,3,5-triazine (abbreviation: mTpBPTzn), 3-[9-(4,6-diphenyl-1,3,5-triazin-2-yl)-2-dibenzofuranyl]-9-phenyl-9H-carbazole (abbreviation: PCDBfTzn), and 2-[1,1'-biphenyl]-3-yl-4-phenyl-6-(8-[1,1':4',1''-terphenyl]-4-yl-1-dibenzofuranyl)-1,3,5-triazine (abbreviation: mBP-TPDBfTzn). Among the above materials, the organic compound including a heteroaromatic ring having a diazine skeleton, the organic compound including a heteroaromatic ring having a pyridine skeleton, and the organic compound including a heteroaromatic ring having a triazine skeleton have high reliability and thus are preferable. In particular, the organic compound including a heteroaromatic ring having a diazine (pyrimidine or pyrazine) skeleton and the organic compound including a heteroaromatic ring having a triazine skeleton have a high electron-transport property to contribute to a reduction in driving voltage.

As the hole-transport material used as the host material, an organic compound having an amine skeleton or a π-electron rich heteroaromatic ring can be used. Examples of the organic compound having an amine skeleton or a π-electron rich heteroaromatic ring are a compound having an aromatic amine skeleton, such as 4,4'-bis[N-(1-naphthyl)-N-phenylamino]biphenyl (abbreviation: NPB), N,N'-diphenyl-N,N'-bis(3-methylphenyl)-4,4'-diaminobiphenyl (abbreviation: TPD), N,N'-bis(9,9'-spirobi[9H-fluoren]-2-yl)-N,N'-diphenyl-4,4'-diaminobiphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]-9,9'-spirobi[9H-fluoren]-2-amine (abbreviation: PCBASF); a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), N-[4-(9-phenyl-9H-carbazol-3-yl)phenyl]-bis(9,9-dimethyl-9H-fluoren-2-yl)amine (abbreviation: PCBFF), N-(1,1'-biphenyl-4-yl)-N-[4-(9-phenyl-9H-carbazol-3-yl)phenyl]-9,9-dimethyl-9H-fluoren-4-amine, N-[4-(9-phenyl-9H-carbazol-3-yl)phenyl]-(9,9-dimethyl-9H-fluoren-2-yl)-9,9-dimethyl-9H-fluoren-4-amine, N-(1,1'-biphenyl-4-yl)-N-[4-(9-phenyl-9H-carbazol-3-yl)phenyl]-9,9-diohenyl-9H-fluoren-2-amine, N-(1,1'-biphenyl-4-yl)-N-[4-(9-phenyl-9H-carbazol-3-yl)phenyl]-9,9-diohenyl-9H-fluoren-4-amine, N-(1,1'-biphenyl-4-yl)-N-[4-(9-phenyl-9H-carbazol-3-yl)phenyl]-9,9'-spirobi[9H-fluoren]-4-amine (abbreviation: PCBBiSF), N-(1,1'-biphenyl-4-yl)-N-[4-(9-phenyl-9H-carbazol-3-yl)phenyl]-9,9'-spirobi(9H-fluoren)-4-amine, N-[4-(9-phenyl-9H-carbazol-3-yl)phenyl]-N-(1,1':3',1"-terphenyl-4-yl)-9,9-dimethyl-9H-fluoren-2-amine, N-[4-(9-phenyl-9H-carbazol-3-yl)phenyl]-N-(1,1':4',1"-terphenyl-4-yl)-9,9-dimethyl-9H-fluoren-2-amine, N-[4-(9-phenyl-9H-carbazol-3-yl)phenyl]-N-(1,1':3',1"-terphenyl-4-yl)-9,9-dimethyl-9H-fluoren-4-amine, or N-[4-(9-phenyl-9H-carbazol-3-yl)phenyl]-N-(1,1':4',1"-terphenyl-4-yl)-9,9-dimethyl-9H-fluoren-4-amine; a compound having a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton, such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, the compound having an aromatic amine skeleton or the compound having a carbazole skeleton is preferable because these compounds are highly reliable and have high hole-transport properties to contribute to a reduction in driving voltage. In addition, the organic compounds given as examples of the material having a hole-transport property that can be used for the hole-transport layer 112 can also be used as the hole-transport material that is the host material.

By mixing the electron-transport material with the hole-transport material, the-transport property of the light-emitting layer 113 can be easily adjusted and a recombination region can be easily controlled. The TADF material can be used as the electron-transport material or the hole-transport material.

As the TADF material that can be used as the host material, the above materials mentioned as the TADF material can also be used. When the TADF material is used as the host material, triplet excitation energy generated in the TADF material is converted into singlet excitation energy by reverse intersystem crossing and transferred to the light-emitting substance, whereby the emission efficiency of the organic EL device can be increased. Here, the TADF material functions as an energy donor, and the light-emitting substance functions as an energy acceptor.

This is very effective in the case where the light-emitting substance is a fluorescent substance. In that case, the S1 level of the TADF material is preferably higher than that of the fluorescent substance in order that high emission efficiency can be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably includes a protective group around a luminophore (a skeleton which causes light emission) of the fluorescent substance. As the protective group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituents having no π bond are poor in carrier transport performance, whereby the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance including any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

In the case where a fluorescent substance is used as the light-emitting substance, a material having an anthracene skeleton is suitably used as the host material. The use of a substance having an anthracene skeleton as the host material for the fluorescent substance makes it possible to obtain a light-emitting layer with high emission efficiency and high durability. Among the substances having an anthracene skeleton, a substance having a diphenylanthracene skeleton, in particular, a substance having a 9,10-diphenylanthracene skeleton, is chemically stable and thus is preferably used as the host material. The host material preferably has a carbazole skeleton because the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzofluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9-(1-naphthyl)-10-[4-(2-naphthyl)phenyl]anthracene (abbreviation: αN-βNPAnth), 9-(1-naphthyl)-10-(2-naphthyl)anthracene (abbreviation: α,β-ADN), 2-(10-phenylanthracen-9-yl) dibenzofuran, 2-(10-phenyl-9-anthracenyl)-benzo[b]naphtho[2,3-d]furan (abbreviation: Bnf(II)PhA), 9-(2-naphthyl)-10-[3-(2-naphthyl)phenyl]anthracene (abbreviation: βN-mβNPAnth), 1-[4-(10-[1,1'-biphenyl]-4-yl-9-anthracenyl)phenyl]-2-ethyl-1H-benzimidazole (abbreviation: EtBImPBPhA), 2,9-di(1-naphthyl)-10-phenylanthracene (abbreviation: 2αN-αNPhA), 9-(1-naphthyl)-10-[3-(1-naphthyl)phenyl]anthracene (abbreviation: αN-mαNPAnth), 9-(2-naphthyl)-10-[3-(1-naphthyl)phenyl] anthracene (abbreviation: βN-mαNPAnth, 9-(1-naphthyl)-10-[4-(1-naphthyl)phenyl]anthracene (abbreviation: αN-αNPAnth), 9-(2-naphthyl)-10-[4-(2-naphthyl)phenyl] anthracene (abbreviation: βN-βNPAnth), and 2-(1-naphthyl)-9-(2-naphthyl)-10-phenylanthracene (abbreviation: 2αN-βNPhA). In particular, CzPA, cgDBCzPA, 2mBnfPPA, and PCzPA have excellent characteristics and thus are preferably selected.

Note that a phosphorescent substance can be used as part of the mixed material. When a fluorescent substance is used as the light-emitting substance, a phosphorescent substance can be used as an energy donor for supplying excitation energy to the fluorescent substance.

An exciplex may be formed of the mixed materials. These mixed materials are preferably selected so as to form an exciplex that exhibits light emission whose wavelength overlaps with the wavelength on a lowest-energy-side absorption band of the light-emitting substance, in which case energy can be transferred smoothly and light emission can be obtained efficiently. The use of such a structure is preferable because the driving voltage can also be reduced.

Note that at least one of the materials forming an exciplex may be a phosphorescent substance. In this case, triplet excitation energy can be efficiently converted into singlet excitation energy by reverse intersystem crossing.

Combination of a material having an electron-transport property and a material having a hole-transport property whose HOMO level is higher than or equal to that of the material having an electron-transport property is preferable for forming an exciplex efficiently. In addition, the Lowest Unoccupied Molecular Orbital (LUMO) level of the material having a hole-transport property is preferably higher than or equal to that of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of the mixed film in which the material having a hole-transport property and the material having an electron-transport property are mixed is shifted to the longer wavelength side than the emission spectra of each of the materials (or has another peak on the longer wavelength side) observed by comparison of the emission spectra of the material having a hole-transport property, the material having an electron-transport property, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of transient PL of the material having a hole-transport property, the material having an electron-transport property, and the mixed film of these materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of these materials.

In the case where a hole-blocking layer is provided, the hole-blocking layer is in contact with the light-emitting layer 113, and is formed to contain an organic compound having an electron-transport property and being capable of blocking holes. As the organic compound in the hole-blocking layer, a material having a high electron-transport property, a low hole-transport property, and a deep HOMO level is suitably used. Specifically, it is preferable to use a substance having a deeper HOMO level than the material contained in the light-emitting layer 113 by 0.5 eV or more and having an electron mobility higher than or equal to $1\times10^{-6}$ $cm^2/Vs$ when the square root of the electric field strength [V/cm] is 600.

In particular, 2-{3-[3-(N-phenyl-9H-carbazol-3-yl)-9H-carbazol-9-yl]phenyl}dibenzo[f,h]quinoxaline (abbreviation: 2mPCCzPDBq), 2-{3-[2-(N-phenyl-9H-carbazol-3-yl)-9H-carbazol-9-yl]phenyl}dibenzo[f,h]quinoxaline (abbreviation: 2mPCCzPDBq-02), 2-{3-[3-(N-phenyl-9H-carbazol-2-yl)-9H-carbazol-9-yl]phenyl}dibenzo[f,h]quinoxaline (abbreviation: 2mPCCzPDBq-03), 2-{3-[3-(N-(3,5-di-tert-butylphenyl-9H-carbazol-3-yl)-9H-carbazol-9-yl]phenyl}dibenzo[f,h]quinoxaline, 9-[3-(4,6-diphenyl-1,3,5-triazin-2-yl)phenyl]-9'-phenyl-3,3'-bi-9H-carbazole (abbreviation: mPCCzPTzn), 9-[3-(4,6-diphenyl-1,3,5-triazin-2-yl)phenyl]-9'-phenyl-2,3'-bi-9H-carbazole (abbreviation: mPCCzPTzn-02), 9-[4-(4,6-diphenyl-1,3,5-triazin-2-yl)phenyl]-9'-phenyl-3,3'-bi-9H-carbazole (abbreviation: PCCzPTzn), 9-(4,6-diphenyl-1,3,5-triazin-2-yl)-9'-phenyl-3,3'-bi-9H-carbazole (abbreviation: PCCzTzn(CzT)), 9-[3-(4,6-diphenyl-pyrimidin-2-yl)phenyl]-9'-phenyl-3,3'-bi-9H-carbazole (abbreviation: 2PCCzPPm), 9-(4,6-diphenyl-pyrimidin-2-yl)-9'-phenyl-3,3'-bi-9H-carbazole (abbreviation: 2PCCzPm), 4-[2-(N-phenyl-9H-carbazol-3-yl)-9H-carbazol-9-yl]benzofuro[3,2-d]pyrimidine (abbreviation: 4PCCzBfpm-02), 4-{3-[3-(N-phenyl-9H-carbazol-3-yl)-9H-carbazol-9-yl]phenyl}benzo[h]quinazoline, and 9-[3-(2,6-diphenyl-pyridin-4-yl)phenyl]-9'-phenyl-3,3'-bi-9H-carbazole are preferable because of their high heat resistance.

In the case of using any one of the other materials for the hole-blocking layer, an organic compound having a deeper HOMO level than the material contained in the light-emitting layer 113 can be selected from materials that can be used for a hole-transport layer, which will be described later.

For the electron-transport layer 114, it is preferable to use a substance with an electron mobility higher than or equal to $1\times10^{-6}$ $cm^2/Vs$ when the square root of the electric field strength [V/cm] is 600. Note that any other substance can also be used as long as the substance has an electron-transport property higher than a hole-transport property. An organic compound including a π-electron deficient heteroaromatic ring is preferable as the above organic compound. The organic compound including a π-electron deficient heteroaromatic ring is preferably one or more of an organic compound including a heteroaromatic ring having a polyazole skeleton, an organic compound including a heteroaromatic ring having a pyridine skeleton, an organic compound including a heteroaromatic ring having a diazine skeleton, and an organic compound including a heteroaromatic ring having a triazine skeleton.

Specific examples of the organic compound including a π-electron deficient heteroaromatic ring that can be used for the above electron-transport layer include an organic compound having an azole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), or 4,4'-bis(5-methylbenzoxazol yl)stilbene (abbreviation: BzOs); an organic compound including a heteroaromatic ring having a pyridine skeleton, such as 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), 3,5-bis[3-(9H-carbazol-9-yl)phenyl]pyridine (abbreviation: 35DCzPPy), bathophenanthroline (abbreviation: BPhen), bathocuproine (abbreviation: BCP), 2,9-di(naphthalen-2-yl)-4,7-diphenyl-1,10-phenanthroline (abbreviation: NBPhen), or 2,2'-(1,3-phenylene)bis(9-phenyl-1,10-phenanthroline) (abbreviation: mPPhen2P); an organic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDB q-II), 2-[3'-(9H-carbazol-9-yl)biphenyl-3-yl]dibenzo[f,h]quinoxaline (abbreviation: 2mCzBPDBq), 2-[3-(dibenzothiophen-4-yl)phenyl]dibenzo[f,h]quinoxaline (abbreviation: 2mDBTPDB q-II), 2-[3'-(dibenzothiophen-4-yl)biphenyl-3-yl]dibenzo[f,h]quinoxaline (abbreviation: 2mDBTBPDB q-II), 2-[3'-(9H-carbazol-9-yl)biphenyl-3-yl]dibenzo[f,h]quinoxaline (abbreviation: 2mCzBPDBq), 2-[4'-(9-phenyl-9H-carbazol-3-yl)-3,1'-biphenyl-1-yl]dibenzo[f,h]quinoxaline (abbreviation: 2mpPCBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDB q-II), 9-[(3'-dibenzothiophen-4-yl)biphenyl-3-yl]naphtho[1',2':4,5]furo[2,3-b]pyrazine (abbreviation: 9mDBtBPNfpr), 9-[(3'-dibenzothiophen-4-yl)biphenyl-4-yl]naphtho[1',2':4,5]furo[2,3-b]pyrazine (abbreviation: 9pmDBtBPNfpr), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 9,9'-[pyrimidine-4,6-diylbis(biphenyl-3,3'-diyl)]bis(9H-carbazole) (abbreviation: 4,6mCzBP2Pm), 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 8-[3'-(dibenzothiophen-4-yl)(1,1'-biphenyl-3-yl)]naphtho[1',2':4,5]furo[3,2-d]pyrimidine (abbreviation: 8mDBtBPNfpm), 8-[(2,2'-binaphthalen)-6-yl)]-4-[3-(dibenzothiophen-4-yl)phenyl]-[1]benzofuro[3,2-d]pyrimidine (abbreviation: 8(βN2)-4mDBtPBfpm), 2,2'-(pyridine-2,6-diyl)bis(4-phenylbenzo[h]quinazoline) (abbreviation: 2,6(P-Bqn)2Py), 2,2'-(pyridine-2,6-diyl)bis{4-[4-(2-naphthyl)phenyl]-6-phenylpyrimidine} (abbreviation: 2,6(NP-PPm)2Py), 6-(1,1'-biphenyl-3-yl)-4-[3,5-bis(9H-carbazol-9-yl)phenyl]-2-phenylpyrimidine (abbreviation: 6mBP-4Cz2PPm), 2,4-bis[4-(1-naphthyl)phenyl]-6-[4-(3-pyridyl)phenyl]pyrimidine (abbreviation: 2,4NP-6PyPPm), 4-[3,5-bis(9H-carbazol-9-yl)phenyl]-2-phenyl-6-(1,1'-biphenyl-4-yl)pyrimidine (abbreviation: 6BP-4Cz2PPm), or 7-[4-(9-phenyl-9H-carbazol-2-yl)quinazolin-2-yl]-7H-dibenzo[c,g]carbazol (abbreviation: PC-cgDBCzQz), 8-(1,1':4',1''-terphenyl-3-yl)-4-[3-(dibenzothiophen-4-yl)phenyl]-[1]benzofuro[3,2-d]pyrimidine (abbreviation: 8mpTP-4mDBtPBfpm), 4,8-bis[3-(dibenzofuran-4-yl)phenyl]-benzofuro[3,2-d]pyrimidine, 8-(1,1':4',1''-terphenyl-3-yl)-4-[3-(dibenzothiophen-4-yl)biphenyl-4-yl]-benzofuro[3,2-d]pyrimidine, 4,8-bis[3-(9H-carbazol-9-yl)phenyl]-benzofuro[3,2-d]pyrimidine (abbreviation: 4,8mCzP2Bfpm), 8-(1,1':4',1''-terphenyl-3-yl)-4-[3-(9-phenyl-9H-carbazol-3-yl)phenyl]-benzofuro[3,2-d]pyrimidine, 8-(1,1'-biphenyl-4-yl)-4-[3-(9-phenyl-9H-carbazol-3-yl)biphenyl-3-yl]-benzofuro[3,2-d]pyrimidine, 8-(1,1'-biphenyl- 4-yl)-4-{3-[2-(N-phenyl-9H-carbazol-3-yl)-9H-carbazol-9-yl]phenyl}benzofuro[3,2-d]pyrimidine, 8-phenyl-4-{3-[2-(N-phenyl-9H-carbazol-3-yl)-9H-carbazol-9-yl]phenyl}benzofuro[3,2-d]pyrimidine, or 8-(1,1'-biphenyl-4-yl)-4-(3,5-di-9H-carbazol-9-yl-phenyl)benzofuro[3,2-d]pyrimidine; and an organic compound having a triazine skeleton, such as 2-[3'-(9,9-dimethyl-9H-fluoren-2-yl)-1,1'-biphenyl-3-yl]-4,6-diphenyl-1,3,5-triazine (abbreviation: mFBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl)phenyl]phenyl}-4,6-diphenyl-1,3,5-triazine (abbreviation: mBnfBPTzn-02), 9-[4-(4,6-diphenyl-1,3,5-triazin-2-yl)phenyl]-9'-phenyl-3,3'-bi-9H-carbazole (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 2-[3'-(9,9-dimethyl-9H-fluoren-2-yl)-1,1'-biphenyl-3-yl]-4,6-diphenyl-1,3,5-triazine (abbreviation: mFBPTzn), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-{3-[3-(dibenzothiophen-4-yl)phenyl]phenyl}-4,6-diphenyl-1,3,5-triazine (abbreviation: mDBtBPTzn), 2,4,6-tris[3'-(pyridin-3-yl)biphenyl-3-yl]-1,3,5-triazine (abbreviation: TmPPPyTz), 2-[3-(2,6-dimethyl-3-pyridinyl)-5-(9-phenanthryl)phenyl]-4,6-diphenyl-1,3,5-triazine (abbreviation: mPn-mDMePyPTzn), 11-[4-(biphenyl-4-yl)-6-phenyl-1,3,5-triazin-2-yl]-11,12-dihydro-12-phenylindolo[2,3-a]carbazole (abbreviation: BP-Icz(II)Tzn), 2-[3'-(triphenylen-2-yl)-1,1'-biphenyl-3-yl]-4,6-diphenyl-1,3,5-triazine (abbreviation: mTpBPTzn), 3-[9-(4,6-diphenyl-1,3,5-triazin-2-yl)-2-dibenzofuranyl]-9-phenyl-9H-carbazole (abbreviation: PCDBfTzn), or 2-[1,1'-biphenyl]-3-yl-4-phenyl-6-(8-[1,1':4',1"-terphenyl]-4-yl-1-dibenzofuranyl)-1,3,5-triazine (abbreviation: mBP-TPDBfTzn). Among the above materials, the organic compound including a heteroaromatic ring having a diazine skeleton, the organic compound including a heteroaromatic ring having a pyridine skeleton, and the organic compound including a heteroaromatic ring having a triazine skeleton have high reliability and thus are preferable. In particular, the organic compound including a heteroaromatic ring having a diazine (pyrimidine and pyrazine) skeleton and the organic compound including a heteroaromatic ring having a triazine skeleton have a high electron-transport property to contribute to a reduction in driving voltage.

Note that the electron-transport layer 114 having this structure also serves as the electron-injection layer 115 in some cases.

A layer containing an alkali metal, an alkaline earth metal, a compound thereof, or a complex thereof such as lithium fluoride (LiF), cesium fluoride (CsF), calcium fluoride ($CaF_2$), or 8-quinolinolato-lithium (abbreviation: Liq) is preferably provided as the electron-injection layer 115 between the electron-transport layer 114 and the second electrode (cathode) 102. Alternatively, a film formed by co-evaporation of ytterbium (Yb) and lithium or a compound of lithium is preferably provided. As the electron-injection layer 115, an electride or a layer that is formed using a substance having an electron-transport property and that contains an alkali metal, an alkaline earth metal, or a compound thereof may be used. Examples of the electride include a substance in which electrons are added at high concentration to calcium oxide-aluminum oxide.

Note that as the electron-injection layer 115, it is possible to use a layer containing a substance that has an electron-transport property (preferably an organic compound having a bipyridine skeleton) and contains a fluoride of the alkali metal or the alkaline earth metal at a concentration higher than or equal to 50 wt %. Since the layer has a low refractive index, an organic EL device including the layer can have high external quantum efficiency.

For the cathode, a metal, an alloy, an electrically conductive compound, or a mixture thereof each having a low work function (specifically, lower than or equal to 3.8 eV) or the like can be used. Specific examples of such a cathode material include elements belonging to Group 1 or 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when the electron-injection layer is provided between the cathode and the electron-transport layer, a variety of conductive materials such as Al, Ag, ITO, or indium oxide-tin oxide containing silicon or silicon oxide can be used for the cathode regardless of the work function.

Films of these conductive materials can be formed by a dry process such as a vacuum evaporation method or a sputtering method, an ink-jet method, a spin coating method, or the like. Alternatively, a wet process using a sol-gel method or a wet process using a paste of a metal material may be employed.

Furthermore, any of a variety of methods can be used for forming the EL layer 103, regardless of a dry method or a wet method. For example, a vacuum evaporation method, a gravure printing method, an offset printing method, a screen printing method, an ink-jet method, a spin coating method, or the like may be used.

Different methods may be used to form the electrodes or the layers described above.

The structure of the layers provided between the anode and the cathode is not limited to the above-described structure. Preferably, a light-emitting region where holes and electrons recombine is positioned away from the anode and the cathode so as to inhibit quenching due to the proximity of the light-emitting region and a metal used for electrodes and carrier-injection layers.

Furthermore, in order that transfer of energy from an exciton generated in the light-emitting layer can be suppressed, preferably, the hole-transport layer and the electron-transport layer which are in contact with the light-emitting layer 113, particularly a carrier-transport layer closer to the recombination region in the light-emitting layer 113, are formed using a substance having a wider band gap than the light-emitting material of the light-emitting layer or the light-emitting material contained in the light-emitting layer.

Note that the structure described in this embodiment can be used in combination with any of the structures described in other embodiments as appropriate.

Embodiment 5

Figure 11A:
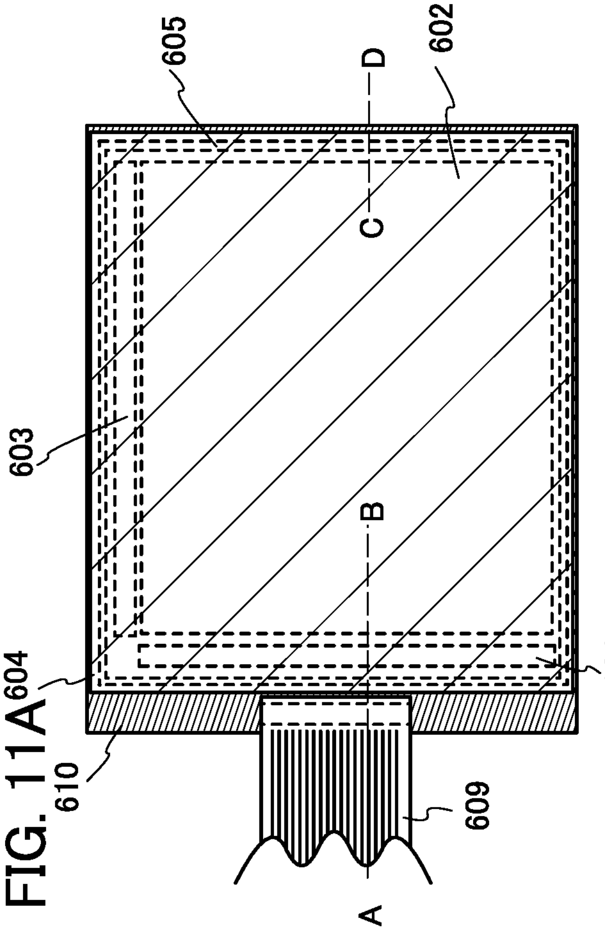
FIGS. 11A and 11B illustrate an active matrix light-emitting apparatus.
Figure 11B:
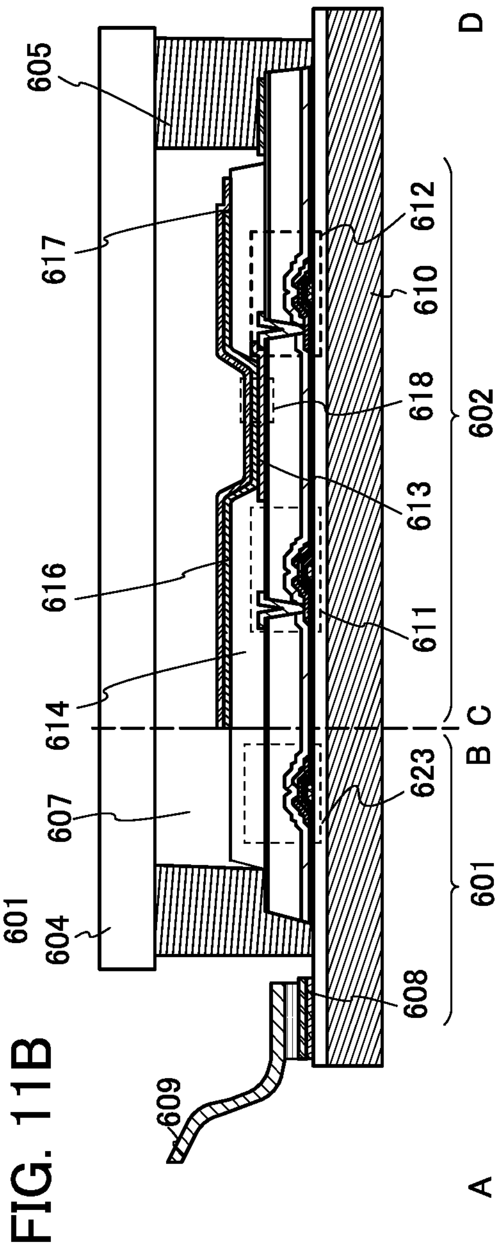

In this embodiment, a light-emitting apparatus that includes an organic EL device manufactured by the method for manufacturing the organic EL device described in Embodiments 2 and 3 is described with reference to FIGS. 11A and 11B. Note that FIG. 11A is a top view of the light-emitting apparatus and FIG. 11B is a cross-sectional view taken along the dashed-dotted lines A-B and C-D in FIG. 11A. This light-emitting apparatus includes a driver circuit portion (source line driver circuit) 601, a pixel portion 602, and a driver circuit portion (gate line driver circuit) 603, which are to control light emission of an organic EL device and illustrated with dotted lines. Reference numeral 604 denotes a sealing substrate; 605, a sealing material; and 607, a space surrounded by the sealing material 605.

Reference numeral 608 denotes a lead wiring for transmitting signals to be input to the source line driver circuit 601 and the gate line driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. The light-emitting apparatus in this specification includes, in its category, not only the light-emitting apparatus itself but also the light-emitting apparatus provided with the FPC or the PWB.

Next, a cross-sectional structure is described with reference to FIG. 11B. The driver circuit portions and the pixel portion are formed over an element substrate 610; here, the source line driver circuit 601, which is a driver circuit portion, and one pixel in the pixel portion 602 are illustrated.

The element substrate 610 may be a substrate containing glass, quartz, an organic resin, a metal, an alloy, a semiconductor, or the like or a plastic substrate formed of fiber reinforced plastic (FRP), poly(vinyl fluoride) (PVF), polyester, acrylic resin, or the like.

The structure of transistors used in pixels and driver circuits is not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used because deterioration of the transistor characteristics can be inhibited.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. When an oxide semiconductor having a wider band gap than silicon is used, the off-state current of the transistors can be reduced.

The oxide semiconductor preferably contains at least indium (In) or zinc (Zn).

Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such materials for the semiconductor layer makes it possible to provide a highly reliable transistor in which a change in the electrical characteristics is inhibited.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic appliance with extremely low power consumption can be obtained.

For stable characteristics of the transistor, a base film is preferably provided.

The base film can be formed with a single layer or stacked layers using an inorganic insulating film such as a silicon oxide film, a silicon nitride film, a silicon oxynitride film, or a silicon nitride oxide film. The base film can be formed by a sputtering method, a CVD method (e.g., a plasma CVD method, a thermal CVD method, or an MOCVD method), an ALD method, a coating method, a printing method, or the like. Note that the base film is not necessarily provided.

Note that an FET 623 is illustrated as a transistor formed in the source line driver circuit 601. The driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside, not over the substrate.

The pixel portion 602 includes a plurality of pixels including a switching FET 611, a current controlling FET 612, and a first electrode 613 electrically connected to a drain of the current controlling FET 612. One embodiment of the present invention is not limited to the structure. The pixel portion 602 may include three or more FETs and a capacitor in combination.

Note that an insulator 614 is formed to cover an end portion of the first electrode 613. Here, the insulator 614 can be formed using a positive photosensitive acrylic resin film.

In order to improve the coverage with an EL layer or the like that is formed later, the insulator 614 is formed to have a curved surface with curvature at its upper or lower end portion. For example, in the case where a positive photosensitive acrylic resin is used as a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a second electrode 617 are formed over the first electrode 613. Here, the first electrode 613 serves as an anode. A material having a high work function is preferably used as a material of the anode. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of any of these films and a film containing silver as its main component, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

The EL layer 616 is formed by any of a variety of methods such as an evaporation method using an evaporation mask, an inkjet method, and a spin coating method. The EL layer 616 has the structure described in Embodiments 1 and 3.

As a material used for the second electrode 617, which is formed over the EL layer 616, a material having a low work function (e.g., Al, Mg, Li, and Ca, or an alloy or a compound thereof, such as MgAg, Mgln, and AlLi) is preferably used. In the case where light generated in the EL layer 616 passes through the second electrode 617, a stack of a thin metal or alloy film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the organic EL device is formed with the first electrode 613, the EL layer 616, and the second electrode 617. The organic EL device is manufactured by the method for manufacturing the organic EL device described in Embodiments 2 and 3. In the light-emitting apparatus of this embodiment, the pixel portion, which includes a plurality of organic EL devices, may include both the organic EL device manufactured by the method for manufacturing the organic EL device described in Embodiments 2 and 3 and an organic EL device having a different structure. In that case, in the light-emitting apparatus of one embodiment of the present invention, a common hole-transport layer can be used for organic EL devices that emit light with different wavelengths, allowing the light-emitting apparatus to be manufactured in a simple process at low costs.

The sealing substrate 604 is attached to the element substrate 610 with the sealing material 605, so that an organic EL device 618 is provided in the space 607 surrounded by the element substrate 610, the sealing substrate 604, and the sealing material 605. The space 607 may be filled with a filler, or may be filled with an inert gas (such as nitrogen or argon), or the sealing material. It is preferable that the sealing substrate be provided with a recessed portion and a drying agent be provided in the recessed portion, in which case deterioration due to influence of moisture can be inhibited.

An epoxy resin or glass frit is preferably used for the sealing material 605. It is preferable that such a material transmit moisture or oxygen as little as possible. As the sealing substrate 604, a glass substrate, a quartz substrate, or a plastic substrate formed of fiber reinforced plastics (FRP), poly(vinyl fluoride) (PVF), polyester, an acrylic resin, or the like can be used.

Although not illustrated in FIGS. 11A and 11B, a protective film may be provided over the cathode. As the protective film, an organic resin film or an inorganic insulating film may be formed. The protective film may be formed so as to cover an exposed portion of the sealing material 605. The protective film may be provided so as to cover surfaces and side surfaces of the pair of substrates and exposed side surfaces of a sealing layer, an insulating layer, and the like.

The protective film can be formed using a material that does not easily transmit an impurity such as water. Thus, diffusion of an impurity such as water from the outside into the inside can be effectively inhibited.

As a material of the protective film, an oxide, a nitride, a fluoride, a sulfide, a ternary compound, a metal, a polymer, or the like can be used. For example, the material may contain aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, aluminum nitride, hafnium nitride, silicon nitride, tantalum nitride, titanium nitride, niobium nitride, molybdenum nitride, zirconium nitride, gallium nitride, a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method with favorable step coverage. One such method is an atomic layer deposition (ALD) method. A material that can be deposited by an ALD method is preferably used for the protective film A dense protective film having reduced defects such as cracks and pinholes or a uniform thickness can be formed by an ALD method. Furthermore, damage caused to a process member in forming the protective film can be reduced.

By an ALD method, a uniform protective film with few defects can be formed even on, for example, a surface with a complex uneven shape or upper, side, and lower surfaces of a touch panel.

As described above, the light-emitting apparatus that includes the organic EL device manufactured by the method for manufacturing the organic EL device described in Embodiments 2 and 3 can be obtained.

The light-emitting apparatus in this embodiment includes the organic EL device manufactured by the method for manufacturing the organic EL device described in Embodiments 2 and 3 and thus can have favorable characteristics.

Figure 12A:
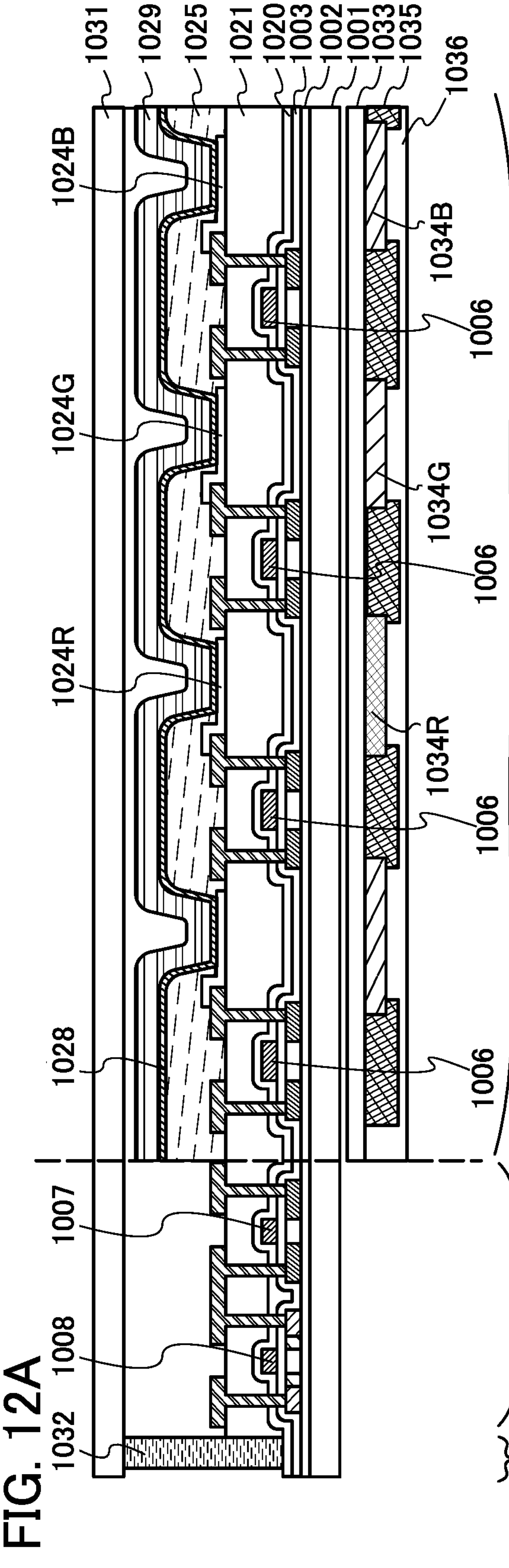
FIGS. 12A and 12B each illustrate an active matrix light-emitting apparatus.
Figure 12B:
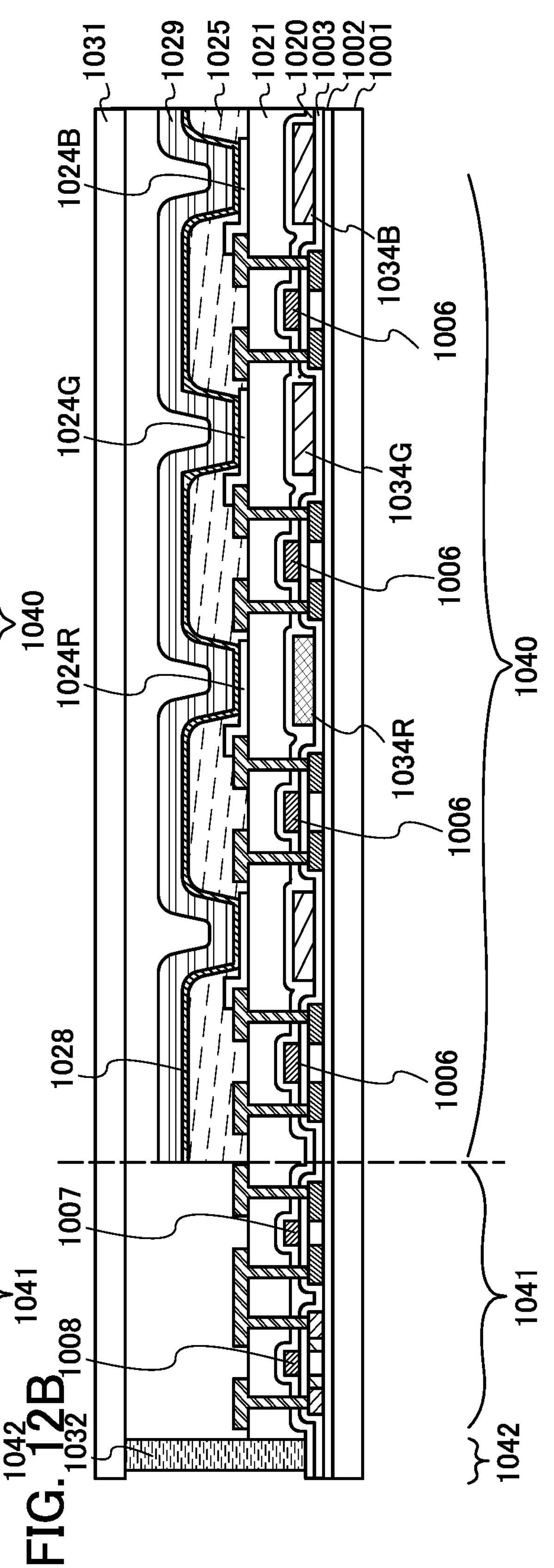

FIGS. 12A and 12B each illustrate an example of a light-emitting apparatus that includes coloring layers (color filters) and the like to improve color purity. FIG. 12A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024R, 1024G, and 1024B of organic EL devices, a partition 1025, an EL layer 1028, a common electrode (cathode) 1029 of the organic EL devices, a sealing substrate 1031, a sealing material 1032, and the like.

In FIG. 12A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036.

FIG. 12B illustrates an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

Figure 13:
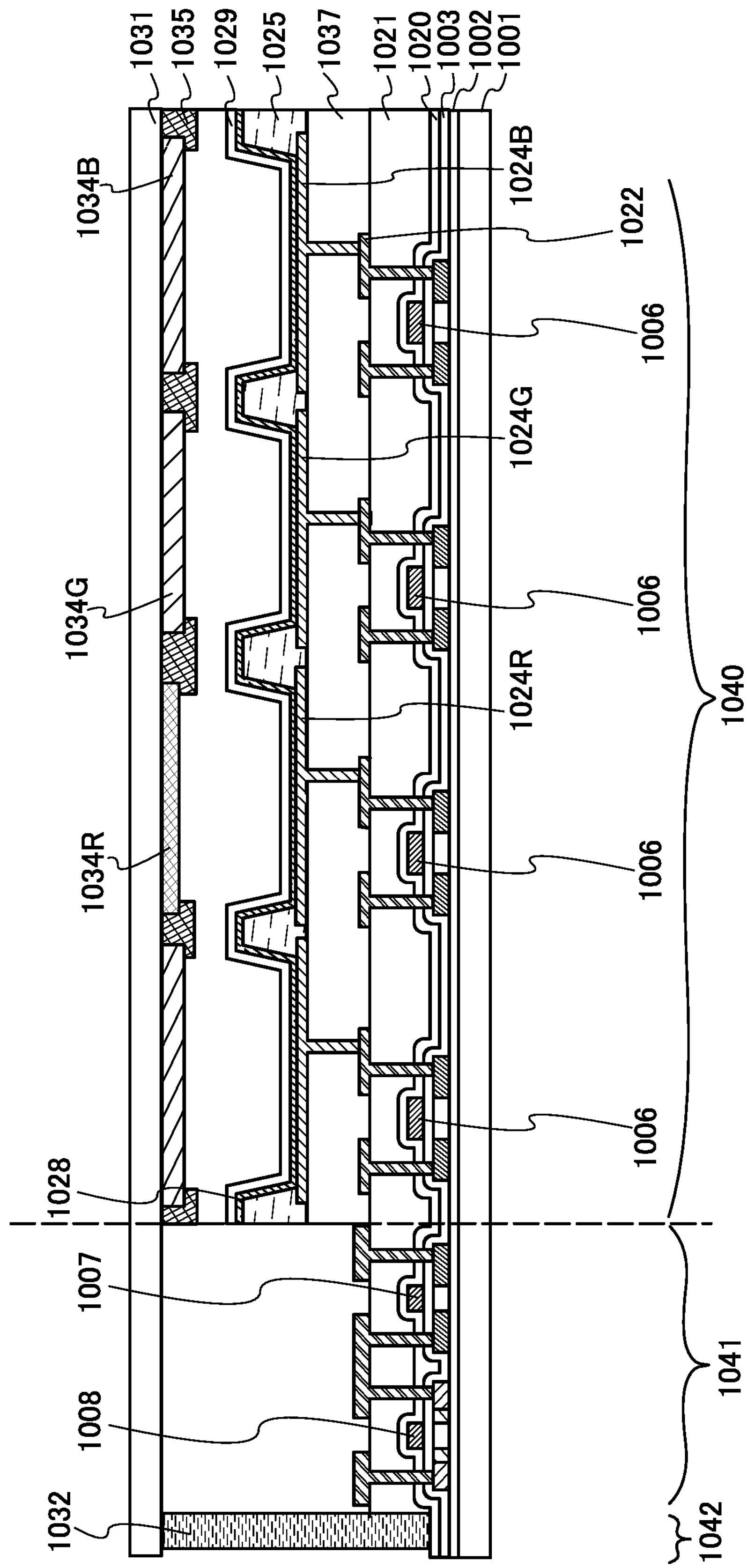
FIG. 13 illustrates an active matrix light-emitting apparatus.

The above-described light-emitting apparatus has a structure in which light is extracted to the substrate 1001 side where FETs are formed (a bottom emission structure), but may have a structure in which light is extracted to the sealing substrate 1031 side (a top emission structure). FIG. 13 is a cross-sectional view of a light-emitting apparatus having a top emission structure. In this case, a substrate that does not transmit light can be used as the substrate 1001. The process up to the step of forming a connection electrode that connects the FET and the anode of the organic EL device is performed in a manner similar to that of the light-emitting apparatus having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film 1021, and can alternatively be formed using any of other known materials.

The first electrodes 1024R, 1024G, and 1024B of the organic EL devices each serve as an anode here, but may serve as a cathode. Furthermore, in the case of a light-emitting apparatus having a top emission structure as illustrated in FIG. 13, the anodes are preferably reflective electrodes. The EL layer 1028 is formed to have a structure similar to the structure of the EL layer 103 described in Embodiment 1.

In the case of a top emission structure as illustrated in FIG. 13, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 that is positioned between pixels. The coloring layers (the red coloring layer 1034R, the green coloring layer 1034G, and the blue coloring layer 1034B) and the black matrix 1035 may be covered with the overcoat layer (not illustrated). Note that a light-transmitting substrate is used as the sealing substrate 1031.

In the light-emitting apparatus having a top emission structure, a microcavity structure can be favorably employed. An organic EL device with a microcavity structure is formed with the use of an electrode including a reflective electrode as one of the electrodes and a transflective electrode as the other electrode. At least an EL layer is positioned between the reflective electrode and the transflective electrode, and the EL layer includes at least a light-emitting layer serving as a light-emitting region.

Note that the reflective electrode has a visible light reflectivity of 40% to 100%, preferably 70% to 100%, and a resistivity of $1\times10^{-2}$ Ωcm or lower. In addition, the transflective electrode has a visible light reflectivity of 20% to 80%, preferably 40% to 70%, and a resistivity of $1\times10^{-2}$ Ωcm or lower.

Light emitted from the light-emitting layer included in the EL layer is reflected and resonated by the reflective electrode and the transflective electrode.

In the organic EL device, by changing thicknesses of the transparent conductive film, the composite material, the carrier-transport material, and the like, the optical path length between the reflective electrode and the transflective electrode can be changed.

Thus, light with a wavelength that is resonated between the reflective electrode and the transflective electrode can be intensified while light with a wavelength that is not resonated therebetween can be attenuated.

Note that light that is reflected back by the reflective electrode (first reflected light) considerably interferes with light that directly enters the transflective electrode from the light-emitting layer (first incident light). For this reason, the optical path length between the reflective electrode and the light-emitting layer is preferably adjusted to $(2n-1)\lambda/4$ (n is a natural number of 1 or more and λ is a wavelength of light to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer. The tandem organic EL device described above may be combined with a plurality of EL layers; for example, an organic EL device may have a structure in which a plurality of EL layers are provided with a charge-generation layer provided therebetween, and each EL layer includes a plurality of light-emitting layers or a single light-emitting layer.

With the microcavity structure, emission intensity with a specific wavelength in the front direction can be increased, whereby power consumption can be reduced. Note that in the case of a light-emitting apparatus that displays images with subpixels of four colors, red, yellow, green, and blue, the light-emitting apparatus can have favorable characteristics because the luminance can be increased owing to yellow light emission and each subpixel can employ a microcavity structure suitable for wavelengths of the corresponding color.

The light-emitting apparatus in this embodiment is manufactured including the organic EL device manufactured by the method for manufacturing the organic EL device described in Embodiments 2 and 3 and thus can have favorable characteristics. In the light-emitting apparatus described above, many minute organic EL devices arranged in a matrix can each be controlled; thus, the light-emitting apparatus can be suitably used as a display apparatus for displaying images.

This embodiment can be freely combined with any of the other embodiments.

Embodiment 6

In this embodiment, examples of electronic appliances each including an organic EL device manufactured by the method for manufacturing the organic EL device described in Embodiments 2 and 3 are described.

Examples of the electronic appliance including the above organic EL device include television devices (also referred to as TV or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic appliances are shown below.

Figure 14A:
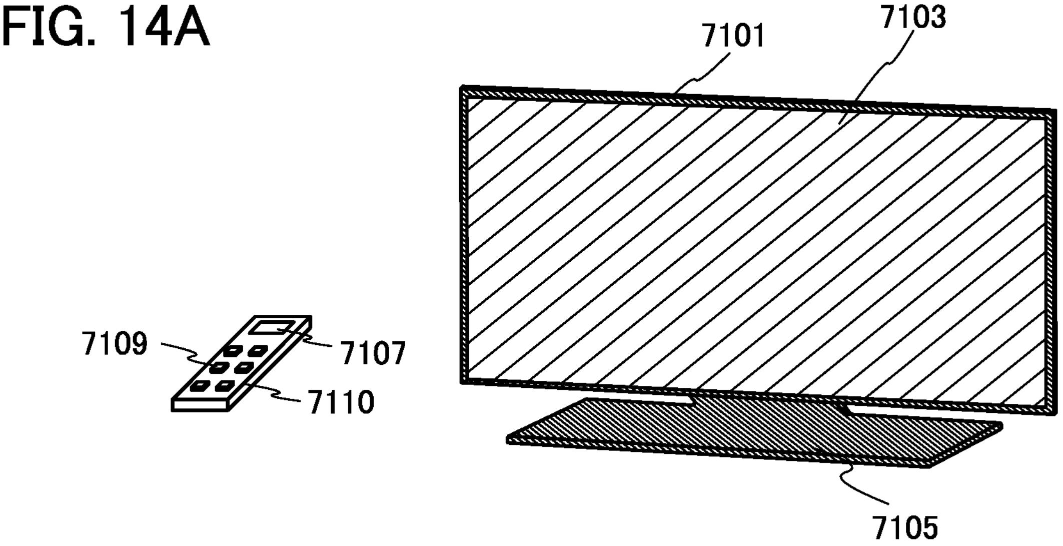
FIGS. 14A to 14D illustrate electronic appliances.

FIG. 14A illustrates an example of a television device. In the television device, a display portion 7103 is incorporated in a housing 7101. Here, the housing 7101 is supported by a stand 7105. Images can be displayed on the display portion 7103, and in the display portion 7103, the organic EL devices manufactured by the method for manufacturing the organic EL device described in Embodiments 2 and 3 are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110. The organic EL devices manufactured by the method for manufacturing the organic EL device described in Embodiments 2 and 3 may also be arranged in a matrix in the display portion 7107.

Note that the television device is provided with a receiver, a modem, and the like. With the use of the receiver, a general television broadcast can be received. Moreover, when the television device is connected to a communication network with or without wires via the modem, one-way (from a sender to a receiver) or two-way (between a sender and a receiver or between receivers) data communication can be performed.

Figure 14B:
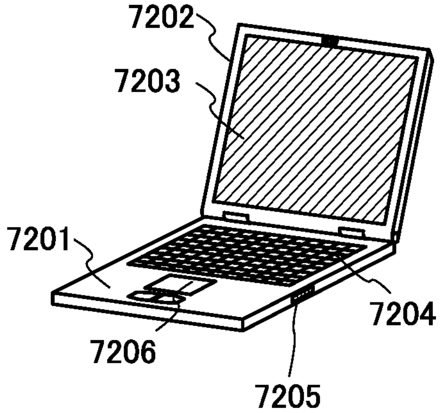
Figure 14C:
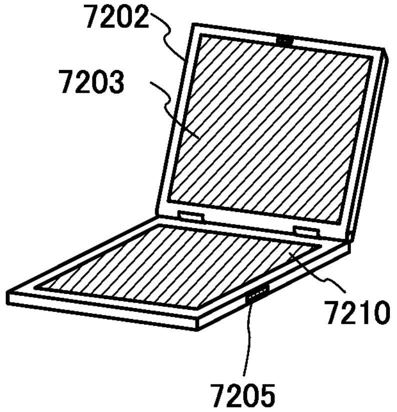

FIG. 14B illustrates a computer, which includes a main body 7201, a housing 7202, a display portion 7203, a keyboard 7204, an external connection port 7205, a pointing device 7206, and the like. Note that this computer includes organic EL devices manufactured by the method for manufacturing the organic EL device described in Embodiments 2 and 3 and arranged in a matrix in the display portion 7203. The computer illustrated in FIG. 14B may have a structure illustrated in FIG. 14C. A computer illustrated in FIG. 14C is provided with a display portion 7210 instead of the keyboard 7204 and the pointing device 7206. The display portion 7210 is a touch panel, and input operation can be performed by touching display for input on the display portion 7210 with a finger or a dedicated pen. The display portion 7210 can also display images other than the display for input. The display portion 7203 may also be a touch panel. Connecting the two screens with a hinge can prevent troubles; for example, the screens can be prevented from being cracked or broken while the computer is being stored or carried.

Figure 14D:
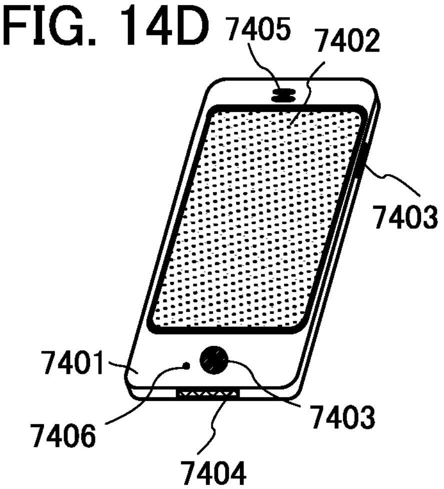

FIG. 14D illustrates an example of a portable terminal. A cellular phone is provided with a display portion 7402 incorporated in a housing 7401, operation buttons 7403, an external connection port 7404, a speaker 7405, a microphone 7406, and the like. Note that the cellular phone includes the display portion 7402 in which the organic EL devices manufactured by the method for manufacturing the organic EL device described in Embodiments 2 and 3 are arranged in a matrix.

When the display portion 7402 of the portable terminal illustrated in FIG. 14D is touched with a finger or the like, data can be input into the portable terminal. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting data such as text. The third mode is a display-and-input mode in which the two modes, the display mode and the input mode, are combined.

For example, in the case of making a call or creating an e-mail, a text input mode mainly for inputting text is selected for the display portion 7402 so that text displayed on the screen can be input. In this case, it is preferable to display a keyboard or number buttons on almost the entire screen of the display portion 7402.

When a sensing device including a sensor such as a gyroscope sensor or an acceleration sensor for detecting inclination is provided inside the portable terminal, display on the screen of the display portion 7402 can be automatically changed in direction by determining the orientation of the portable terminal (whether the portable terminal is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal sensed by an optical sensor in the display portion 7402 is sensed, the screen mode may be controlled so as to be switched from the input mode to the display mode.

The display portion 7402 may also function as an image sensor. For example, an image of a palm print, a fingerprint, or the like is taken when the display portion 7402 is touched with the palm or the finger, whereby personal authentication can be performed. Furthermore, by providing a backlight or a sensing light source which emits near-infrared light in the display portion, an image of a finger vein, a palm vein, or the like can be captured.

As described above, the application range of the light-emitting apparatus including the organic EL device manufactured by the method for manufacturing the organic EL device described in Embodiments 2 and 3 is wide so that this light-emitting apparatus can be applied to electronic appliances in a variety of fields.

Figure 15A:
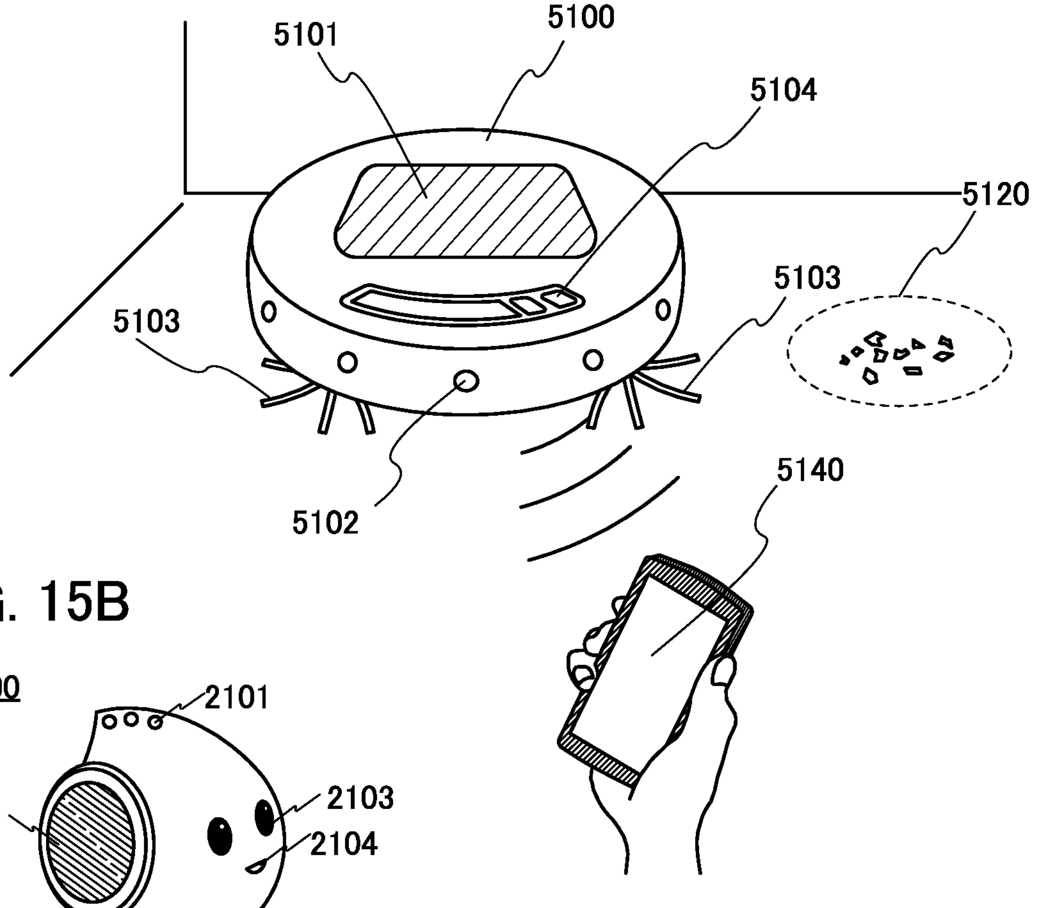
FIGS. 15A to 15C illustrate electronic appliances.

FIG. 15A is a schematic view illustrating an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and vacuums the dust through the inlet provided on the bottom surface.

The cleaning robot 5100 can determine whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of collected dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic appliance 5140 such as a smartphone. Images taken by the cameras 5102 can be displayed on the portable electronic appliance 5140. Accordingly, an owner of the cleaning robot 5100 can monitor his/her room even when the owner is not at home. The owner can also check the display on the display 5101 by the portable electronic appliance 5140 such as a smartphone.

The light-emitting apparatus of one embodiment of the present invention can be used for the display 5101.

Figure 15B:
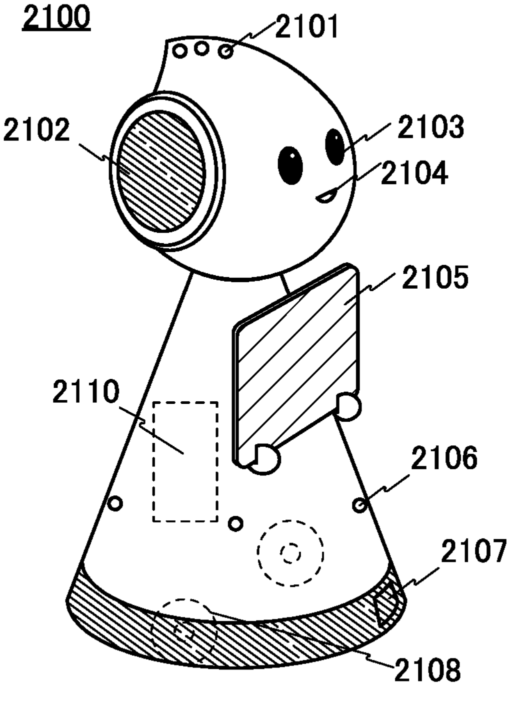

A robot 2100 illustrated in FIG. 15B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 15C:
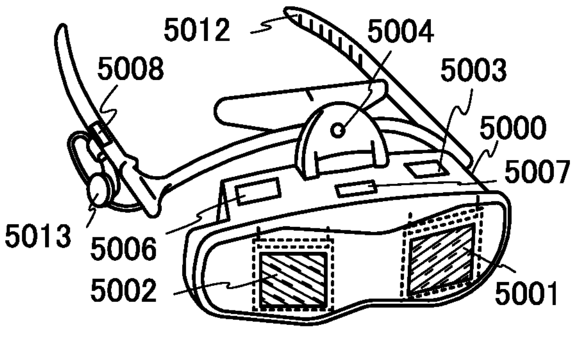

FIG. 15C illustrates an example of a goggles-type display. The goggles-type display includes, for example, a housing 5000, a display portion 5001, a speaker 5003, an LED lamp 5004, operation keys (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a second display portion 5002, a support 5012, and an earphone 5013.

The light-emitting apparatus of one embodiment of the present invention can be used for the display portion 5001 and the second display portion 5002.

Figure 16:
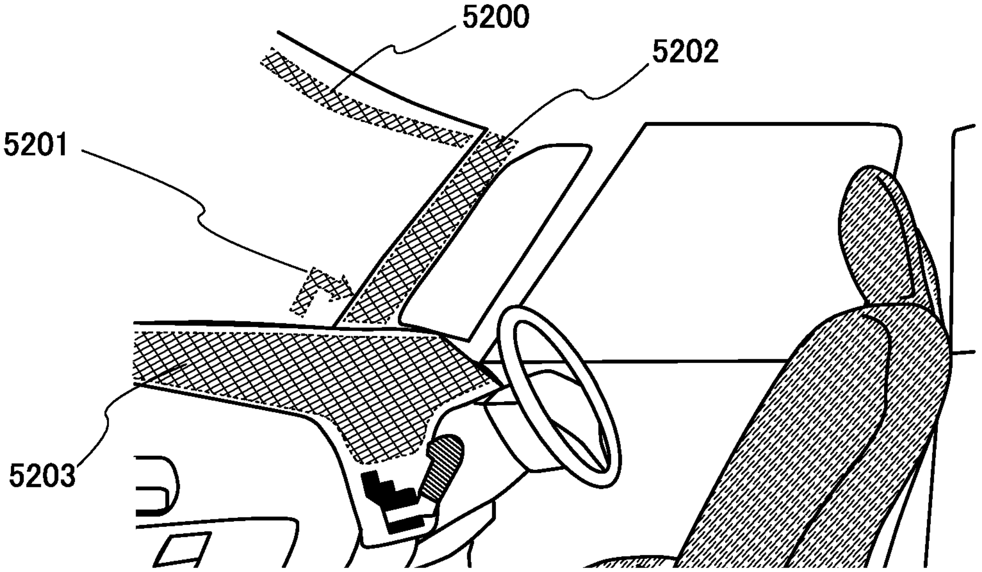
FIG. 16 illustrates in-vehicle display apparatuses and lighting devices.

The organic EL device manufactured by the method for manufacturing the organic EL device described in Embodiments 2 and 3 can also be used for an automobile windshield or an automobile dashboard. FIG. 16 illustrates one mode in which the organic EL devices manufactured by the method for manufacturing the organic EL device described in Embodiments 2 and 3 are used for an automobile windshield and an automobile dashboard. Display regions 5200 to 5203 each include the organic EL device manufactured by the method for manufacturing the organic EL device described in Embodiments 2 and 3.

The display regions 5200 and 5201 are display apparatuses which are provided in the automobile windshield and include the organic EL device manufactured by the method for manufacturing the organic EL device described in Embodiments 2 and 3. The organic EL device manufactured by the method for manufacturing the organic EL device described in Embodiments 2 and 3 can be formed into what is called a see-through display apparatus, through which the opposite side can be seen, by including an anode and a cathode formed of light-transmitting electrodes. Such see-through display apparatuses can be provided even in the automobile windshield without hindering the view. In the case where a driving transistor or the like is provided, a transistor having a light-transmitting property, such as an organic transistor including an organic semiconductor material or a transistor including an oxide semiconductor, is preferably used.

The display region 5202 is a display apparatus which is provided in a pillar portion and includes the organic EL device manufactured by the method for manufacturing the organic EL device described in Embodiments 2 and 3. The display region 5202 can compensate for the view hindered by the pillar by displaying an image taken by an imaging unit provided in the car body. Similarly, the display region 5203 provided in the dashboard portion can compensate for the view hindered by the car body by displaying an image taken by an imaging unit provided on the outside of the automobile; thus, blind areas can be eliminated to enhance the safety. Images that compensate for the areas which a driver cannot see enable the driver to ensure safety easily and comfortably.

The display region 5203 can provide a variety of kinds of information such as navigation data, the speed, the number of rotations, air-condition setting, and the like. The content or layout of the display can be changed as appropriate according to the user's preference. Note that such information can also be displayed on the display regions 5200 to 5202. The display regions 5200 to 5203 can also be used as lighting devices.

Figure 17A:
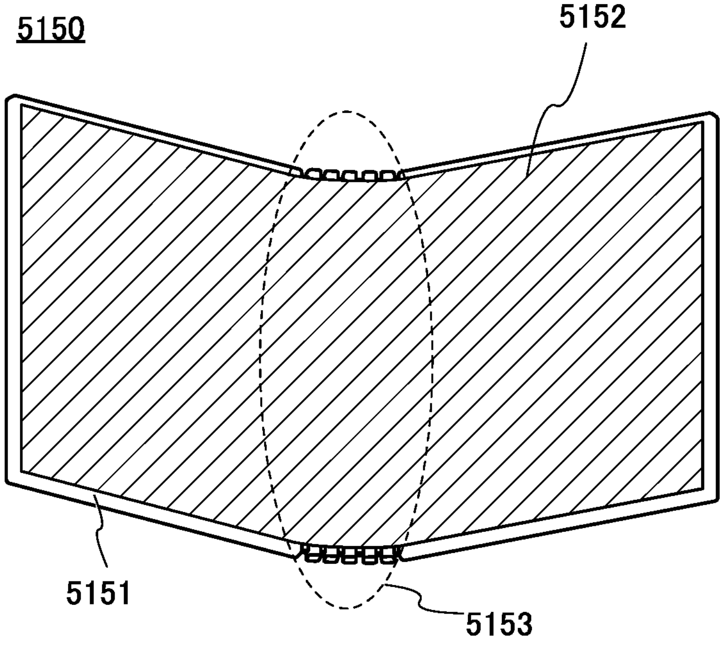
FIGS. 17A and 17B illustrate an electronic appliance.
Figure 17B:
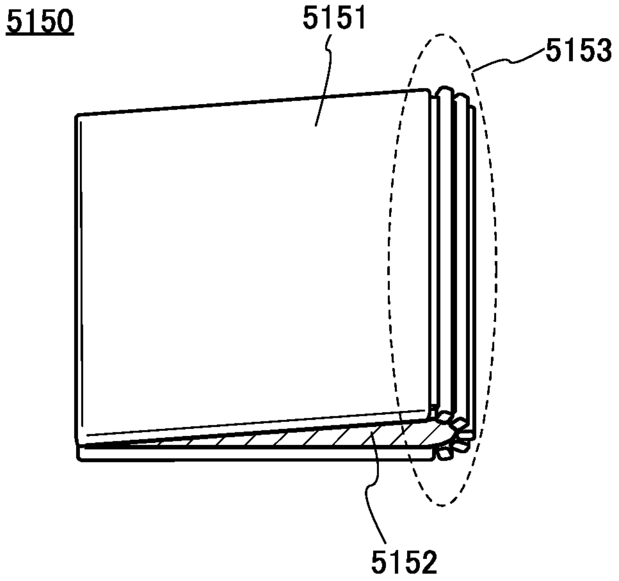

FIGS. 17A and 17B illustrate a foldable portable information terminal 5150. The foldable portable information terminal 5150 includes a housing 5151, a display region 5152, and a bend portion 5153. FIG. 17A illustrates the portable information terminal 5150 that is opened. FIG. 17B illustrates the portable information terminal that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members. When the display region is folded, the flexible member expands. The bend portion 5153 has a radius of curvature greater than or equal to 2 mm, preferably greater than or equal to 3 mm.

Note that the display region 5152 may be a touch panel (an input/output device) including a touch sensor (an input device). The light-emitting apparatus of one embodiment of the present invention can be used for the display region 5152.

Figure 18A:
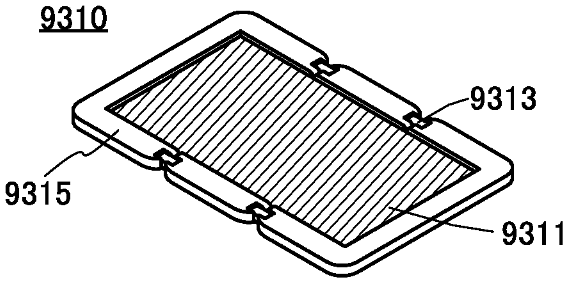
FIGS. 18A to 18C illustrate an electronic appliance.
Figure 18B:
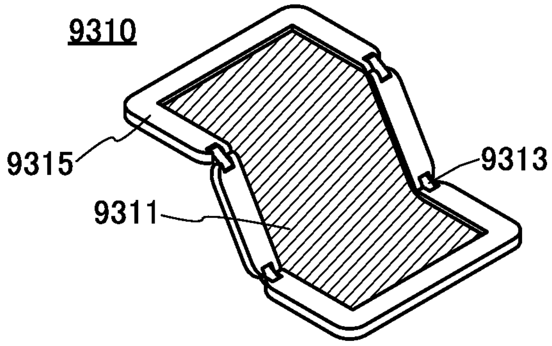
Figure 18C:
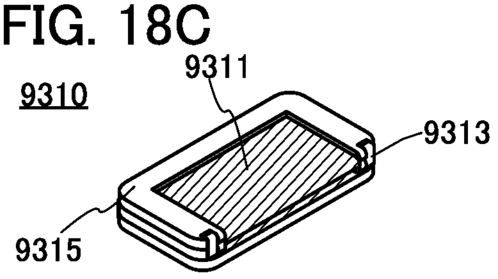

FIGS. 18A to 18C illustrate a foldable portable information terminal 9310. FIG. 18A illustrates the portable information terminal 9310 that is opened. FIG. 18B illustrates the portable information terminal 9310 that is being opened or being folded. FIG. 18C illustrates the portable information terminal 9310 that is folded. The portable information terminal 9310 is highly portable when folded. The portable information terminal 9310 is highly browsable when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in combination with any of the other embodiments described in this specification, as appropriate.

Example

In this example, a light-emitting device 1, which is a light-emitting device of one embodiment of the present invention, was fabricated, and the measurement results of the characteristics thereof are described. The structural formulae of organic compounds used for the light-emitting device 1 are shown below. Furthermore, the structure of the light-emitting device 1 is shown in Table 1.
[Chemical Formula 4]
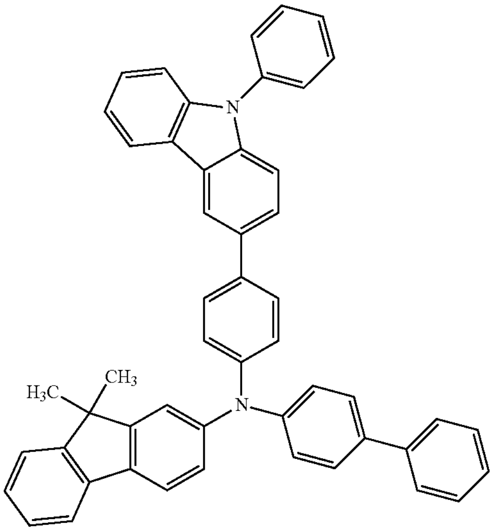
PCBBiF
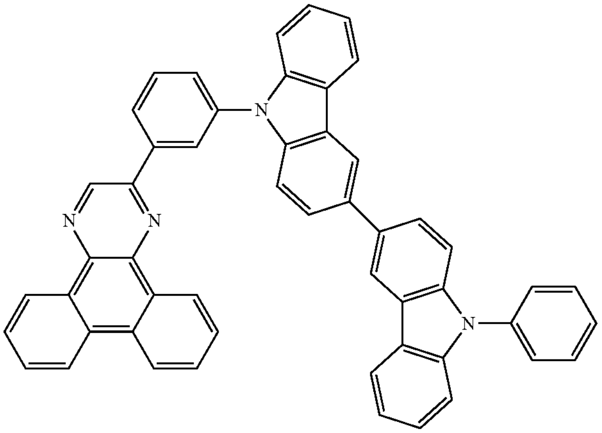
2mPCCzPDBq
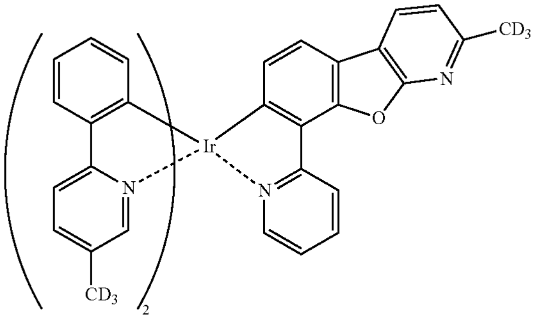
$Ir(5mppy\text{-}d3)_2(mbfpypy\text{-}d3)$
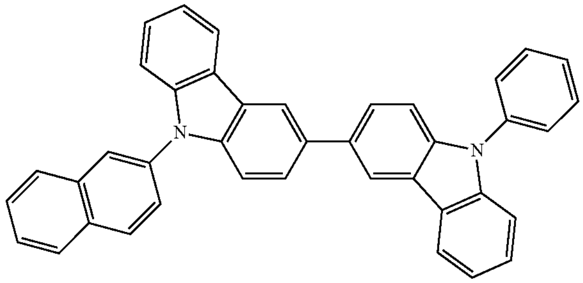
β NCCP
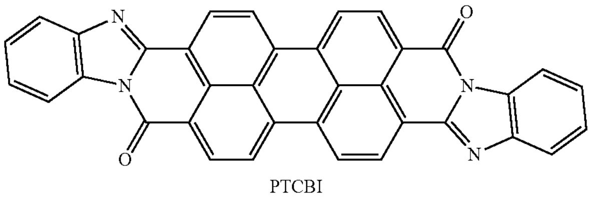
PTCBI
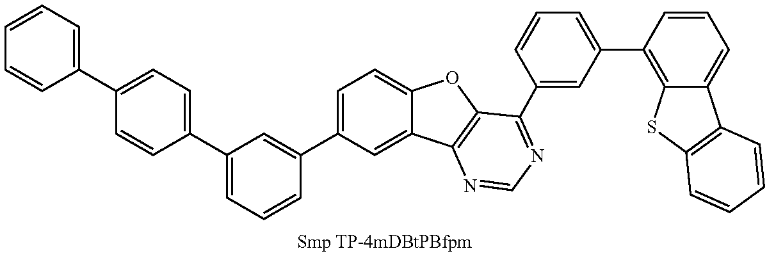
Smp TP-4mDBtPBfpm -continued

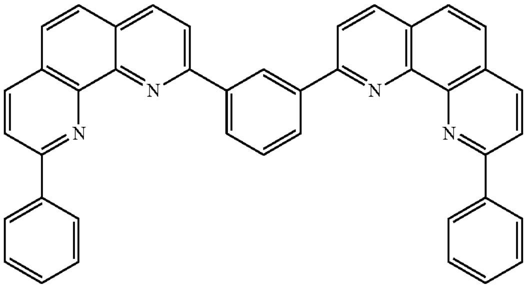

mPPhen2P

TABLE 1

| | | Thickness | Light-emitting device 1 |
|---|---|---|---|
| Second Electrode | | 70 nm | ITO |
| | | 25 nm | Ag:Mg (1:0.1) |
| Electron-injection layer | | 1.5 nm | LiF:Yb (1:0.5) |
| | | | Photolithography process |
| Buffer layer | | 2 nm | PTCBI |
| Electron-transport layer | 2 | — | 2mPPhen2P (13 nm) |
| | 1 | 10 nm | 2mPCCzPDBq |
| Light-emitting layer | | 40 nm | 8mpTP-4mDBtPBfpm:βNCCP: Ir(5mppy-d3)$_2$(mbfpypy-d3) (0.60.40.1) |
| Hole-transport layer | | 10 nm | PCBBiF |
| Hole-injection layer | | 10 nm | PCBBiF:OCHD-003 (1:0.03) |
| First ectrode | | 10 nm | ITSO |
| | | 6 nm | Ti |
| | | 70 nm | Al |
| | | 50 nm | Ti |

<<Fabrication of Light-Emitting Device 1>>

In the light-emitting device 1 described in this example, a hole-injection layer, a hole-transport layer, a light-emitting layer, an electron-transport layer (a first electron-transport layer and a second electron-transport layer), a buffer layer, and an electron-injection layer are stacked in this order over a first electrode formed over a substrate, and a second electrode is stacked over the electron-injection layer.

First, the first electrode was formed over the substrate. A silicon substrate was used as the substrate. The electrode area was set to 4 $mm^2$ (2 mm×2 mm). The first electrode was formed in the following manner: titanium with a thickness of 50 nm, aluminum with a thickness of 70 nm, and titanium with a thickness of 6 nm were sequentially stacked by a sputtering method, and then indium tin oxide (ITSO) containing silicon oxide was deposited to a thickness of 10 nm by a sputtering method. In this example, the first electrode functioned as an anode.

For pretreatment, a surface of the substrate was washed with water, and baking was performed at 200° C. for 1 hour. After that, the substrate was transferred into a vacuum evaporation apparatus where the pressure was reduced to approximately $10^{-4}$ Pa, and was subjected to vacuum baking at 170° C. for 1 hour in a heating chamber of the vacuum evaporation apparatus, and then the substrate was cooled down for approximately 30 minutes.

Next, the hole-injection layer was formed over the first electrode. The hole-injection layer was formed in the following manner: the pressure in the vacuum evaporation apparatus was reduced to $10^{-4}$ Pa, and then PCBBiF and a fluorine-containing electron acceptor material (OCHD-003) with a molecular weight of 672 were deposited by co-evaporation to a thickness of 10 nm in a weight ratio of PCBBiF:OCHD-003=1:0.03.

Then, the hole-transport layer was formed over the hole-injection layer. The hole-transport layer was formed to have a thickness of 10 nm by evaporation of PCBBiF.

Next, the light-emitting layer was formed over the hole-transport layer. The light-emitting layer was formed to have a thickness of 40 nm by co-evaporation of 8mpTP-4mDBtPBfpm, βNCCP, and Ir(5mppy-d3)$_2$(mbfpypy-d3) such that the weight ratio of 8mpTP-4mDBtPBfpm to βNCCP and Ir(5mppy-d3)$_2$(mbfpypy-d3) was 0.6:0.4:0.1.

Next, the electron-transport layer (the first electron-transport layer and the second electron-transport layer) was formed over the light-emitting layer. The first electron-transport layer was formed to have a thickness of 10 nm by evaporation of 2mPCCzPDBq. The second electron-transport layer was formed to have a thickness of 13 nm by evaporation of mPPhen2P.

Next, the buffer layer was formed over the electron-transport layer. The buffer layer was formed to have a thickness of 2 nm by evaporation of PTCBI.

Next, processing by a photolithography method (photolithography process) was performed. The substrate was taken out from the vacuum evaporation apparatus and exposed to the air, and then aluminum oxide was deposited to a thickness of 30 nm by an ALD method using trimethylaluminum (abbreviation: TMA) as a precursor and water vapor as an oxidizer to form an aluminum oxide film.

Tungsten was deposited to have a thickness of 54 nm over the aluminum oxide film by a sputtering method to form a metal film.

A resist was formed using a photoresist over the metal film, and processing was performed by a photolithography method to form a slit having a width of 3 μm in a position 3.5 μm away from an end portion of the first electrode.

Specifically, using the resist as a mask, the metal film was processed with an etching gas containing sulfur hexafluoride ($SF_6$), and then the photoresist was removed using an ashing gas containing oxygen ($O_2$). After that, the aluminum oxide film was processed using an etching gas containing fluoroform ($CHF_3$), helium (He), and methane ($CH_4$) at a flow rate ratio of $CHF_3$:He:$CH_4$=3.3:23.7:3. Then, the buffer layer, the electron-transport layer, the light-emitting layer, the hole-transport layer, and the hole-injection layer were processed using an etching gas containing oxygen ($O_2$).

After the processing, the metal layer formed by processing the metal film and the aluminum oxide layer formed by processing the aluminum oxide film were removed with a mixed acid solution containing nitric acid, phosphoric acid, and the like as a component, so that the buffer layer was exposed. Then, the substrate was transferred into a vacuum evaporation apparatus where the pressure was reduced to approximately $10^{-4}$ Pa, and heat treatment was performed at 70° C. for 1.5 hours in a heating chamber of the vacuum evaporation apparatus.

Next, the electron-injection layer was formed by depositing lithium fluoride (LiF) and ytterbium (Yb) over the exposed buffer layer to a thickness of 1.5 nm by co-evaporation such that the volume ratio of LiF to Yb was 1:0.5.

Next, the second electrode was formed over the electron-injection layer. The second electrode was formed in the following manner: Ag and Mg were deposited by co-evaporation to a thickness of 25 nm with a volume ratio of Ag to Mg was 1:0.1, and then indium oxide-tin oxide (ITO) was deposited by evaporation to a thickness of 70 nm. In this example, the second electrode functioned as a cathode.

Through the above process, the light-emitting device 1 was fabricated. This light-emitting device 1 was sealed using a glass substrate in a glove box containing a nitrogen atmosphere so as not to be exposed to the air (a sealing material was applied to surround the device and UV treatment and heat treatment at 80° C. for 1 hour were performed at the time of sealing). Then, the initial characteristics of the light-emitting device 1 were measured.

Figure 19:
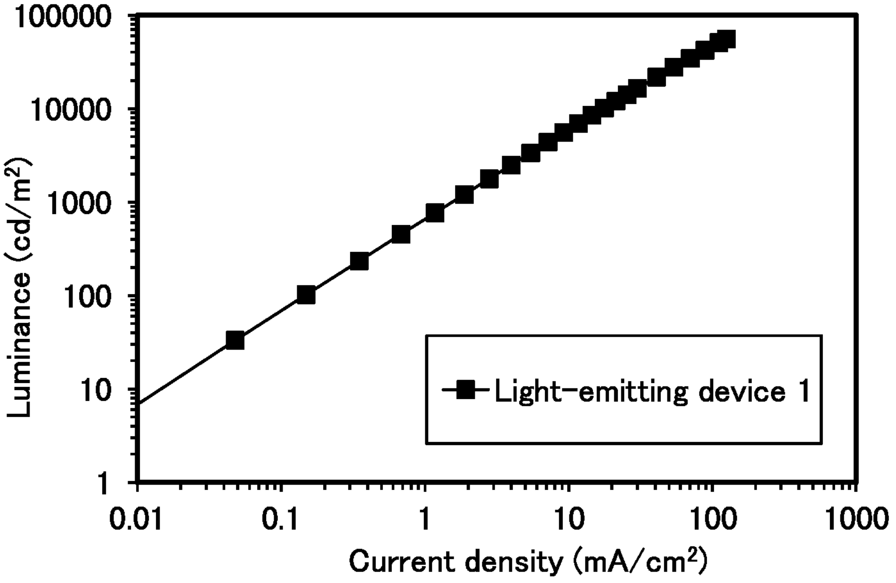
FIG. 19 shows the luminance-current density characteristics of a light-emitting device 1.
Figure 20:
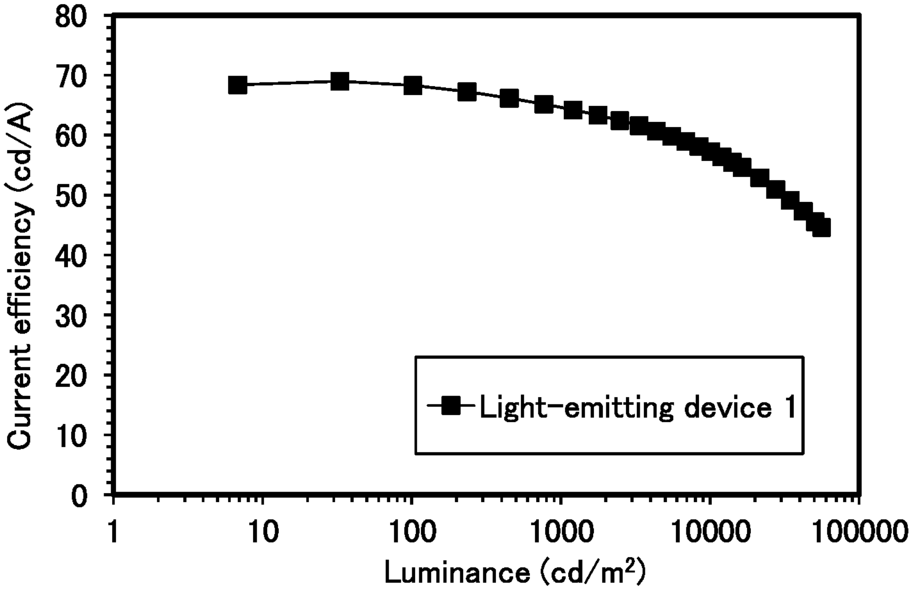
FIG. 20 shows the current efficiency-luminance characteristics of the light-emitting device 1.
Figure 21:
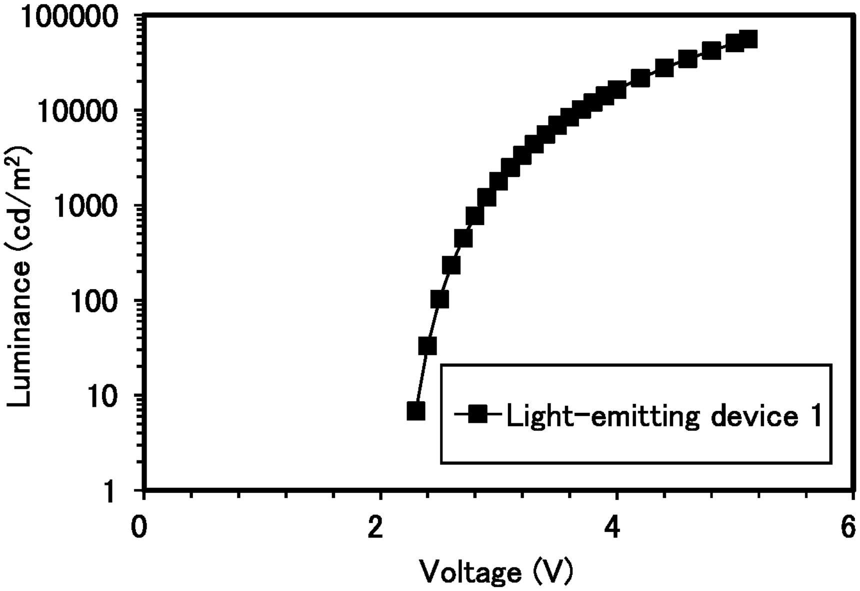
FIG. 21 shows the luminance-voltage characteristics of the light-emitting device 1.
Figure 22:
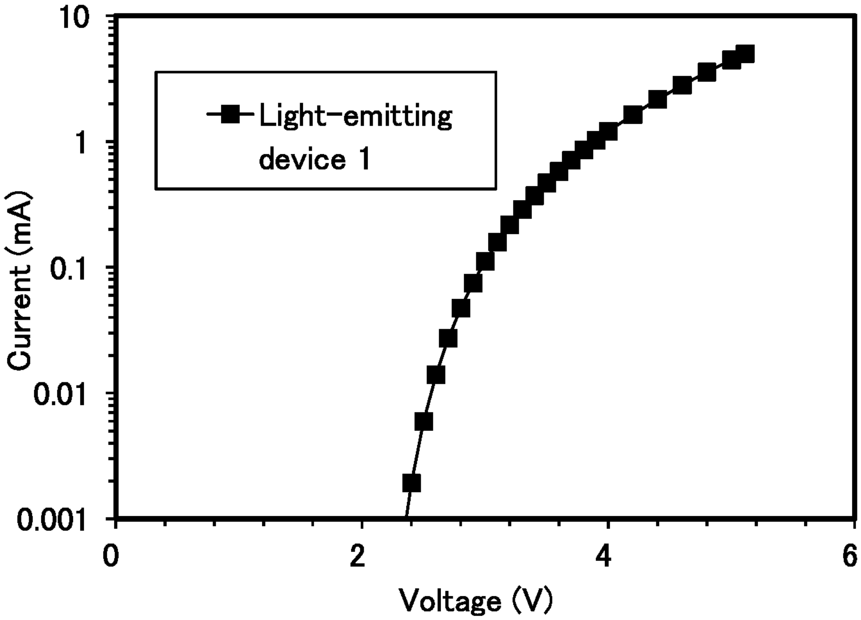
FIG. 22 shows the current-voltage characteristics of the light-emitting device 1.
Figure 23:
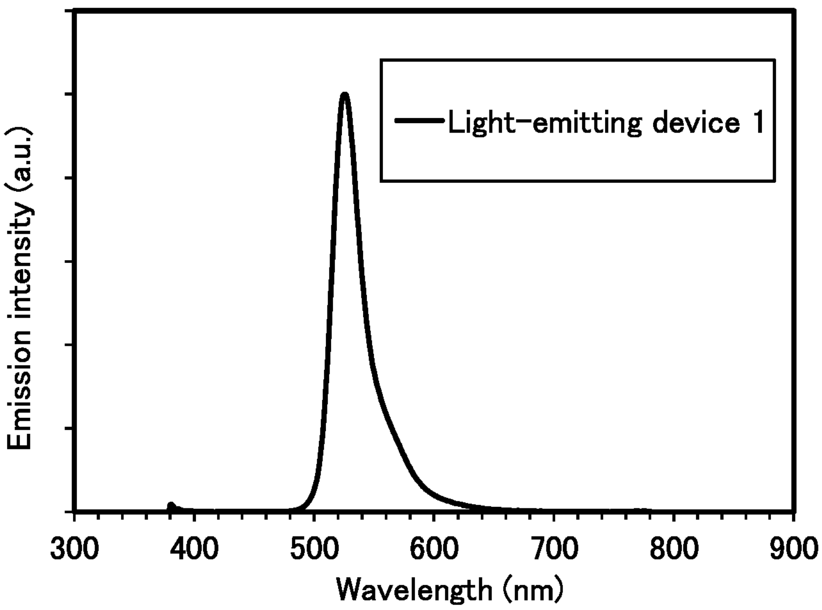
FIG. 23 shows the emission spectrum of the light-emitting device 1.

FIG. 19 shows the luminance-current density characteristics of the light-emitting device 1. FIG. 20 shows the current efficiency-luminance characteristics thereof. FIG. 21 shows the luminance-voltage characteristics thereof. FIG. 22 shows the current-voltage characteristics thereof. FIG. 23 shows the electroluminescence spectrum thereof. Table 2 shows the main characteristics of the light-emitting device 1 at a luminance of approximately 1000 cd/m$^2$. Luminance, CIE chromaticity, and electroluminescence spectrum were measured with a spectroradiometer (SR-UL1R produced by TOPCON TECHNOHOUSE CORPORATION).

TABLE 2

| | Voltage (V) | Current (mA) | Current density (mA/cm$^2$) | Chromaticity x | Chromaticity y | Luminance (cd/m$^2$) | Current efficiency (cd/A) |
|---|---|---|---|---|---|---|---|
| Light-emitting device 1 | 2.90 | 0.0751 | 1.88 | 0.245 | 0.710 | 1206 | 64.2 |

From FIGS. 19 to 23 and Table 2, the light-emitting device 1 was found to be a light-emitting device which had favorable characteristics and in which an increase in voltage due to a photolithography process was inhibited by using the buffer layer.

Figure 24:
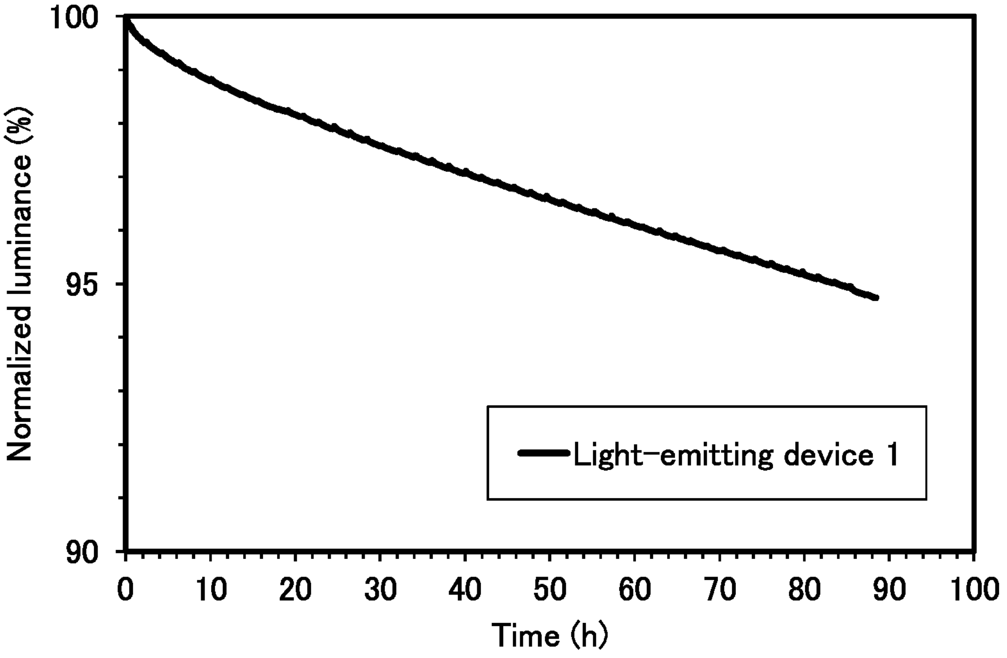
FIG. 24 shows a change in luminance over driving time of the light-emitting device 1.

FIG. 24 shows a luminance change over driving time when the light-emitting device 1 was driven at a constant current of 2 mA (50 mA/cm$^2$). From FIG. 24, the light-emitting device 1 was found to have a long lifetime.

These results revealed that the light-emitting device of one embodiment of the present invention is a light-emitting device which has favorable characteristics and a long lifetime and in which an increase in voltage due to a photolithography process is inhibited by using a buffer layer.

This application is based on Japanese Patent Application Serial No. 2021-206122 filed with Japan Patent Office on Dec. 20, 2021, the entire contents of which are hereby incorporated by reference.

What is claimed is:

1. A light-emitting apparatus comprising:
a first light-emitting device comprising:
a first electrode;
a second electrode;
a first organic semiconductor layer; and
a first buffer layer;
a second light-emitting device comprising:
a third electrode;
the second electrode;
a second organic semiconductor layer; and
a second buffer layer; and
a first insulating layer,
wherein the first organic semiconductor layer is between the first electrode and the second electrode,
wherein the first buffer layer is between the first organic semiconductor layer and the second electrode,
wherein a side surface of the first organic semiconductor layer and a side surface of the first buffer layer are substantially aligned and are covered by the first insulating layer,
wherein the second organic semiconductor layer is between the third electrode and the second electrode,
wherein the second buffer layer is between the second organic semiconductor layer and the second electrode,
wherein a side surface of the second organic semiconductor layer and a side surface of the second buffer layer are substantially aligned and are covered by the first insulating layer, and
wherein the first insulating layer is in direct contact with the side surfaces of the first organic semiconductor layer, the first buffer layer, the second organic semiconductor layer, and the second buffer layer.

2. The light-emitting apparatus according to claim 1, wherein the first buffer layer contains a metal.

3. The light-emitting apparatus according to claim 1, wherein the first buffer layer contains an organometallic compound.

4. The light-emitting apparatus according to claim 1, wherein the first buffer layer contains an organic compound.

5. The light-emitting apparatus according to claim 1, wherein the first buffer layer comprises a stack of a first buffer sublayer and a second buffer sublayer.

6. The light-emitting apparatus according to claim 1, further comprising a third organic semiconductor layer,
wherein the third organic semiconductor layer is between the first buffer layer and the second electrode,
wherein the third organic semiconductor layer is between the second buffer layer and the second electrode, and
wherein a side surface of the third organic semiconductor layer is not aligned with the side surface of the first organic semiconductor layer or the side surface of the first buffer layer.

7. A light-emitting apparatus comprising:
a first light-emitting device comprising:
a first electrode;
a second electrode;
a first organic semiconductor layer; and
a first buffer layer;

a second light-emitting device comprising:

a third electrode;

the second electrode;

a second organic semiconductor layer; and a second buffer layer;

a first insulating layer; and a second insulating layer, wherein the first organic semiconductor layer comprises a first light-emitting layer, wherein the second organic semiconductor layer comprises a second light-emitting layer, wherein the first organic semiconductor layer is between the first electrode and the second electrode, wherein the first buffer layer is between the first organic semiconductor layer and the second electrode, wherein a side surface of the first organic semiconductor layer and a side surface of the first buffer layer are substantially aligned and are covered by the first insulating layer, wherein the second organic semiconductor layer is between the third electrode and the second electrode, wherein the second buffer layer is between the second organic semiconductor layer and the second electrode, wherein a side surface of the second organic semiconductor layer and a side surface of the second buffer layer are substantially aligned and are covered by the first insulating layer, wherein the second insulating layer is over the first insulating layer, and wherein the first insulating layer is in direct contact with the side surfaces of the first organic semiconductor layer, the first buffer layer, the second organic semiconductor layer, and the second buffer layer.

8. The light-emitting apparatus according to claim 7, wherein the first buffer layer contains a metal.

9. The light-emitting apparatus according to claim 7, wherein the first buffer layer contains an organometallic compound.

10. The light-emitting apparatus according to claim 7, wherein the first buffer layer contains an organic compound.

11. The light-emitting apparatus according to claim 7, wherein the first buffer layer comprises a stack of a first buffer sublayer and a second buffer sublayer.

12. The light-emitting apparatus according to claim 7, further comprising a third organic semiconductor layer, wherein the third organic semiconductor layer is between the first buffer layer and the second electrode, wherein the third organic semiconductor layer is between the second buffer layer and the second electrode, and wherein a side surface of the third organic semiconductor layer is not aligned with the side surface of the first organic semiconductor layer or the side surface of the first buffer layer.

13. The light-emitting apparatus according to claim 7, further comprising a transistor or a substrate.

14. An electronic appliance comprising:

the light-emitting apparatus according to claim 13; and a sensor unit, an input unit, or a communication unit.

15. A lighting device comprising:

the light-emitting apparatus according to claim 13; and a housing.

16. The light-emitting apparatus according to claim 1, wherein a thickness of the first buffer layer is greater than or equal to 0.1 nm and less than or equal to 5 nm.

17. The light-emitting apparatus according to claim 7, wherein a thickness of the first buffer layer is greater than or equal to 0.1 nm and less than or equal to 5 nm.

18. The light-emitting apparatus according to claim 1, wherein the first insulating layer covers at least part of a top surface of the first buffer layer and part of a top surface of the second buffer layer.

19. The light-emitting apparatus according to claim 7, wherein the first insulating layer covers at least part of a top surface of the first buffer layer and part of a top surface of the second buffer layer.

* * * * *